United States Patent
Irwin et al.

(10) Patent No.: US 9,136,408 B2
(45) Date of Patent: Sep. 15, 2015

(54) PEROVSKITE AND OTHER SOLAR CELL MATERIALS

(71) Applicants: Michael D. Irwin, Dallas, TX (US); Robert D. Maher, III, Plano, TX (US); Jerred A. Chute, Dallas, TX (US); Vivek V. Dhas, Dallas, TX (US)

(72) Inventors: Michael D. Irwin, Dallas, TX (US); Robert D. Maher, III, Plano, TX (US); Jerred A. Chute, Dallas, TX (US); Vivek V. Dhas, Dallas, TX (US)

(73) Assignee: Hunt Energy Enterprises, LLC, Dallas, TX (US)

(*) Notice: Subject to any disclaimer, the term of this patent is extended or adjusted under 35 U.S.C. 154(b) by 0 days.

(21) Appl. No.: 14/209,013

(22) Filed: Mar. 13, 2014

(65) Prior Publication Data
US 2015/0144195 A1    May 28, 2015

Related U.S. Application Data

(60) Provisional application No. 61/909,168, filed on Nov. 26, 2013, provisional application No. 61/913,665, filed on Dec. 9, 2013.

(51) Int. Cl.
| | | |
|---|---|---|
| H01L 31/032 | (2006.01) | |
| H01G 9/20 | (2006.01) | |
| H01L 51/42 | (2006.01) | |
| H01L 31/0256 | (2006.01) | |

(52) U.S. Cl.
CPC ............ *H01L 31/032* (2013.01); *H01G 9/2031* (2013.01); *H01L 51/42* (2013.01); *H01L 2031/0344* (2013.01)

(58) Field of Classification Search
CPC ..... H01G 9/20; H01G 9/2009; H01G 9/2027; H01G 9/2013; H01G 9/2036; H01G 9/2004; H01G 9/205
See application file for complete search history.

(56) References Cited

U.S. PATENT DOCUMENTS

| | | | |
|---|---|---|---|
| 2010/0218825 A1 | 9/2010 | Jee et al. | |
| 2010/0282320 A1 | 11/2010 | Meyers et al. | |
| 2012/0032166 A1 | 2/2012 | Kawakita | |
| 2013/0104969 A1 | 5/2013 | Rappe et al. | |
| 2013/0167922 A1* | 7/2013 | Zhou et al. | 136/256 |

(Continued)

FOREIGN PATENT DOCUMENTS

| | | |
|---|---|---|
| KR | 10-1172374 B1 | 8/2012 |
| KR | 101172374 B1 | 8/2012 |

(Continued)

OTHER PUBLICATIONS

Lee et al., Efficient Hybrid Solar Cells Based on Meso-Superstructured Organometal Halide Perovskites, Science, vol./Issue 338, pp. 643-647 (2012).*

Christians et al., An Inorganic Hole Co9ndcutor for Organo-Lead Halide PErovskite Solar Cells, IMproved Hole Conductivity with Copper Iodide, Journal of hte American Chemical Society, pp. 758-764, published Dec. 18, 2013.*

(Continued)

*Primary Examiner* — Jayne Mershon
(74) *Attorney, Agent, or Firm* — Baker Botts L.L.P.

(57) ABSTRACT

Photovoltaic devices such as solar cells, hybrid solar cell-batteries, and other such devices may include an active layer having perovskite material and copper-oxide or other metal-oxide charge transport material. Such charge transport material may be disposed adjacent to the perovskite material such that the two are adjacent and/or in contact. Inclusion of both materials in an active layer of a photovoltaic device may improve device performance. Other materials may be included to further improve device performance, such as, for example: one or more interfacial layers, one or more mesoporous layers, and one or more dyes.

30 Claims, 34 Drawing Sheets

(56) References Cited

U.S. PATENT DOCUMENTS

2013/0240027 A1* 9/2013 Zakhidov et al. ............ 136/255
2013/0319513 A1* 12/2013 Kim et al. .................... 136/254
2014/0060639 A1* 3/2014 Zeira et al. ................... 136/256

FOREIGN PATENT DOCUMENTS

| WO | 2008-118422 | A1 | 10/2008 |
| WO | WO2013084029 | A1 | 6/2013 |
| WO | WO2013171517 | A1 | 11/2013 |

OTHER PUBLICATIONS

International Search Report and Written Opinion issued in related PCT Application No. PCT/US21014/025910 mailed on Jun. 20, 2014, 15 pages.

PCT Notification of Transmittal of the International Search Report and the Written Opinion of the International Searching Authority, or the Declaration; Int'l application No. PCT/US2014/067024; (12 pgs), Feb. 27, 2015.

* cited by examiner (Z)-2-cyano-3-[9,9-diethyl-7-(N-phenylanilino)
fluoren-2-yl]prop-2-enoic acid T1

2-[[9,9-diethyl-7-(N-phenylanilino)fluoren-2-yl]
methylene]propanedinitrile (E)-2-cyano-3-[9,9-diethyl-7-[N-(2-naphthyl) anilino]
fluoren-2-yl]prop-2-enoic acid (E)-2-cyano-3-[9,9-diethyl-7-[N-(1-naphthyl)anilino]
fluoren-2-yl]prop-2-enoic acid 3145  3146

3155  3156

3161

3162

3163

3164

3165

3166

3167

3168

PEROVSKITE AND OTHER SOLAR CELL MATERIALS

RELATED APPLICATIONS

This application is based upon and claims priority to U.S. Provisional Patent Application No. 61/909,168 filed 26 Nov. 2013; and U.S. Provisional Patent Application No. 61/913,665 filed 9 Dec. 2013, which are incorporated herein by reference for all purposes.

BACKGROUND

Use of photovoltaics (PVs) to generate electrical power from solar energy or radiation may provide many benefits, including, for example, a power source, low or zero emissions, power production independent of the power grid, durable physical structures (no moving parts), stable and reliable systems, modular construction, relatively quick installation, safe manufacture and use, and good public opinion and acceptance of use.

The features and advantages of the present disclosure will be readily apparent to those skilled in the art. While numerous changes may be made by those skilled in the art, such changes are within the spirit of the invention.

BRIEF DESCRIPTION OF THE DRAWINGS

FIG. 13($b$) is a space-filling model of (E)-2-cyano-3-[9,9-dihexyl-7-[N-(2-naphthyl)anilino]fluoren-2-yl]prop-2-enoic acid, according to some embodiments of the present disclosure.

DETAILED DESCRIPTION OF PREFERRED EMBODIMENTS

Figure 1:
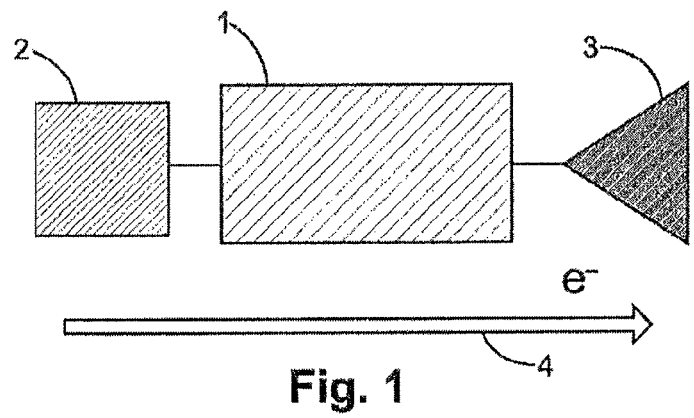
FIG. 1 is a general design scheme for a photoactive composition of matter of some embodiments of the present disclosure.

An emerging sector of PV technologies is based on organic materials which act as light absorbers and semiconductors in lieu of legacy materials like silicon. Organic electronics promise flexible, robust devices that can be fabricated cheaply by methods such as roll-to-roll printing. This has been demonstrated to date industrially with organic light-emitting diodes common today in mobile devices. Recent strides in Organic PV ("OPV") technologies have reached performance levels approaching that of their inorganic, legacy counterparts; however, the cost of the specialty chemicals utilized as light-absorbers and semiconductors, such as Ruthenium-based dyes, has been prohibitive in bringing OPVs to market.

In addition, improvements in other aspects of PV technologies compatible with organic, non-organic, and/or hybrid PVs promise to further lower the cost of both OPVs and other PVs. For example, some solar cells, such as solid-state dye-sensitized solar cells, may take advantage of novel cost-effective and high-stability alternative components, such as solid-state charge transport materials (or, colloquially, "solid state electrolytes"). In addition, various kinds of solar cells may advantageously include interfacial and other materials that may, among other advantages, be more cost-effective and durable than conventional options currently in existence.

The present disclosure relates generally to compositions of matter, apparatus and methods of use of materials in photovoltaic cells in creating electrical energy from solar radiation. More specifically, this disclosure relates to photoactive and other compositions of matter, as well as apparatus and methods of use and formation of such compositions of matter.

Examples of these compositions of matter may include, for example, photoactive organic compositions of matter, hole-transport materials, and/or materials that may be suitable for use as, e.g., interfacial layers, dyes, and/or other elements of PV devices. Such compounds may be deployed in a variety of PV devices, such as heterojunction cells (e.g., bilayer and bulk), hybrid cells (e.g., organics with $CH_3NH_3PbI_3$, ZnO nanorods or PbS quantum dots), and DSSCs (dye-sensitized solar cells). The latter, DSSCs, exist in three forms: solvent-based electrolytes, ionic liquid electrolytes, and solid-state hole transporters. Some or all of these compositions may also advantageously be used in any organic or other electronic device, with some examples including, but not limited to: batteries, field-effect transistors (FETs), light-emitting diodes (LEDs), non-linear optical devices, memristors, capacitors, rectifiers, and/or rectifying antennas. The present disclosure further provides methods for designing some of the compositions of matter, in some embodiments allowing tunability of the compositions to obtain desirable characteristics in different applications.

In some embodiments, the petroleum by-product "asphaltenes" provides a desirable source of materials for design and synthesis of some compounds of the present disclosure. For example, asphaltenes may provide an ideal interfacial layer for use in various devices such as PVs and others discussed to herein. In some embodiments, asphaltenes may directly be used to form an interfacial layer by treatment alone, thereby bypassing potentially expensive extraction processes. The asphaltenes used in some embodiments of the present disclosure may be characterized as a portion of crude oil that is n-heptane insoluble and/or toluene soluble.

Asphaltenes may also provide a suitable source for various photoactive organic compounds of the present disclosure. Asphaltenes are rich in aromatic complexes, yet cheap and abundant, making them in some cases an ideal source for such photoactive materials. Of the myriad of chemical compounds contained within asphaltenes, several are of particular interest in the synthesis of light-absorbing and other molecules for use in PV and other electric devices including heterojunction, hybrid, and DSSC PVs, as well as batteries, FETs, LEDs, non-linear optical devices, memristors, capacitors, rectifiers, and/or rectifying antennas. Thus, in some embodiments, the compositions of the present disclosure may be derived from materials extracted or otherwise obtained from asphaltene, such as fluorenes, naphthalenes, benzothiophenes, dibenzothiophenes, naphthothiophenes, dinaphthothiophenes, benzonaphthothiophenes, benzenes, benzothiazoles, benzothiadiazoles, cyclopentabisthiophenes, and thienothiophenes. Nonetheless, the flexibility of the design and tunability of some of the photoactive compositions of the present disclosure allows for a wide variety of potential sources of materials consistent with the present disclosure, including but not limited to asphaltenes.

In some embodiments, the present disclosure provides uses of photoactive organic and other compositions of matter in PV devices including heterojunction cells, hybrid cells, and DSSCs. In embodiments concerning DSSCs, said photoactive organic compositions are compatible with traditional solvent-based electrolytes of $I_2$ or Co complexes, but additionally solid-state DSSC structures free of electrolyte, containing rather hole-transport materials such as spiro-OMeTAD, $CsSnI_3$, $Cu_2O$, and other active materials. The photoactive organic compositions of matter of some embodiments may be used in any organic electronic device, including but not limited to batteries, field-effect transistors (FETs), light-emitting diodes (LEDs), and non-linear optical devices, memristors, capacitors, rectifiers, and/or rectifying antennas. The photoactive compositions of matter may, in some embodiments, be employed with additives (such as, in some embodiments, chenodeoxycholic acid or 1,8-diiodooctane).

Referring to FIG. 1, in some embodiments, photoactive organic compositions of matter in accordance with some embodiments of the present disclosure generally include: a primary electron donor moiety 2 a core moiety 1, and an electron withdrawing moiety 3. In some embodiments, the primary electron donor moiety 2 is chemically bound to the core moiety 1, and the core moiety is chemically bound to the electron-withdrawing moiety 3. In some embodiments, the electron donor moiety is located on the opposing end of the photosensitive compound from the electron-withdrawing moiety. In some embodiments, electrons generally flow within the photoactive composition from the primary electron donor moiety, to the core moiety, to the second electron donor moiety (if present), to the electron-withdrawing moiety, in accordance with the electron flow 4 depicted in FIGS. 1, 2, and 3.

Figure 2:
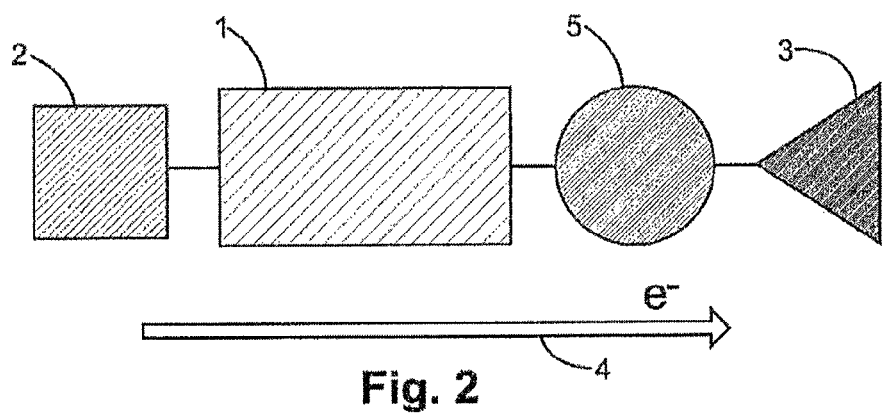
FIG. 2 is a general design scheme for a photoactive composition of matter of some embodiments of the present disclosure.
Figure 3:
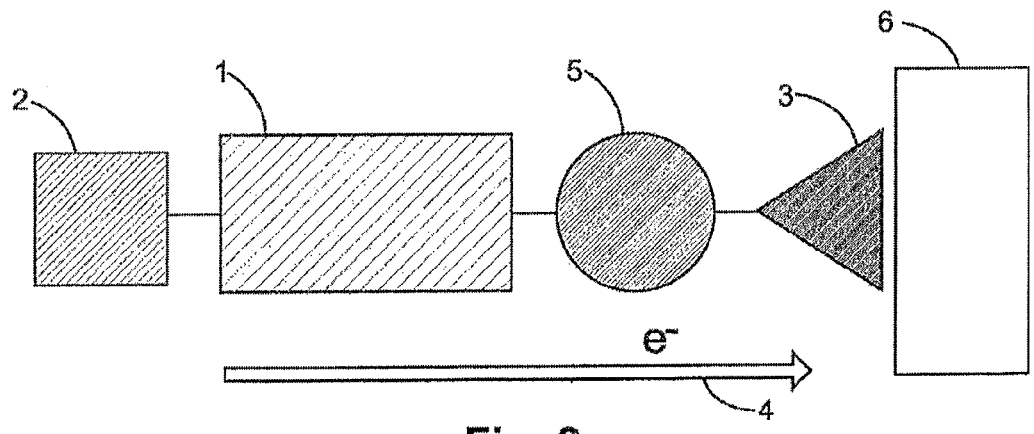
FIG. 3 is a general design scheme for a photoactive composition of matter of some embodiments of the present disclosure for use as a dye-sensitized solar cell (DSSC) dye or BHJ semiconductor.

In some embodiments, the compositions of matter optionally may further comprise a second electron donor moiety 5, as shown in FIG. 2. In some embodiments, the primary electron donor moiety 2, core moiety 1, and electron withdrawing moiety 3 may be bonded to each other in the order shown in FIG. 1. In other embodiments, the second electron donor moiety 5 may be between the core moiety 1 and the electron-withdrawing moiety 3, as shown in FIG. 2. And in some embodiments, the electron-withdrawing moiety 3 may comprise a substituent capable of binding the photoactive composition to another substance 6, as shown in FIG. 3. In some embodiments, this substance 6 may be a mesoporous layer of a DSSC (which may be, for example, $TiO_2$). In some embodiments, the compositions of matter may comprise a second electron-withdrawing moiety instead of or in addition to a second electron donor moiety. In yet other embodiments, the composition may comprise three or more electron-withdrawing moieties bonded to each other. In some embodiments, each electron-withdrawing moiety may instead be located anywhere in the composition.

Core Moiety

In some embodiments, the core moiety may comprise fluorene. In other embodiments, the core moiety may comprise any one of: benzothiophene, dibenzothiophene, naphthothiophene, dinaphthothiophene, benzonaphthothiophene, biphenyl, naphthyl, benzene, benzothiazole, benzothiadiazole, benzo[b]naphtha[2,3-d]thiophene, 4H-cyclopenta[1,2-b:5,4-b']bisthiophene, dinaphtho[2,3-d]thiophene, thieno[3,2-b]thiophene, naphthalene, anthracene, benzo[b][1]benzosilole, quinoxalino[2,3-b]quinoxaline, pyrazino[2,3-b]quinoxaline, pyrazino[2,3-b]pyrazine, imidazo[4,5-b]quinoxaline, imidazo[4,5-b]pyrazine, thiazolo[4,5-b]quinoxaline, thiazolo[4,5-b]pyrazine, 1,3-benzothiazole, and combinations thereof. In other embodiments, the core moiety may comprise any other multi-cyclic aromatic ring. In certain embodiments, the core moiety may comprise a nitrogen heterocyclic compound (e.g., the aforementioned pyrazine-, quinoxaline-, and thiazole-comprising moieties, in addition to any other nitrogen heterocycles, such as phenazines, purines, heterocyclic piperazine derivatives, heterocyclic pyridine derivatives, etc.). In some embodiments, the core moiety comprises a compound or compounds extracted from asphaltenes. In certain embodiments, the core moiety may intrinsically have all necessary characteristics to be employed in various applications of the photoactive organic compounds of embodiments of the present disclosure, such as a dye for a DSSC, or as an LED, or in any other application consistent with this disclosure. Additional components of photoactive organic compounds of some embodiments, discussed below, may enhance or otherwise modify the intrinsic characteristics of the core moiety.

Alkyl Tails and Alkyl Tail Selection

Figure 4:
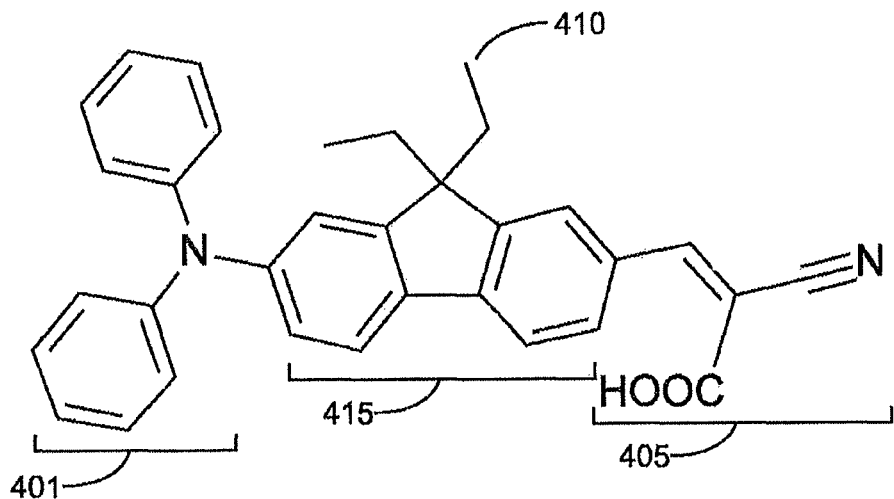
FIG. 4 is a chemical structure for the compound (Z)-2-cyano-3-[9,9'-diethyl-7-(N-phenylanilino)fluoren-2-yl]prop-2-enoic acid according to some embodiments of the present disclosure.

In some embodiments, the core moiety may further comprise one or more alkyl tails. In some embodiments, an alkyl tail is a substituent comprising a carbon backbone and that is bonded to a single carbon atom of any of the following: a core moiety; a primary electron donor moiety; an electron donor moiety; and an electron-withdrawing moiety. In some embodiments, the distal end of the carbon backbone of the alkyl tail is not covalently bonded to another compound. In some embodiments, two alkyl tails are bonded to the same carbon atom. For example, in some embodiments in which the core moiety comprises fluorene, the core moiety may additionally comprise two alkyl tails appended at the 9,9' carbon of the fluorene molecule (e.g., a 9,9'-dialkyl functionalized fluorene). By way of example, FIG. 4 depicts a composition of some embodiments of the present disclosure, which includes a fluorene 415 functionalized with diethyl alkyl tails 410 at the 9,9' carbon of the fluorene. Similarly, the embodiment depicted in FIG. 5 includes a fluorene 515 functionalized with diethyl alkyl tails 510 at the 9,9' carbon of the fluorene. Appending an alkyl tail or tails to the 9,9' carbon of fluorene may be advantageous because the hydrogen atoms appended thereto are acidic, and may be more readily substituted by alkyl tails.

However, different advantages such as greater molecular spacing may be achieved by appending an alkyl tail or tails to different locations on the core moiety, or on different locations of the photoactive composition, depending upon the makeup of the photoactive composition. Thus, in some embodiments, the alkyl tail or alkyl tails appended to the photoactive composition of matter may be appended on any carbon of the core moiety in place of one or more hydrogen atoms (that is, the alkyl tail or tails replace a hydrogen or hydrogens bonded to the carbon). The alkyl tail or tails may, in other embodiments, be appended to any carbon, or other atom, bonded to one or more hydrogens within the photoactive composition of matter (e.g., a carbon, or other atom, of the substituent that constitutes the primary electron donor moiety of some embodiments). In yet other embodiments comprising multiple alkyl tails, the alkyl tails may be appended to different carbon, or other, atoms within the composition.

The alkyl tail or tails of some embodiments may comprise $C_2$ to $C_{10}$ hydrocarbons, including various isomers. The alkyl tails of other embodiments may comprise $C_2$ to $C_{15}$ hydrocarbons, or, in other embodiments, $C_2$ to $C_{20}$ hydrocarbons. In yet other embodiments, the alkyl tails may comprise $C_2$ to $C_{30}$ hydrocarbons, or, in other embodiments, $C_2$ to $C_{40}$ hydrocarbons. As used herein, a "$C_2$" hydrocarbon is a hydrocarbon containing 2 carbon atoms; a $C_{10}$ hydrocarbon is a hydrocarbon containing 10 carbon atoms, and, in general, a $C_x$ hydrocarbon is a hydrocarbon containing x carbon atoms, where x is an integer. The alkyl tail or tails of some embodiments may comprise more than 40 carbons.

In some embodiments, the $C_2$ to $C_{10}$ hydrocarbons are linear or branched hydrocarbon chains. Thus, when an alkyl tail of some embodiments comprises a $C_4$ hydrocarbon, those embodiments may comprise any of the various possible isomers of $C_4$ hydrocarbons.

Figure 18:
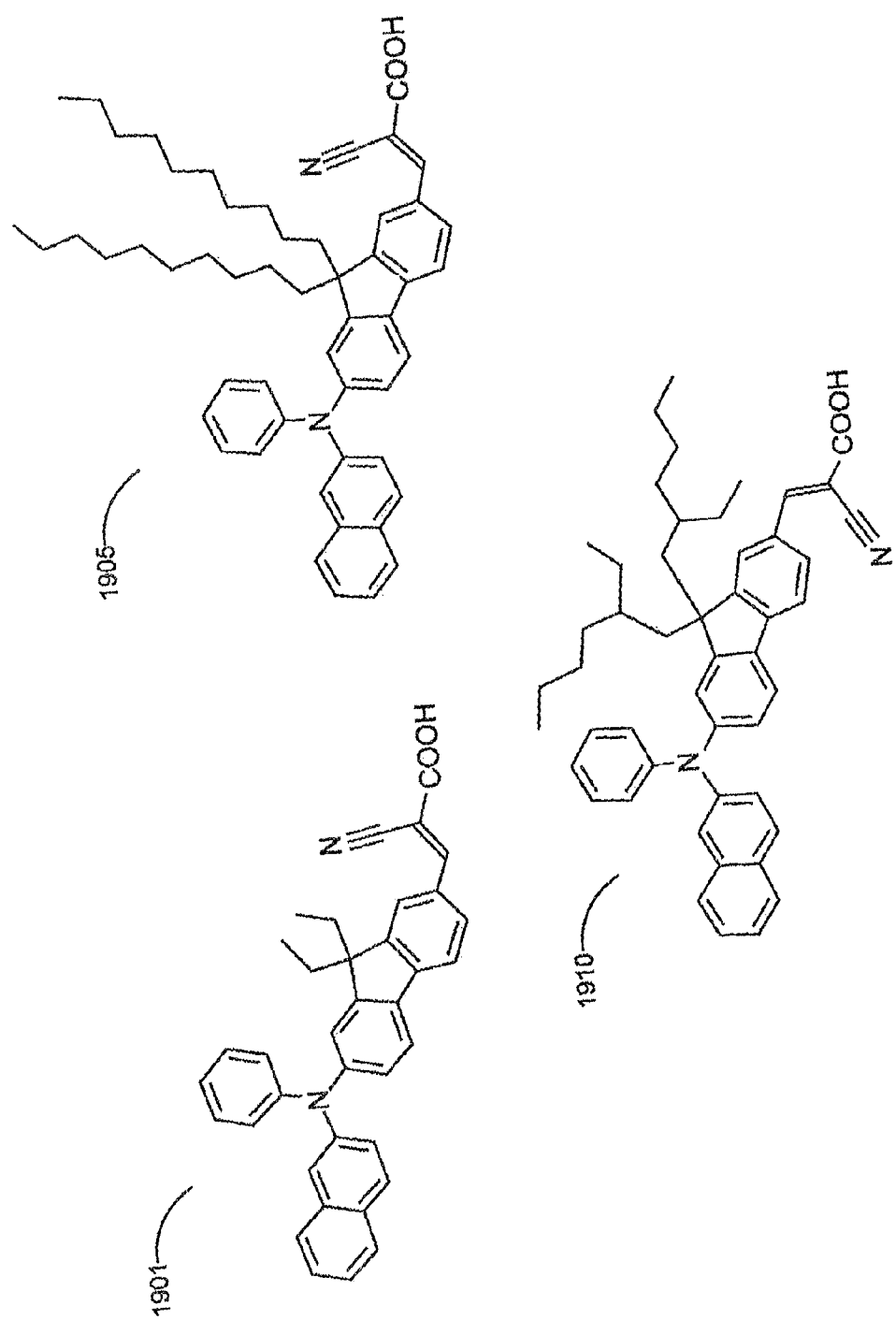
FIG. 18 illustrates chemical structures for (E)-2-cyano-3-[9,9'-R,R'-7-[N-(2-naphthyl)aniline]fluoren-2-yl]prop-2-enoic acid, where R signifies a dialkyl tail of various isomers of $C_2$ to $C_{10}$ compounds, according to some embodiments of the present disclosure.

Returning to the example embodiments in which the core moiety comprises a fluorene, in embodiments employing $C_2$ alkyl tails, the core moiety could comprise a 9,9'-diethyl fluorene. Likewise, in embodiments wherein the alkyl tails each comprise a $C_3$ hydrocarbon, the core moiety of such embodiments may comprise a 9,9'-dipropyl fluorene, or in other embodiments (using another $C_3$ isomer), a 9,9'-dimethylethyl fluorene. Any other $C_2$ to $C_{10}$ isomer may be used. Or, in other embodiments, any other $C_2$ to $C_{15}$, $C_2$ to $C_{20}$, $C_2$ to $C_{30}$, or $C_2$ to $C_{40}$ isomer may be used. FIG. 18 depicts the use of various alkyl tails on the core moiety of various embodiments of photoactive compositions, such as ethyl ($C_2$), decyl ($C_{10}$), and ethylhexyl ($C_8$, branched) alkyl tails.

In some embodiments, an alkyl tail or tails may provide spacing between different molecules of this photoactive composition. This may, for example, increase the light-to-power conversion efficiencies (PCEs) of PV cells comprising the photoactive composition. The spacing provided by the alkyl tail or tails may vary depending upon the makeup of the photoactive composition of some embodiments (e.g., different alkyl tails may be ideal for compositions comprising different primary electron donor moieties). In addition, the alkyl tail or tails may provide enhanced solubility when the photoactive compositions of the present disclosure are employed in the presence of a solvent (such as, for example, where the photoactive compositions are used or intended to be used in a DSSC, BHJ, or hybrid OPV device). The alkyl tail or tails of some embodiments may therefore depend upon the identity of the solvent used. Possible solvents include, but are not limited to: dichlorobenzene, chlorobenzene, toluene, methylene chloride, chloroform, acetonitrile, N,N-dimethylformamide, isopropanol, t-butanol, ethanol, methanol, and water.

In some embodiments, a longer alkyl tail may correspond to any of: a larger primary electron donor moiety, and a less polar solvent. On the other hand, a shorter alkyl tail according to some embodiments may correspond to a more polar solvent.

Figure 10:
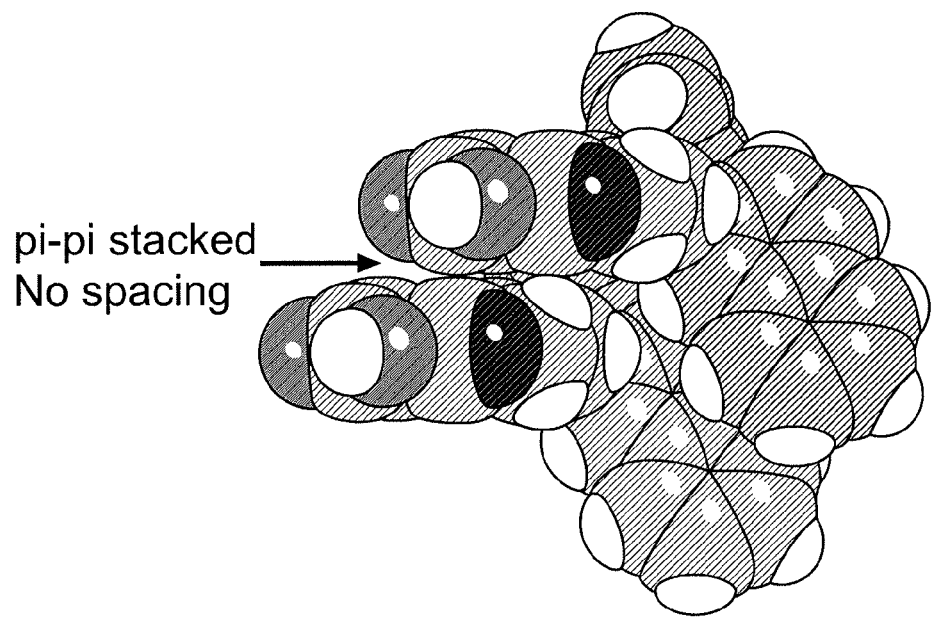
FIG. 10 is an illustration of molecular stacking that results from the presence of aromatic hydrocarbons according to some embodiments of the present disclosure.
Figure 11:
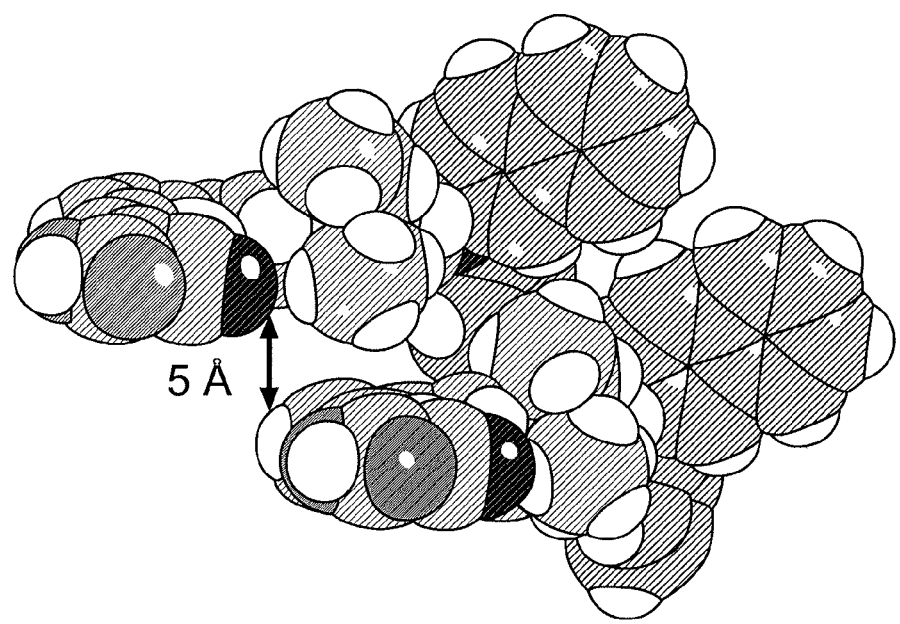
FIG. 11 is an illustration of intermolecular spacing achieved through the addition of one or more alkyl tails to molecules comprising aromatic hydrocarbons, according to some embodiments of the present disclosure.
Figure 12:
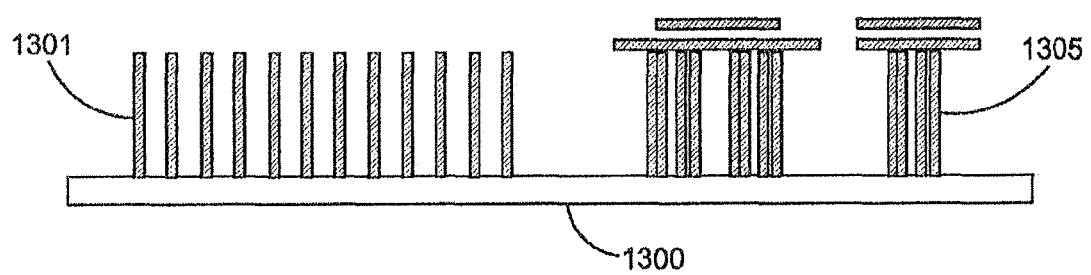
FIG. 12 is a depiction of the alignment of dye molecules on $TiO_2$ surface.

FIG. 10 illustrates examples of molecular stacking resulting from the presence of aromatic (ring) hydrocarbons in the photoactive composition. FIG. 10 is a molecular model of multiple molecules of a derivative of the composition T2 (of FIG. 6), but without the alkyl tails 705. FIG. 11 illustrates examples of employing alkyl tails to provide intermolecular spacing among molecules of the photoactive composition (FIG. 11 is a molecular model of multiple molecules of the composition T2 of FIG. 6 with diethyl alkyl tails 705 appended to the 9,9' carbon of the fluorene 701 of T2). This intermolecular spacing may be necessary to prevent undesirable pi-pi stacking, the bonding interaction between two or more sets of pi-orbitals, which may lead to detrimental clustering of multiple molecules of the photoactive composition, as depicted in FIG. 12. FIG. 12 shows a stylized example of employment of photoactive compositions as a dye on a DSSC. It depicts correctly aligned dye molecules 1301 on a surface 1300 (e.g., $TiO_2$), as well as 1305 clustered dye molecules on the surface 1300. The alkyl tails of some embodiments of the present disclosure prevent the undesirable clustering 1305, instead leading the dye molecules to maintain intermolecular spacing as with the correctly aligned dye molecules 1301. In other embodiments for applications such as BHJ, OPV, and FET, pi-pi stacking is desirable to induce molecular ordering. In such a case, alkyl tails are used to control the extent and direction of said pi-pi stacking.

In embodiments in which the photoactive composition comprises more than one alkyl tail, the alkyl tails may, in some embodiments, be identical. In other embodiments, they may be different. And in some embodiments, the alkyl tails may be appended to the same carbon atom of the photoactive composition, while in other embodiments, the alkyl tails may be appended to different carbon atoms of the photoactive composition.

Where the alkyl tails are different and bonded to the same carbon atom, however, chirality of the overall composition may result. Having isomers of different chirality intermixed may, in some cases, require alternating molecules of different chirality to achieve optimum intermolecular spacing. Thus, in some embodiments, the photoactive composition may comprise two or more different alkyl tails appended to the same carbon such that it is chiral. Other embodiments may comprise molecules of mixed chirality so as to achieve optimum intermolecular spacing. Further, yet other embodiments may comprise a method of alternating any one or more of the following: D isomers, L isomers, and diastereomers.

Primary Electron Donor Moiety

In some embodiments, the primary electron donor moiety comprises an electron-donating group such as an amine (e.g., an amino substituent). In some embodiments, the primary electron donor moiety comprises an aryl amine, such as a mono- or diaryl amine. In other words, suitable amino substituents may be of the general formula $R_1R_2N—$, where $R_1$ and $R_2$ may or may not be equivalent chemical structures. For example, in some embodiments, $R_1$ and $R_2$ are both phenyls (e.g., a diphenylamino substituent). In other embodiments, $R_1$ may be a phenyl group and $R_2$ a naphthyl group (e.g., a napthyl-phenylamino, or naphthylanilino, substituent). In yet other embodiments, $R_1$ and $R_2$ may both be a napthyl group (e.g., a dinaphthylamino substituent). Furthermore, although any number of isomers may be used in various embodiments, the amino group of some embodiments may comprise the 2-naphthyl anilino isomer (e.g., an N-(2-naphthyl)anilino substituent). In some embodiments, the primary electron donor moiety may comprise a diphenylamine substituent, and in other embodiments, the primary electron donor moiety may comprise a naphthyl triarylamine. Embodiments in which the primary electron donor moiety comprises either of these two classes of substituents may exhibit improved properties by increasing the level of intramolecular delocalization and due to pi-donation from these aromatic groups.

The primary electron donor moiety of other embodiments may comprise a monoaryl amino substituent, such as a methylphenylamino group (e.g., $R_1$ is a methyl group and $R_2$ is a phenyl group), or a methylnaphthylamino group (e.g., $R_1$ is a methyl group and $R_2$ is a naphthyl group). $R_1$ may, in other embodiments, by ethyl, propyl, or any other moiety. It will additionally be appreciated by one of ordinary skill in the art that any other aryl amino or amino functional group can be used as the amine in embodiments wherein the electron donor moiety comprises an amine.

In other embodiments, the nitrogen (N) of the above-discussed amino compounds may be substituted by another trivalent element from Group 15 of the Periodic Table of the Elements. For example, in some embodiments, the nitrogen (N) may be substituted by phosphorous (P), arsenic (As), or antimony (Sb). That is, the primary electron donor moiety may comprise a phosphine (e.g., $R_1R_2P—$), an arsine (e.g., $R_1R_2As—$), or a stibine (e.g., $R_1R_2Sb—$). The $R_1$ and $R_2$ of these compounds may be any of the compounds discussed previously with respect to $R_1R_2N$. Thus, for example, the primary electron donor moiety may comprise a monoaryl phosphine, or a diaryl phosphine (such as a napthyl-phenylphosphino) substituent.

In other embodiments the primary electron donor moiety may comprise a divalent substituent, such as an ether (of the general formula R—O—), a sulfide (of the general formula R—S—), or a selenide (of the general formula R—Se—). Again, the R of these formulae may be any of the $R_1$ or $R_2$ compounds discussed previously with respect to $R_1R_2N$.

In other embodiments, the primary electron donor moiety may comprise a substituent selected from any one or more of the following categories: alkyl, phenyl, phenol, alkoxy phenyl, dialkoxy phenyl, alkyl phenyl, phenol amine, alkoxy phenyl amine, dialkoxy phenyl amine, alkyl phenyl amine, multicyclic aromatic substituents (e.g., naphthylene, anthracene), and combinations thereof.

Furthermore, in some embodiments, the primary electron donor moiety, regardless of its makeup, is at the opposing end of the composition from the electron-withdrawing moiety.

Electron-Withdrawing Moiety

Figure 5:
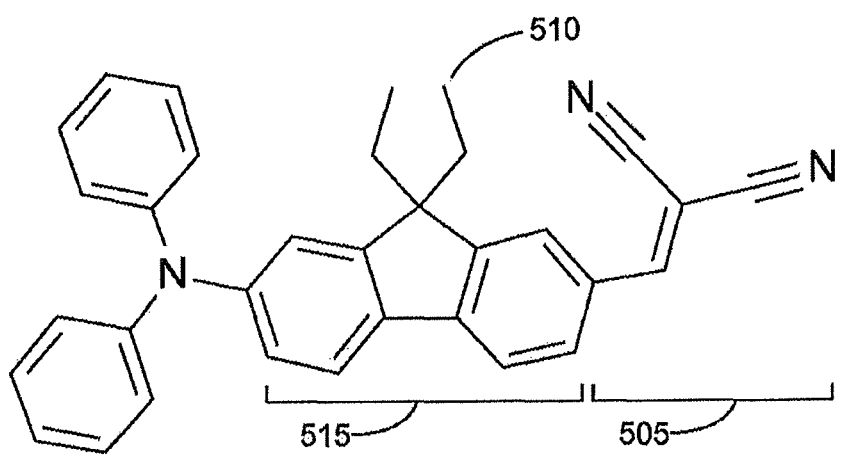
FIG. 5 is a chemical structure for 2-[[9,9'-diethyl-7-(N-phenylanilino)fluoren-2-yl]methylene]propanedinitrile according to some embodiments of the present disclosure.

In some embodiments, the electron-withdrawing moiety may be electron-poor. In some embodiments, it may be characterized by a higher electron affinity relative to the electron donor moiety and the core moiety. In other embodiments, the electron-withdrawing moiety may additionally be characterized by desirable electron orbital energy levels (e.g., HOMO/LUMO relative positions that provide advantageous organic semiconducting capabilities, such as a desired band gap $E_g$). Thus, in some embodiments, the electron-withdrawing moiety may comprise a carboxylic acid group in order to exhibit both characteristics (electron affinity and desired HOMO/LUMO relative positions). Examples of suitable carboxylic acid groups of some embodiments include cyanoacrylates. For example, FIG. 4 shows a photoactive composition consistent with the present disclosure in which the electron-withdrawing moiety comprises a cyanoacrylate (i.e., (Z)-2-cyano-3-[9,9'-diethyl-7-(N-phenylanilino)fluoren-3-yl] prop-2-enoic acid). In other embodiments, the electron-withdrawing moiety may comprise any one of the following: a monocyanocomplex, a dicyanocomplex, a thiocyanocomplex, or an isothiocyanocomplex. For example, FIG. 5 shows the photoactive composition 2-[[9,9-diethyl-7-(N-phenylanilino)fluoren-2-yl]methylene]propanedinitrile in which the electron-withdrawing moiety comprises a dicyanocomplex, but is otherwise identical to FIG. 4.

Furthermore, in some embodiments, the electron withdrawing moiety may further comprise a binding moiety; in other embodiments, the electron withdrawing moiety may additionally serve as a binding moiety, without the need to include a separate binding moiety. Thus, for example, in embodiments in which the electron withdrawing moiety comprises a carboxylic acid group, the carboxylic acid group may also function as the binding moiety. In some embodiments, the binding moiety may serve to bind the photoactive composition of matter to another substance such as a substrate (e.g., $TiO_2$), for example in DSSC applications. The binding moiety may also, in some embodiments, serve to bind the photoactive composition to other substances including, but not limited to, Au, Ag, FTO (fluorine-doped tin oxide), ITO (indium tin oxide), or $Nb_2O_5$, as a layer or into supramolecular extended structures, such as metal organic frameworks, covalent organic frameworks, or crystalline structures.

Second and Additional Electron Donor Moieties

Figure 19:
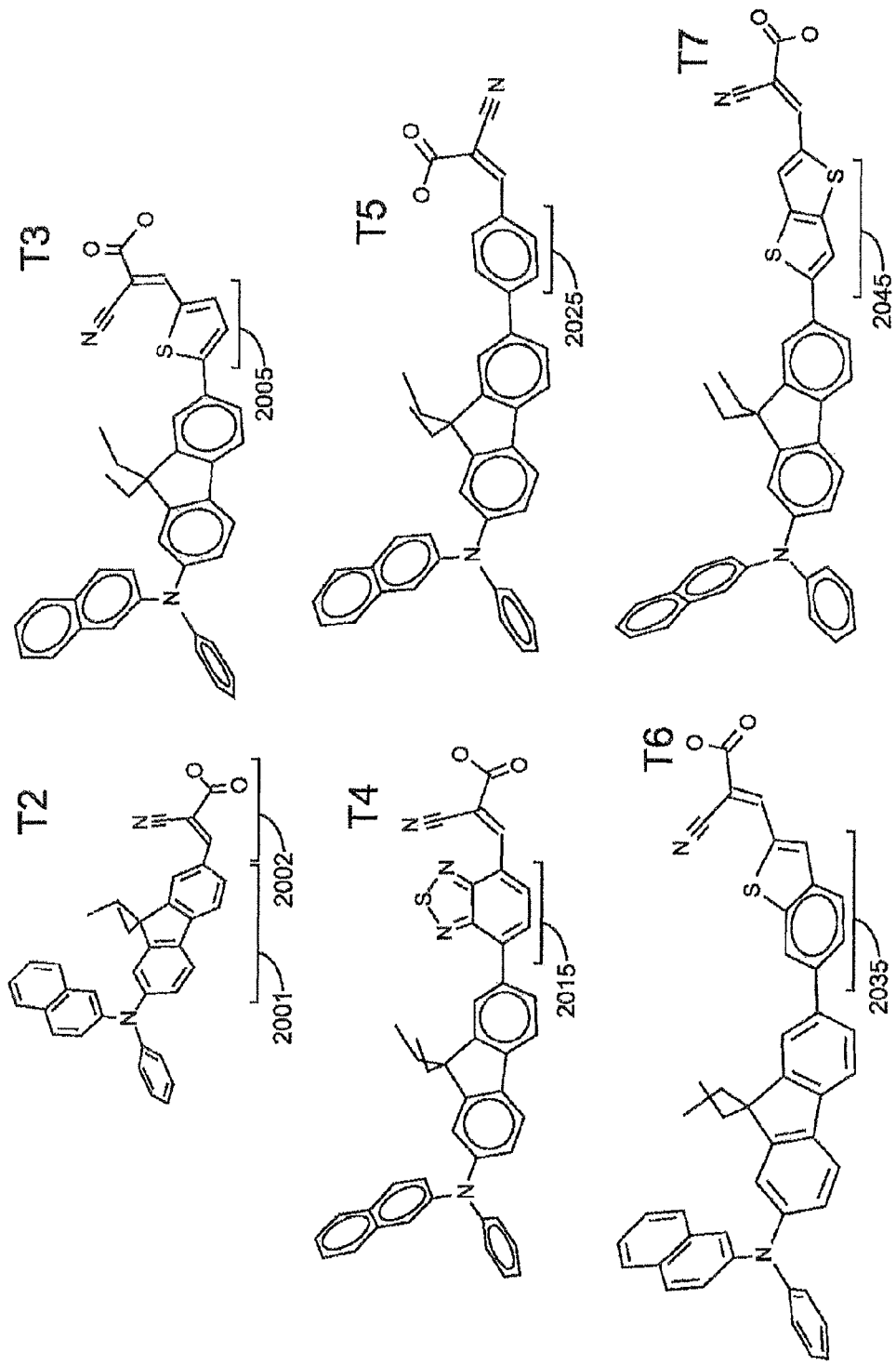
FIG. 19 illustrates chemical structures for various embodiments of the present disclosure, labeled T2, T3, T4, T5, T6, and T7.
Figure 28A:
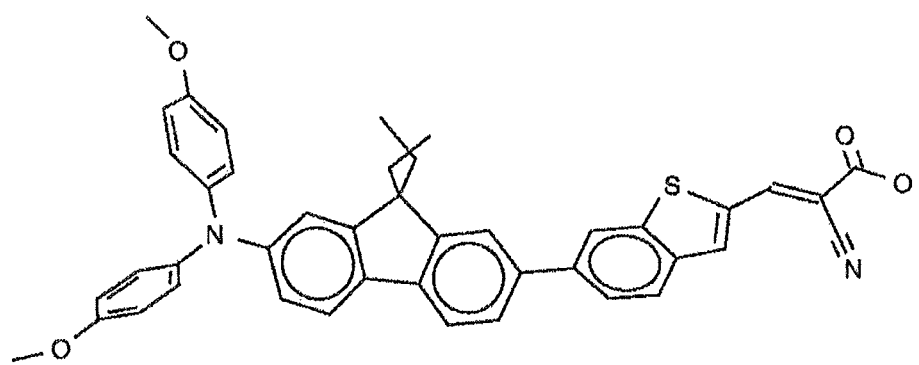
FIG. 28A is a chemical structure for (E)-2-cyano-3-[6-[9,9-diethyl-7-(4-methoxy-N-(4-methoxyphenyl)anilino)fluoren-2-yl]benzothiophen-2-yl]prop-2-enoic acid.
Figure 28B:
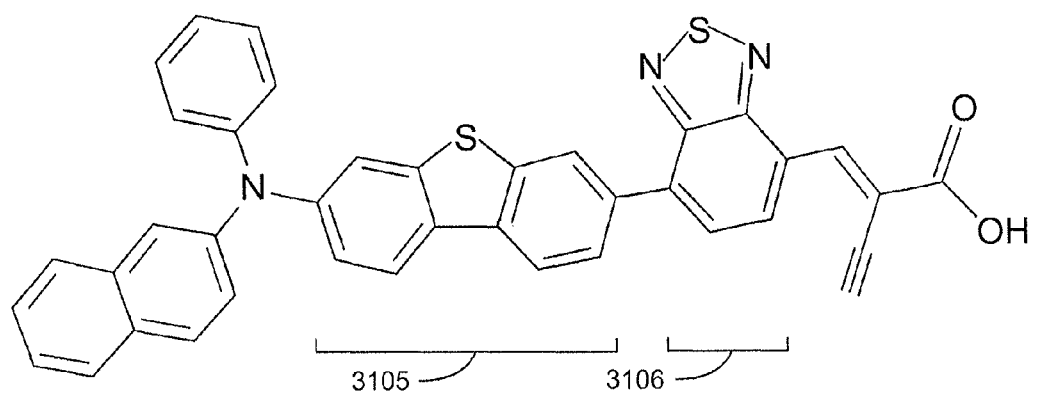
FIG. 28B is a chemical structure for (E)-2-cyano-3-[7-[7-(naphthalen-2-yl(phenyl)amino)dibenzo[b,d]thiophen-3-yl]benzo[c][1,2,5]thiadiazol-4-yl]acrylic acid.
Figure 28C:
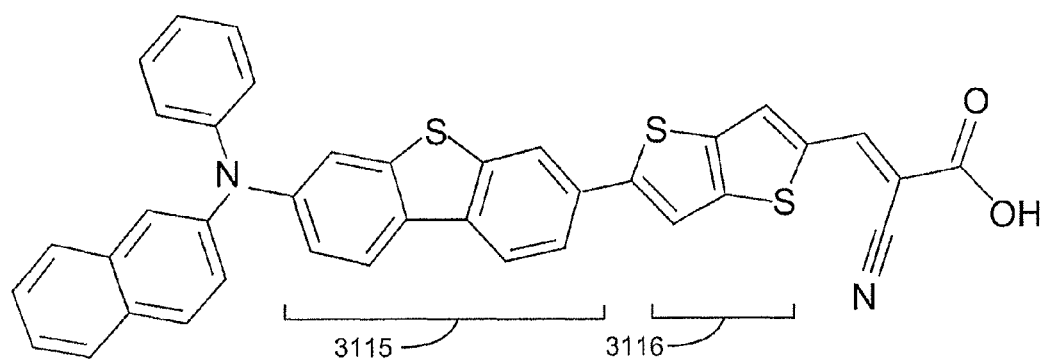
FIG. 28C is a chemical structure for (E)-2-cyano-3-[5-[7-(naphthalen-2-yl(phenyl)amino)dibenzo[b,d]thiophen-3-yl]thieno93,2-b]thiophen-2-yl]acrylic acid.
Figure 28D:
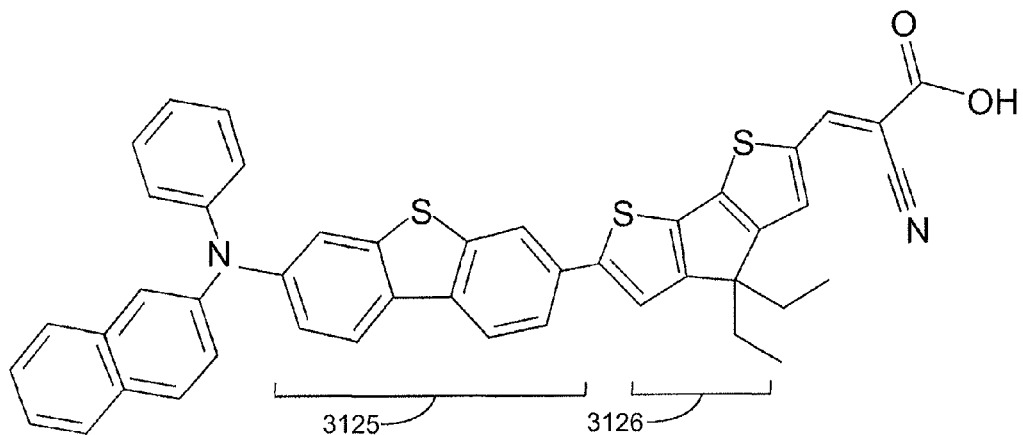
FIG. 28D is a chemical structure for (E)-2-cyano-3-[4,4-diethyl-6[7-(naphthalen-2-yl(phenyl)amino)dibenzo[b,d]thiophen-3-yl]-4H-cyclopenta[1,2-b:5,4-b']dithiophen-2-yl]acrylic acid.
Figure 28E:
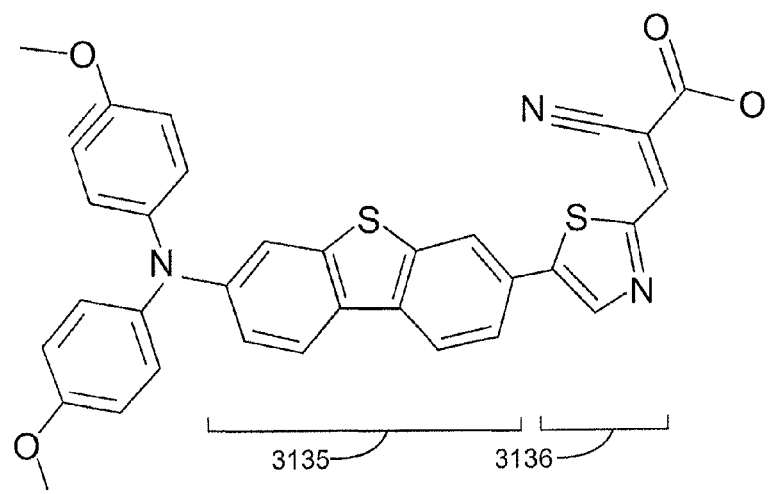
FIG. 28E is a chemical structure for (E)-2-cyano-3-[5-[7-(4-methoxy-N-(4-methoxyphenyl)anilino)dibenzothiophen-3-yl]thiazol-2-yl]prop-2-enoic acid.

Referring back to FIG. 2, the photoactive compositions of some embodiments may further comprise a second electron donor moiety 5, which in some embodiments is disposed between the core moiety 1 and the electron-withdrawing moiety 3. The second electron donor moiety may, in some embodiments, serve to further tune the absorption window (i.e., the allowed absorption wavelengths based on the band gap) of the photosensitive compositions of such embodiments. For example, in some embodiments, the second electron donor moiety may result in beneficial reduction of the band gap $E_g$ between the HOMO and LUMO of the photoactive composition. The second electron donor moiety may, in some embodiments, comprise a pi-electron donor. Any pi-electron donor moiety is suitable. As previously noted, FIGS. 28B-28F depict various example compositions comprising second electron donor moieties 3106, 3116, 3126, 3136, and 3146. FIG. 19 likewise depicts various other embodiments of compositions of the present disclosure, many of which include a second electron donor moiety. Specifically: T3 comprises a second electron donor moiety 2005 comprising thiophene; T4 comprises a second electron donor moiety 2015 comprising benzothiadiazole; T5 comprises a second electron donor moiety 2025 comprising a phenyl moiety; T6 comprises a second electron donor moiety 2035 comprising benzothiophene; and T7 comprises a second electron donor moiety 2045 comprising thienothiophene. Additionally, FIG. 28G depicts yet another embodiment comprising a second electron donor moiety 3156. And, as also previously noted, FIG. 28H depicts several nitrogen heterocycles that may be suitable second electron donor moieties. For comparison, T2 of FIG. 19 shows a photosensitive composition with no second electron donor moiety, with the core moiety 2001 (a 9,9'-diethyl fluorene) bonded directly to the electron-withdrawing moiety 2002 (2-cyano prop-2-enoic acid) on the 3-carbon of the acid. T2 of FIG. 19 is also the embodiment T2 illustrated in FIG. 6, that is, (E)-2-cyano-3-[9,9-diethyl-7-[N-(2-naphthyl)anilino]fluoren-2-yl]prop-2-enoic acid. Other examples of suitable second electron donor moieties include, but are not limited to: benzothiazole, benzothiophene, dibenzothiophene, naphthothiophene, dinaphthothiophene, benzonaphthothiophene, 4H-cyclopenta[1,2-b:5,4-b'] bisthiophene, thieno[3,2-b]thiophene, benzo[b][1] benzosilole, thiazole, quinoxalino[2,3-b]quinoxaline, pyrazino[2,3-b]quinoxaline, pyrazino[2,3-b]pyrazine, imidazo[4,5-b]quinoxaline, imidazo[4,5-b]pyrazine, thiazolo[4,5-b]quinoxaline, thiazolo[4,5-b]pyrazine, and combinations thereof.

Figure 20:
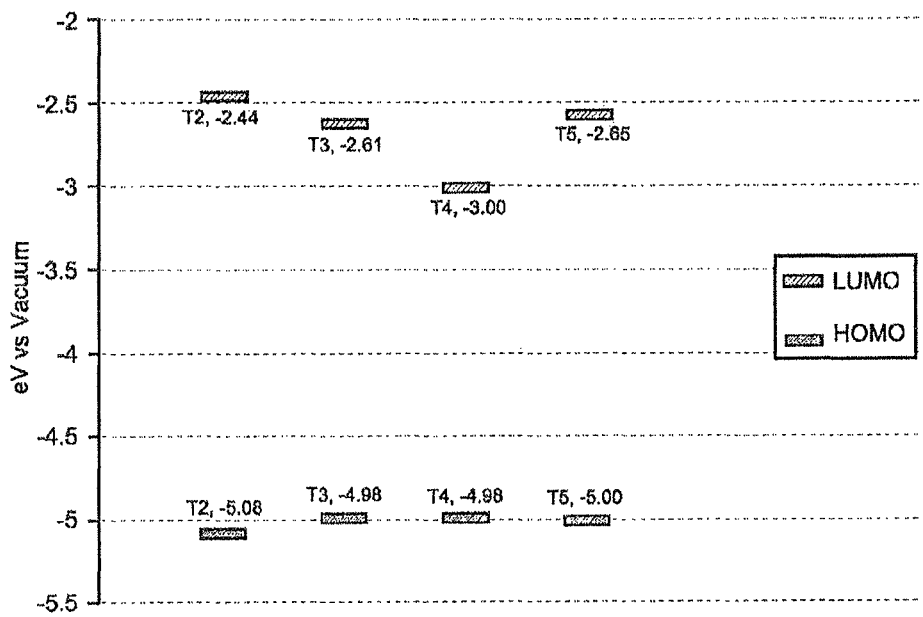
FIG. 20 is a graph containing data derived from computations carried out by molecular modeling software, and which shows HOMO and LUMO values of T2, T3, T4, and T5 of FIG. 19.
Figure 21:
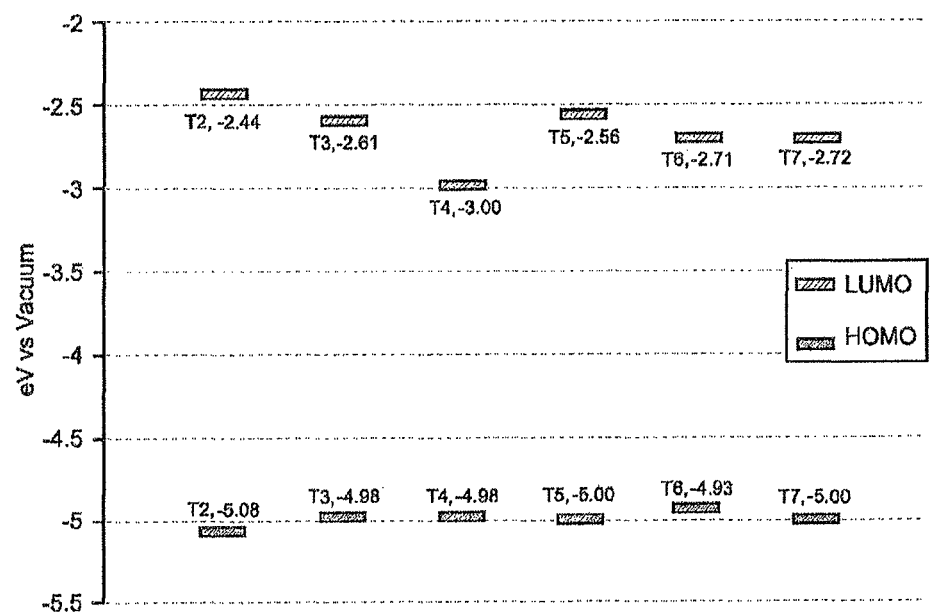
FIG. 21 is a graph containing data derived from computations carried out by molecular modeling software, and which shows HOMO and LUMO values of T6 and T7 of FIG. 19.

Referring back to FIG. 19, the compositions T3, T4, T5, T6, and T7 (comprising the second electron donor moieties discussed previously) may exhibit smaller $E_g$ values than exhibited in T2 (also shown in FIG. 6), that is, (E)-2-cyano-3-[9,9-diethyl-7-[N-(2-naphthyl)anilino]fluoren-2-yl]prop-2-enoic acid. As shown in FIG. 20, the $E_g$ of T3 is 2.37 eV; the $E_g$ of T4 is 1.98 eV; and the $E_g$ of T5 is 2.44 eV, while the $E_g$ of T2 is 2.64 eV. And as shown in FIG. 21, the $E_g$ of T6 is 2.22 eV, and the $E_g$ of T7 is 2.28 eV. The data shown in FIGS. 20 and 21 were derived from computations in molecular modeling software.

The compounds of some embodiments may comprise more than two electron donor moieties. Third (and greater) electron donor moieties may be selected for addition to the compound according to any of the tunability characteristics discussed herein. For example, a third (or greater) electron donor moiety may be selected for addition to the compound in order further to reduce $E_g$, and/or to modify either or both of the HOMO and LUMO energy levels. Any moiety suitable as a primary or second electron donor moiety may be used as a third or greater electron donor moiety in these embodiments.

Second and Additional Electron-Withdrawing Moieties

The compounds of some embodiments may comprise a second electron-withdrawing moiety. In some embodiments, the second electron-withdrawing moiety may be any moiety suitable for inclusion as an electron-withdrawing moiety, as discussed previously. In other embodiments, the second electron-withdrawing moiety may comprise a substituent that is electron-poor, but is not suitable for binding the compound to a substrate or other surface. That is, in these embodiments it may be preferable to select the second electron-withdrawing moiety from a different subset of moieties than the subset from which the first electron-withdrawing moiety is selected. Thus, in some embodiments, second electron-withdrawing moieties may comprise any one or more of the following: perfluorophenyls, acridones, triazines, and perylene imides. Some embodiments may also comprise three or more electron-withdrawing moieties; these moieties may be selected from any moiety suitable for use as a second electron-withdrawing moiety.

Illustrative Embodiments of Photoactive Organic Compounds

Figure 6:
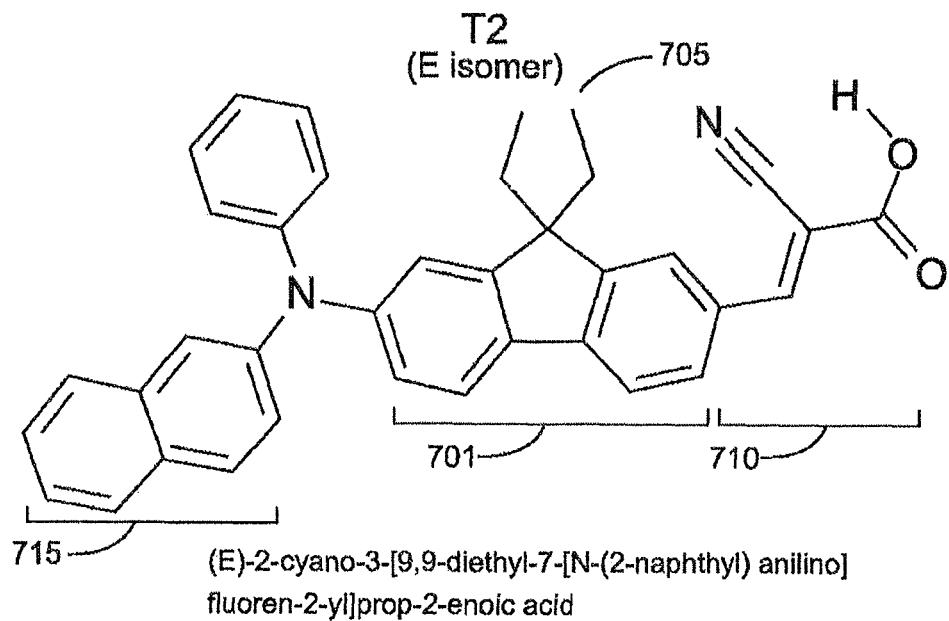
FIG. 6 is a chemical structure for (E)-2-cyano-3-[9,9-diethyl-7-[N-(2-naphthyl)anilino]fluoren-2-yl]prop-2-enoic acid according to some embodiments of the present disclosure.
Figure 7:
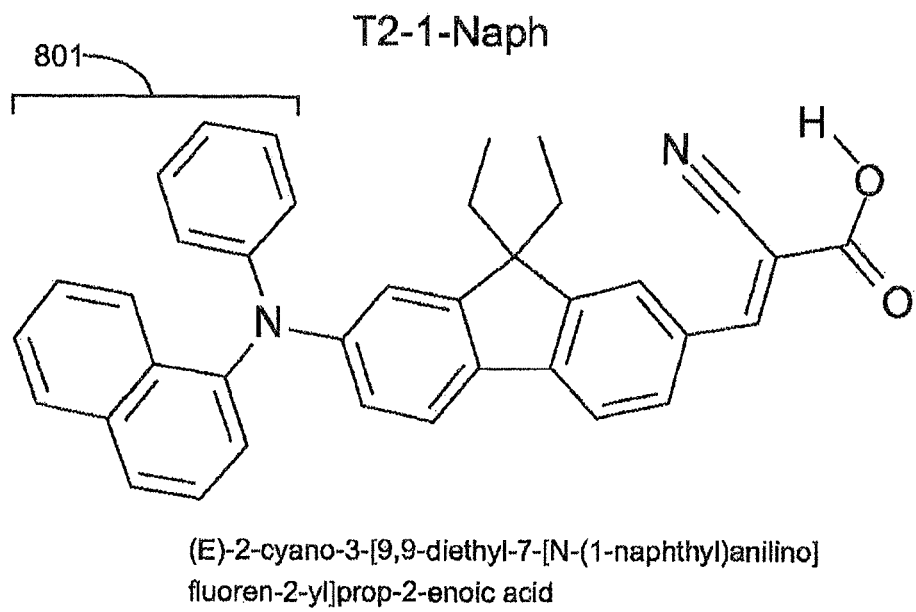
FIG. 7 is a chemical structure for (E)-2-cyano-3-[9,9-diethyl-7-[N-(1-naphthyl)anilino]fluoren-2-yl]prop-2-enoic acid.
Figure 8:
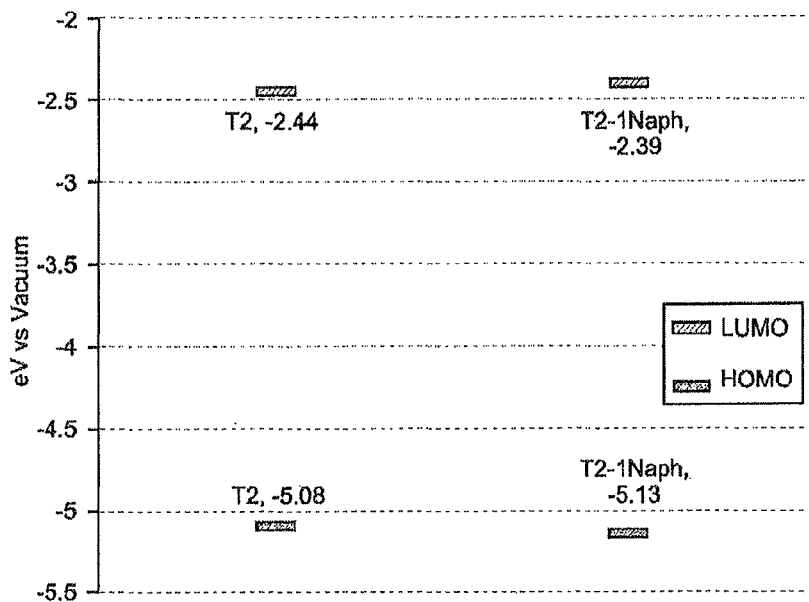
FIG. 8 is a graph containing data derived from computations carried out by molecular modeling software, and which shows the LUMO and HOMO values, in eV, of (E)-2-cyano-3-[9,9-diethyl-7-[N-(2-naphthyl)anilino]fluoren-2-yl]prop-2-enoic acid versus (E)-2-cyano-3-[9,9-diethyl-7-[N-(1-naphthyl)anilino]fluoren-2-yl]prop-2-enoic acid.

Consistent with the above, then, in one embodiment the photoactive compound may comprise 2-cyano-3-[9,9'-diethyl-7-[N-(2-naphthyl)anilino]fluoren-2-yl]prop-2-enoic acid in either the Z or E isomer (with reference to the C═C bond of the propenoic acid). FIG. 6 shows the E isomer, labeled T2, that is, (E)-2-cyano-3-[9,9'-diethyl-7-(N-phenylanilino)fluoren-2-yl]prop-2-enoic acid. In this embodiment, the core moiety 701 comprises fluorene, with two $C_2$ alkyl tails 705 appended to the 9,9' carbon of the fluorene (that is, the core moiety comprises a 9,9' diethyl fluorene). The electron-withdrawing moiety 710 comprises 2-cyanoprop-2-enoic acid, and is bonded at the 3 carbon of the propenoic acid to the core moiety. The primary electron donor moiety 715 here comprises an N-naphthylanilino substituent bonded to the 7 carbon of the fluorene. This embodiment specifically comprises the N-(2-naphthyl)anilino isomer, which exhibits the unexpected benefit of greater photoelectric power conversion efficiency (PCE) (when the compound is used in OPV applications such as a DSSC dye) over a compound that comprises instead the N-(1-naphthyl)anilino isomer 801, but is otherwise identical, as illustrated in FIG. 7 (labeled T2-1-Naph). Specifically, compounds comprising the N-(2-naphthyl)anilino isomer exhibit approximately 6.6% PCE, whereas otherwise identical compounds that instead employ the N-(1-naphthyl)anilino isomer exhibit approximately 6.0% PCE. One possible explanation for this enhanced efficiency is the significant electronic change in the composition that results when the primary electron donor moiety comprises the N-(2-naphthyl)anilino isomer. As shown in FIG. 8, the 2-naphthyl isomer T2 provides the composition with a superior (smaller) band gap ($E_g$) due to the resulting deeper LUMO (−2.44 eV vs vacuum) and shallower HOMO (−5.08 eV vs vacuum). Specifically, the 1-naphthyl $E_g$ is 2.74 eV (again, this is the difference between the LUMO and HOMO), while the 2-naphthyl $E_g$ is 2.64 eV, as shown in FIG. 8, which contains data derived from computations in molecular modeling software. In addition, the 2-naphthyl isomer additionally improves the absorptive properties of the composition, such as by red-shifting (e.g., permitting absorption of longer wave-length light, increasing the spectral window).

This comparison further illustrates some of the desirable electronic properties previously discussed with respect to tunability considerations, consistent with the design methods of various embodiments of the present disclosure. That is, selection of the 2-naphthyl isomer instead of the 1-naphthyl isomer results in smaller $E_g$, shallower HOMO, deeper LUMO, and therefore smaller $E_g$. This in turn has a positive effect on the PCE and on the absorptive properties of the composition.

Figure 9:
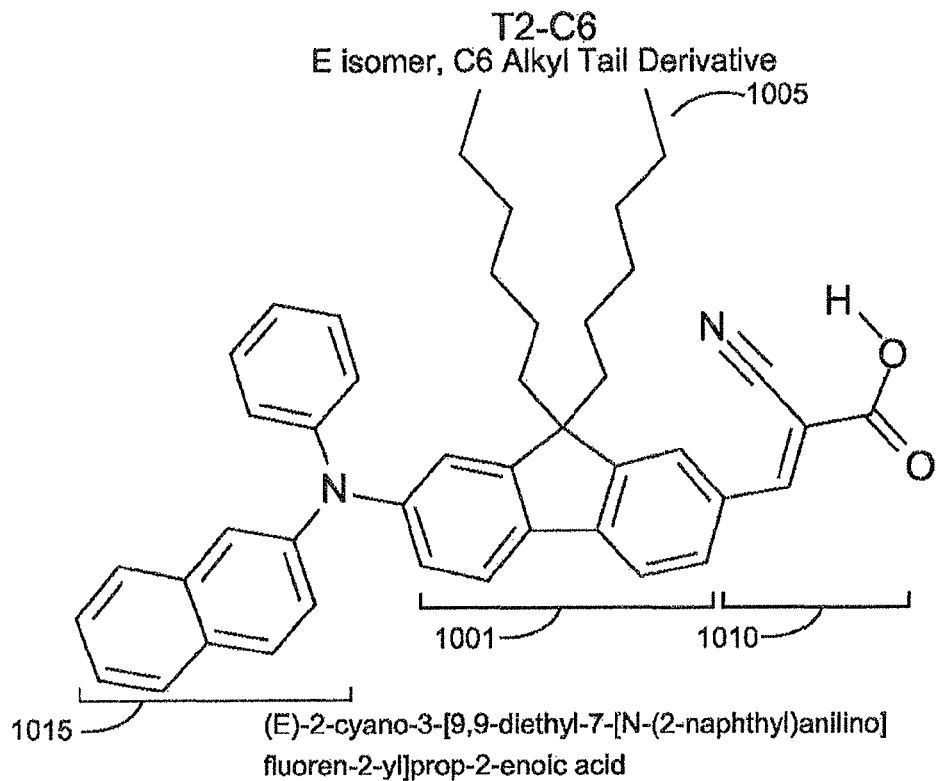
FIG. 9 is a chemical structure for (E)-2-cyano-3-[9,9-dihexyl-7-[N-(2-naphthyl)anilino]fluoren-2-yl]prop-2-enoic acid according to some embodiments of the present disclosure.
Figure 13:
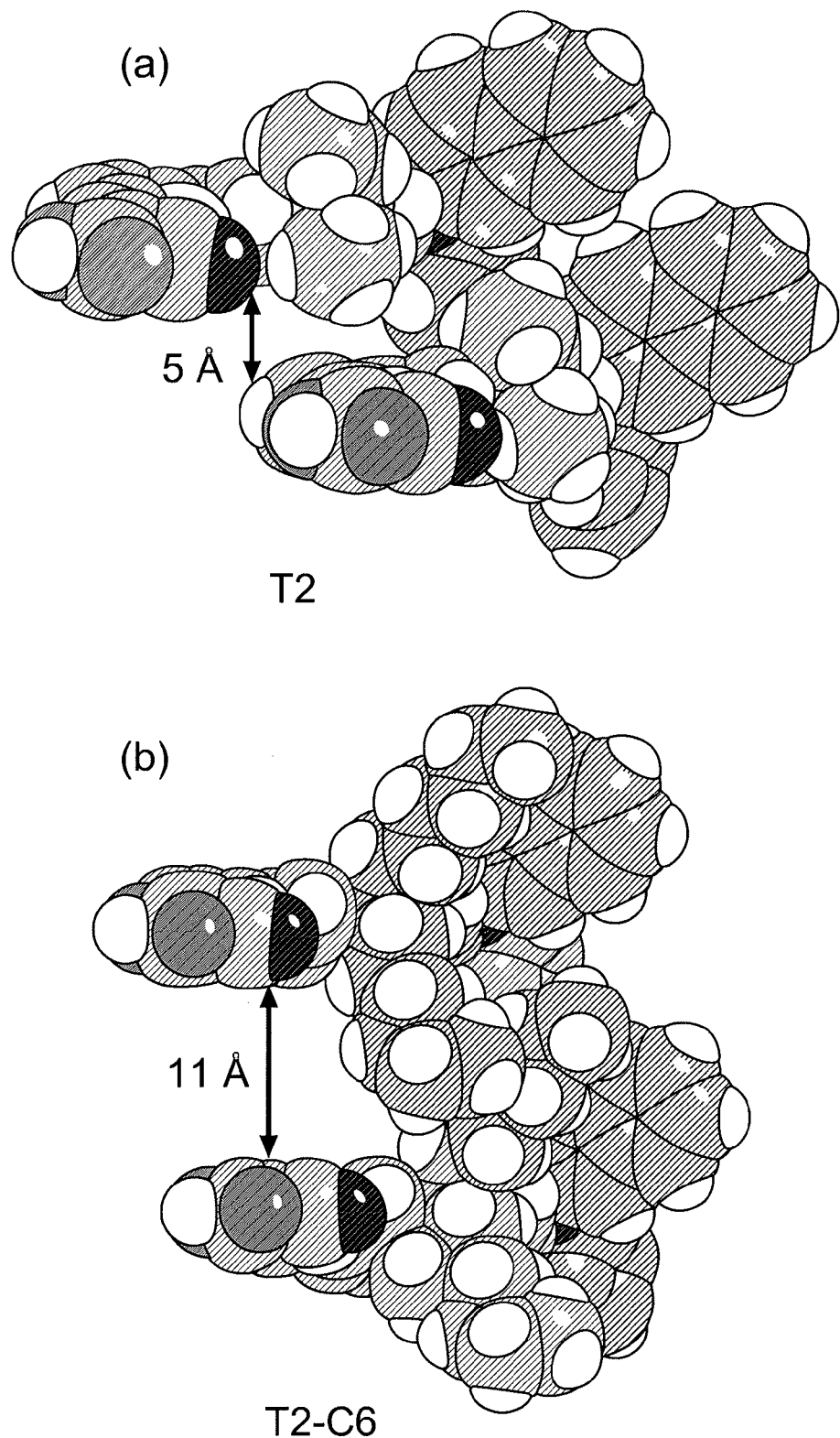
FIG. 13($a$) is a space-filling model of (E)-2-cyano-3-[9,9-diethyl-7-[N-(2-naphthyl)anilino]fluoren-2-yl]prop-2-enoic acid, according to some embodiments of the present disclosure.

Consistent with the above disclosure, other embodiments of compositions of the present disclosure may comprise alkyl tails of differing lengths. For example, embodiments comprising the same electron-donating and electron-withdrawing moieties, but different alkyl tails, include, but are not limited to: 2-cyano-3-[9,9-dipropyl-7-[N-(2-naphthyl)anilino]fluoren-2-yl]prop-2-enoic acid; 2-cyano-3-[9,9-dibutyl-7-[N-(2-naphthyl)anilino]fluoren-2-yl]prop-2-enoic acid; and so on up to and including $C_{10}$, $C_{15}$, $C_{20}$, $C_{30}$, or $C_{40}$ alkyl tails, consistent with the previous discussion of alkyl tails. The example embodiment (E) 2-cyano-3-[9,9-dihexyl-7-[N-(2-naphthyl)anilino]fluoren-2-yl]prop-2-enoic acid, for example, is labeled T2-C6 in FIG. 9, wherein the core moiety 1001, electron-withdrawing moiety 1010, and primary electron donor moiety 1015 comprise the same substituents as the embodiment T2 depicted in FIG. 6. But, as shown in FIG. 9, the alkyl tails 1005 appended to the 9,9' carbon of the fluorene comprise a dihexyl substituent rather than the diethyl of T2 in FIG. 6. FIGS. 13(a) and (b) illustrates the molecular spacing difference achieved by the dihexyl as opposed to diethyl alkyl tails of these compounds (11 Å versus 5 Å).

Furthermore, FIG. 18 shows the substitution of $C_2$, $C_{10}$, and branched $C_8$ (ethylhexyl) alkyl tails on the 9,9' carbon of fluorene in various embodiments 1901, 1905, and 1910, respectively. Embodiments using branched alkyl tails (and, again, utilizing the same core, electron-donating, and electron-withdrawing moieties) include, but are not limited to: 2-cyano-3-[9,9-dimethylethyl-7-[N-(2-naphthyl)anilino]fluoren-2-yl]prop-2-enoic acid; 2-cyano-3-[9,9-dimethylpropyl-7-[N-(2-naphthyl)anilino]fluoren-2-yl]prop-2-enoic acid; and so on using any branched alkyl tail.

It will further be appreciated by one of ordinary skill in the art that other embodiments may comprise different primary electron-donating moieties and/or electron-withdrawing moieties consistent with the previous discussion regarding each of those moieties. For example, FIG. 4 shows another embodiment of a photoactive compound of the present disclosure: (Z)-2-cyano-3-[9,9'-diethyl-7-(N-phenylanilino)fluoren-2-yl]prop-2-enoic acid. In this instance, the core moiety 415, alkyl tails 410, and electron-withdrawing moiety 405 are the same as in T2 of FIG. 6, but the primary electron donor moiety 401 of the embodiment depicted in FIG. 4 comprises an N-phenylanilino substituent instead of the N-(2-naphthyl)anilino substituent of the primary electron donor moiety 715 of T2 in FIG. 6. And FIG. 5 shows an embodiment differing from the embodiment of FIG. 4 only in that the embodiment of FIG. 5 comprises a different electron-withdrawing moiety 505: 2-(methylene)propanedinitrile instead of 2-cyano-prop-2-enoic acid (as in FIG. 4). And in some embodiments, the different primary electron donor moieties and/or electron-withdrawing moieties may be selected based upon the methods of design previously discussed.

Likewise, some embodiments may comprise different core moieties. For example, FIGS. 28B-28E depict embodiments wherein the core moiety comprises a dibenzothiophene (3105, 3115, 3125, and 3135, respectively). These example embodiments further include second electron donor moieties (e.g., 3106, 3116, 3126, and 3136 respectively). Specifically, FIG. 28B depicts (E)-2-cyano-3-(7-(7-(naphthalen-2-yl(phenyl)amino)dibenzo[b,d]thiophen-3-yl)benzo[c][[1,2,5]thiadiazol-4-yl)acrylic acid. FIG. 28C depicts (E)-2-cyano-3-[5-[7-(naphthalen-2-yl(phenyl)amino)dibenzo[b,d]thiophen-3-yl]thieno93,2-b]thiophen-2-yl]acrylic acid. FIG. 28D depicts (E)-2-cyano-3-[4,4-diethyl-6[7-(naphthalen-2-yl(phenyl)amino)dibenzo[b,d]thiophen-3-yl]-4H-cyclopenta[1,2-b:5, 4-b']dithiophen-2-yl]acrylic acid. FIG. 28E depicts (E)-2-cyano-3-[5-[7-(4-methoxy-N-(4-methoxyphenyl)anilino)dibenzothiophen-3-yl]thiazol-2-yl]prop-2-enoic acid.

Figure 28F:
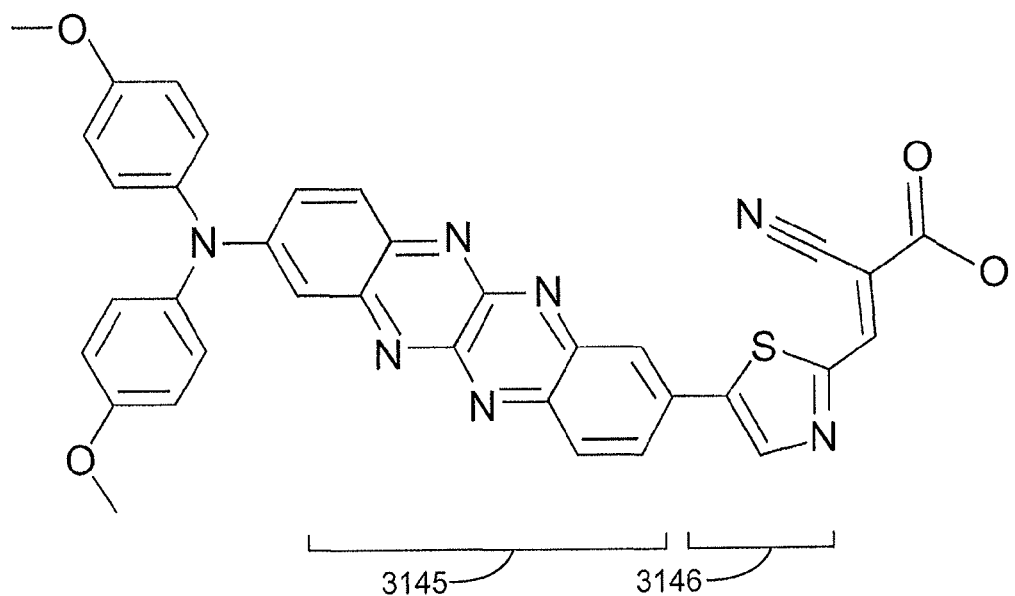
FIG. 28F is a chemical structure for (E)-2-cyano-3-[5-[2-(4-methoxy-N-(4-methoxyphenyl)anilino)quinoxalino[3,2-b]quinoxalin-8-yl]thiazol-2-yl]prop-2-enoic acid.
Figure 28G:
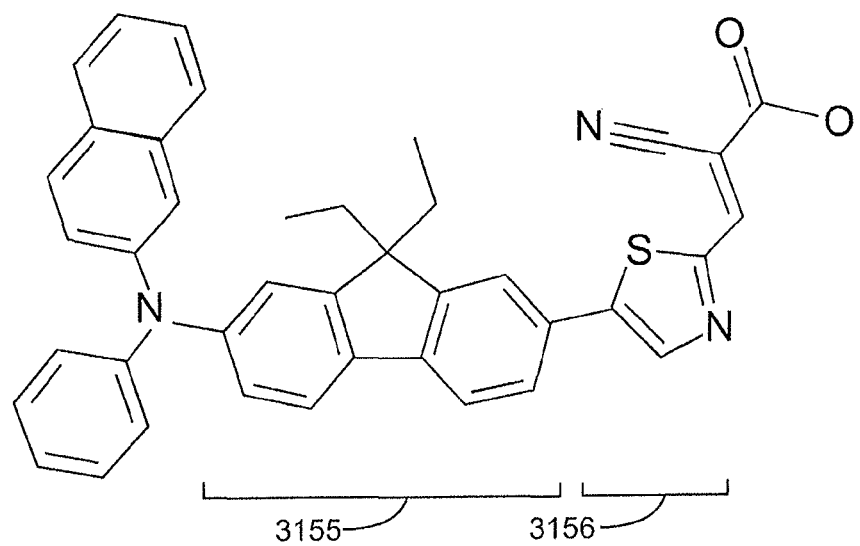
FIG. 28G is a chemical structure for (E)-2-cyano-3-[5-[9,9-diethyl-7-[N-(2-naphthyl)anilino]fluoren-2-yl]thiazol-2-yl]prop-2-enoic acid.
Figure 28H:
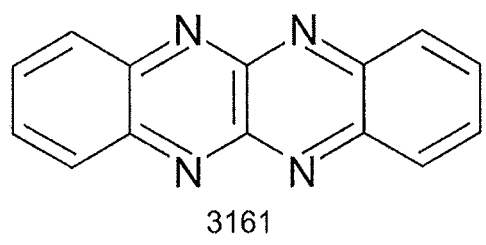
FIG. 28H is a compilation of chemical structures for various nitrogen heterocycle compounds in accordance with some aspects of the present disclosure.
Figure 28H:
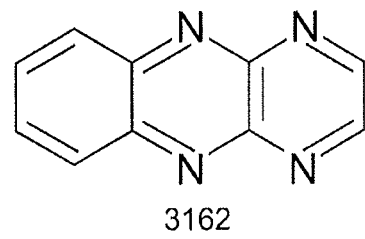
Figure 28H:
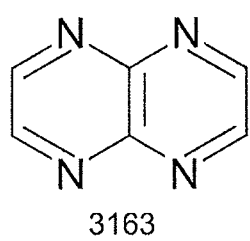
Figure 28H:
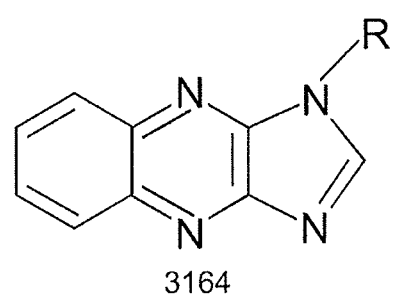
Figure 28H:
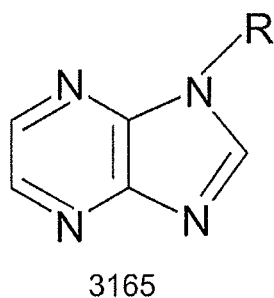
Figure 28H:
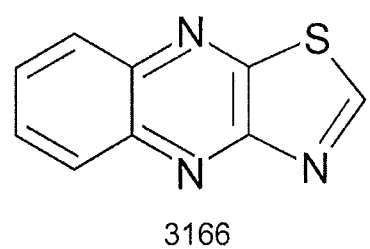
Figure 28H:
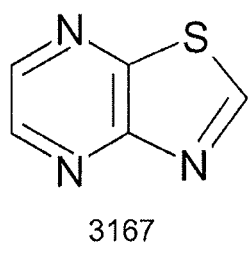
Figure 28H:
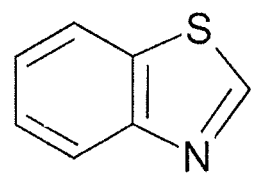

By way of further example, FIG. 28F depicts (E)-2-cyano-3-[5-[2-(4-methoxy-N-(4-methoxyphenyl)anilino)quinoxalino[3,2-b]quinoxalin-8-yl]thiazol-2-yl]prop-2-enoic acid. Here, the core moiety comprises a quinoxalino-quinoxaline (3145), and the compound also includes a second electron donor moiety 3146.

Yet further examples of suitable core moieties are shown in FIG. 28H. FIG. 28H depicts various nitrogen heterocycle compounds which may be useful as either or both of core moieties or electron donor moieties (either primary or second and/or additional electron donor moieties, discussed in more detail below). The exemplary nitrogen heterocycles of FIG. 28H include: pyrazino[2,3-b]pyrazine 3161; imidazo[4,5-b]quinoxaline 3162; pyrazino[2,3-b]pyrazine 3163; imidazo[4,5-b]quinoxaline 3164; imidazo[4,5-b]pyrazine 3165; thiazolo[4,5-b]quinoxaline 3166; thiazolo[4,5-b]pyrazine 3167; and 1,3-benzothiazole 3168.

Photovoltaic Cells and Other Electronic Devices

The present disclosure in some embodiments provides PVs comprising a photoactive organic compound of the present disclosure and/or other advantageous materials or layers as discussed hereinbelow. In some embodiments, the PV may be an OPV. In some embodiments, the OPV may be a DSSC, wherein the dye comprises a photoactive compound of the present disclosure. In some embodiments, the OPV may be a BHJ, wherein the photoactive layer of the BHJ comprises a photoactive compound of the present disclosure. Any DSSC, BHJ, or OPV generally as known in the art may advantageously incorporate a photoactive organic compound of embodiments of the present disclosure, which may provide substantial benefits over conventional OPVs, particularly greater PCE to cost ratios.

Figure 24:
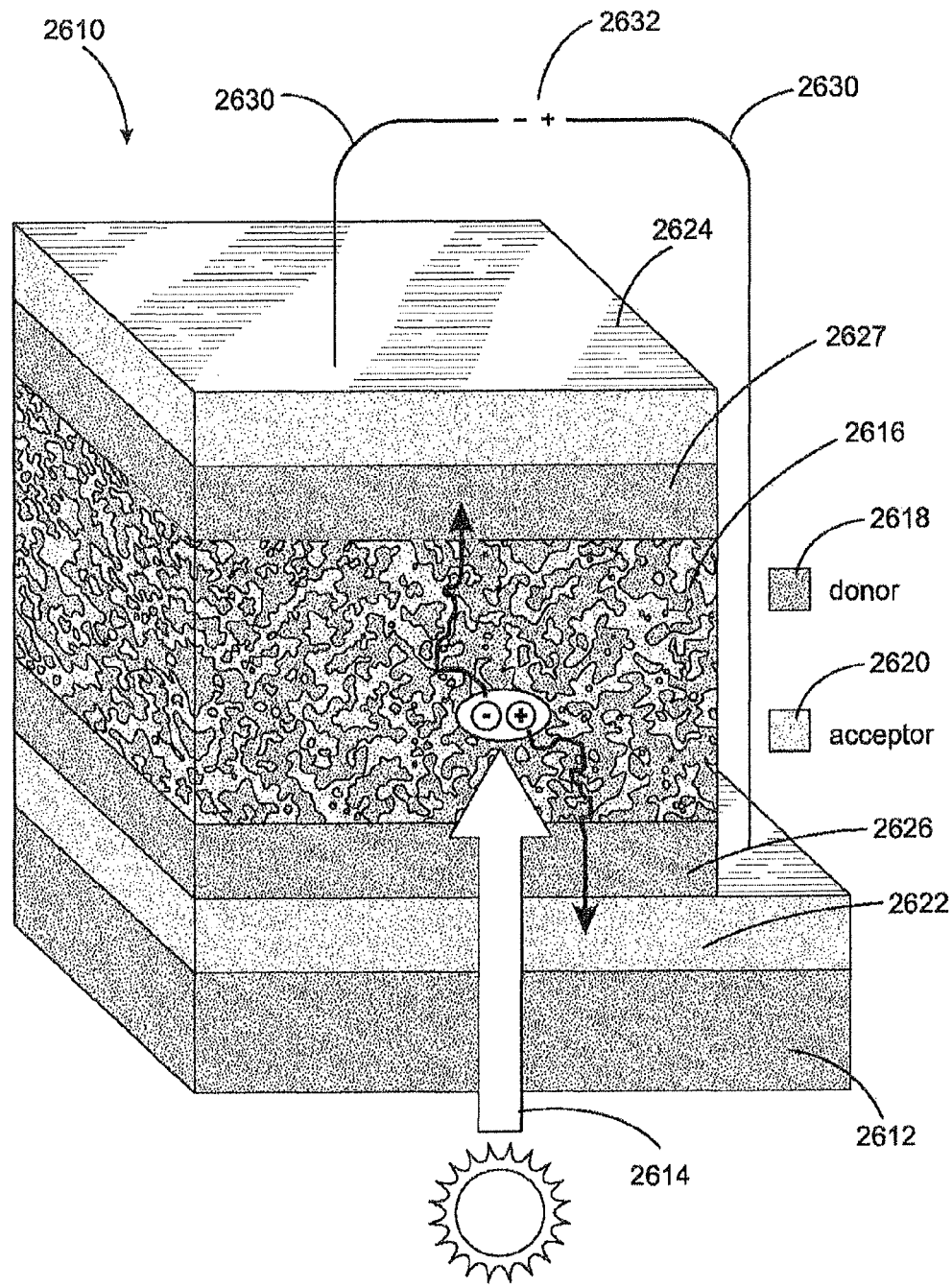
FIG. 24 is a schematic view of a typical photovoltaic cell including an active layer according to some embodiments of the present disclosure.

Some of these PV embodiments may be described by reference to various illustrative depictions of solar cells as shown in FIGS. 14, 22, 24, and 25. For example, referring to FIG. 24, a stylized generic PV cell 2610 is depicted, illustrating the highly interfacial nature of some layers within the PV. The PV 2610 represents a generic architecture applicable to several PV devices, such as DSSC PV embodiments. The PV cell 2610 includes a transparent layer 2612 of glass (or material similarly transparent to solar radiation) which allows solar radiation 2614 to transmit through the layer. The transparent layer of some embodiments may also be referred to as a substrate (e.g., as with substrate layer 1507 of FIG. 14), and it may comprise any one or more of a variety of rigid or flexible materials such as: glass, polyethylene, PET, Kapton, quartz, aluminum foil, gold foil, or steel. The photoactive layer 2616 is composed of electron donor or p-type material 2618 and electron acceptor or n-type material 2620. Photoactive organic compounds according to the present disclosure may be used as either the p- or n-type material or both p- and n-type materials in a single device embodiment. The photoactive layer 2616 is sandwiched between two electrically conductive electrode layers 2622 and 2624. In FIG. 24, the electrode layer 2622 is an ITO material. The electrode layer 2624 is an aluminum material. Other materials may be used as is known in the art. The cell 2610 also includes an interfacial layer (IFL) 2626, shown as a PEDOT:PSS material. The IFL may assist in charge separation. In some embodiments, the IFL 2626 may comprise a photoactive organic compound according to the present disclosure as a self-assembled monolayer (SAM) or as a thin film instead of or in addition to a photoactive organic compound included within the photoactive layer 2616. Photoactive organic compounds deployed in IFLs are discussed in greater detail below. There also may be an IFL 2627 on the aluminum-cathode side of the device. In some embodiments, the IFL 2627 on the aluminum-cathode side of the device may also or instead comprise a photoactive organic compound according to the present disclosure as a self-assembled monolayer (SAM) or as a thin film. An IFL according to some embodiments may be semiconducting in character, and may be either p-type or n-type. In some embodiments, the IFL on the cathode side of the device (e.g., IFL 2627 as shown in FIG. 24) may be p-type, and the IFL on the anode side of the device (e.g., IFL 2626 as shown in FIG. 24) may be n-type. In other embodiments, however, the cathode-side IFL may be n-type and the anode-side IFL may be p-type. The cell 2610 is attached to leads 2630 and a discharge unit 2632, such as a battery. An exemplary PV architecture according to some embodiments may be substantially of the form substrate-anode-IFL-active layer-IFL-cathode, wherein the active layer may comprise a photoactive organic compound of the present disclosure. The active layer of some embodiments may be photoactive, and/or it may include photoactive material. Other layers and materials may be utilized in the cell as is known in the art. Furthermore, it should be noted that the use of the term "active layer" is in no way meant to restrict or otherwise define, explicitly or implicitly, the properties of any other layer—for instance, in some embodiments, either or both IFLs may also be active insofar as they may be semiconducting.

Figure 22:
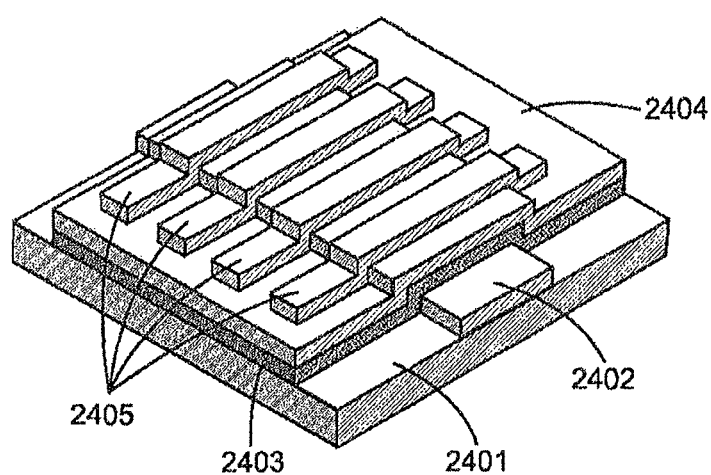
FIG. 22 is an example illustration of BHJ device design according to some embodiments of the present disclosure.

Yet further embodiments may be described by reference to FIG. 22, which depicts a stylized BHJ device design, and includes: glass substrate 2401; ITO (tin-doped indium oxide) electrode 2402; interfacial layer (IFL) 2403; photoactive layer 2404; and LiF/Al cathodes 2405. The materials of BHJ construction referred to are mere examples; any other BHJ construction known in the art may be used consistent with the present disclosure. In some embodiments, a photoactive organic compound of embodiments of the present disclosure may be employed in the photoactive layer 2404 of the BHJ.

Figure 14:
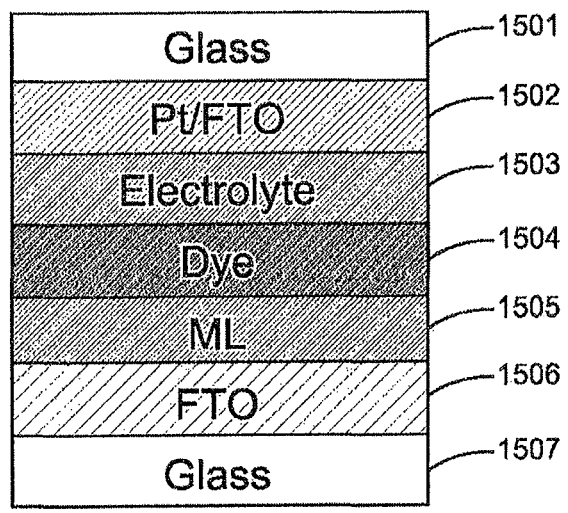
FIG. 14 is an illustration of DSSC design depicting various layers of the DSSC according to some embodiments of the present disclosure.
Figure 15:
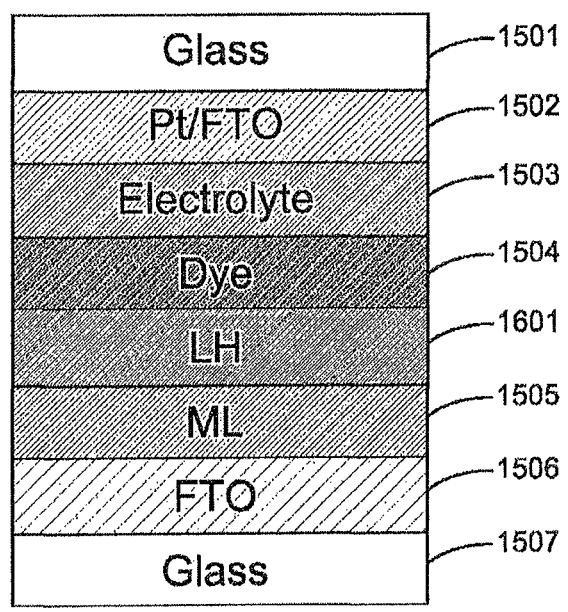
FIG. 15 is another illustration of DSSC design depicting various layers of the DSSC according to some embodiments of the present disclosure.
Figure 16:
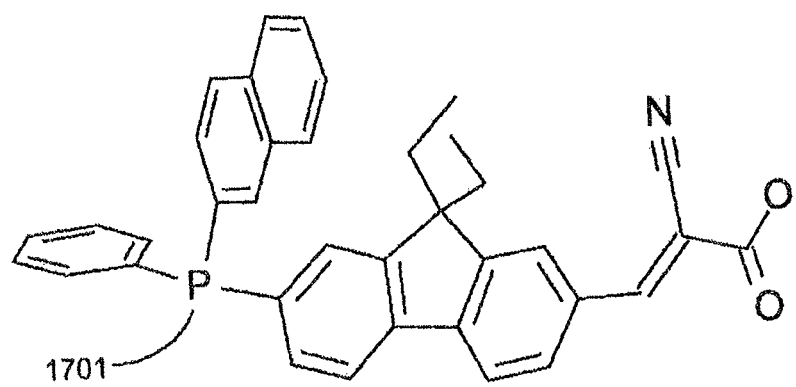
FIG. 16 is a chemical structure for (E)-2-cyano-3-[9,9-diethyl-7-[2-naphthyl(phenyl)phosphanyl]fluoren-2-yl]prop-2-enoic acid according to some embodiments of the present disclosure.
Figure 17:
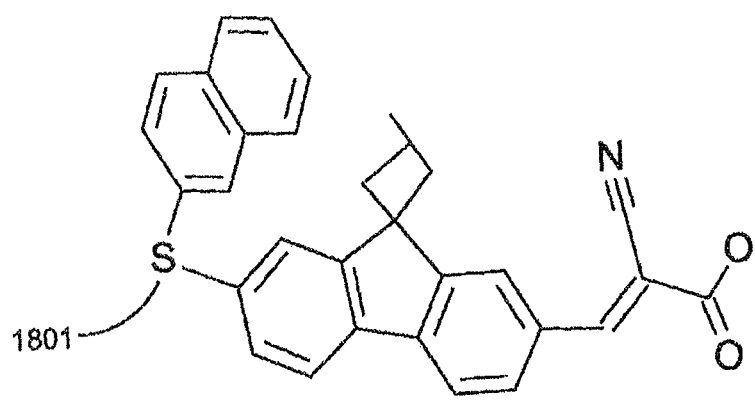
FIG. 17 is a chemical structure for (E)-2-cyano-3-[9,9-diethyl-7-(2-naphthylsulfanyl)fluoren-2-yl]prop-2-enoic acid according to some embodiments of the present disclosure.

FIG. 14 is a simplified illustration of DSSC PVs according to some embodiments, referred to here for purposes of illustrating assembly of such example PVs. In the DSSC depicted as stylized in FIG. 14, the dye 1504 may in some embodiments comprise a photoactive organic compound such as those of embodiments of the present disclosure. Thus, an example DSSC as shown in FIG. 14 may be constructed according to the following: electrode layer 1506 (shown as fluorine-doped tin oxide, FTO) is deposited on a substrate layer 1507 (shown as glass). Mesoporous layer ML 1505 (which may in some embodiments be $TiO_2$) is deposited onto the electrode layer 1506, then the photoelectrode (so far comprising substrate layer 1507, electrode layer 1506, and mesoporous layer 1505) is soaked in a solvent (not shown) and dye 1504 comprising a photoactive organic compound of the present disclosure. This leaves the dye 1504 bound to the surface of the ML. A separate counter-electrode is made comprising substrate layer 1501 (also shown as glass) and electrode layer 1502 (shown as Pt/FTO). The photoelectrode and counter-electrode are combined, sandwiching the various layers 1502-1506 between the two substrate layers 1501 and 1507 as shown in FIG. 14, and allowing electrode layers 1502 and 1506 to be utilized as a cathode and anode, respectively. A layer of electrolyte 1503 is deposited either directly onto the completed photoelectrode after dye layer 1504 or through an opening in the device, typically a hole pre-drilled by sandblasting in the counter-electrode substrate 1501. The cell may also be attached to leads and a discharge unit, such as a battery (not shown). Substrate layer 1507 and electrode layer 1506, and/or substrate layer 1501 and electrode layer 1502 should be of sufficient transparency to permit solar radiation to pass through to the photoactive dye 1504. In some embodiments, the counter-electrode and/or photoelectrode may be rigid, while in others either or both may be flexible. The substrate layers of various embodiments may comprise any one or more of: glass, polyethylene, PET, Kapton, quartz, aluminum foil, gold foil, and steel. In certain embodiments, a DSSC may further include a light harvesting layer 1601, as shown in FIG. 15, to scatter incident light in order to increase the light's path length through the photoactive layer of the device (thereby increasing the likelihood the light is absorbed in the photoactive layer).

Figure 23:
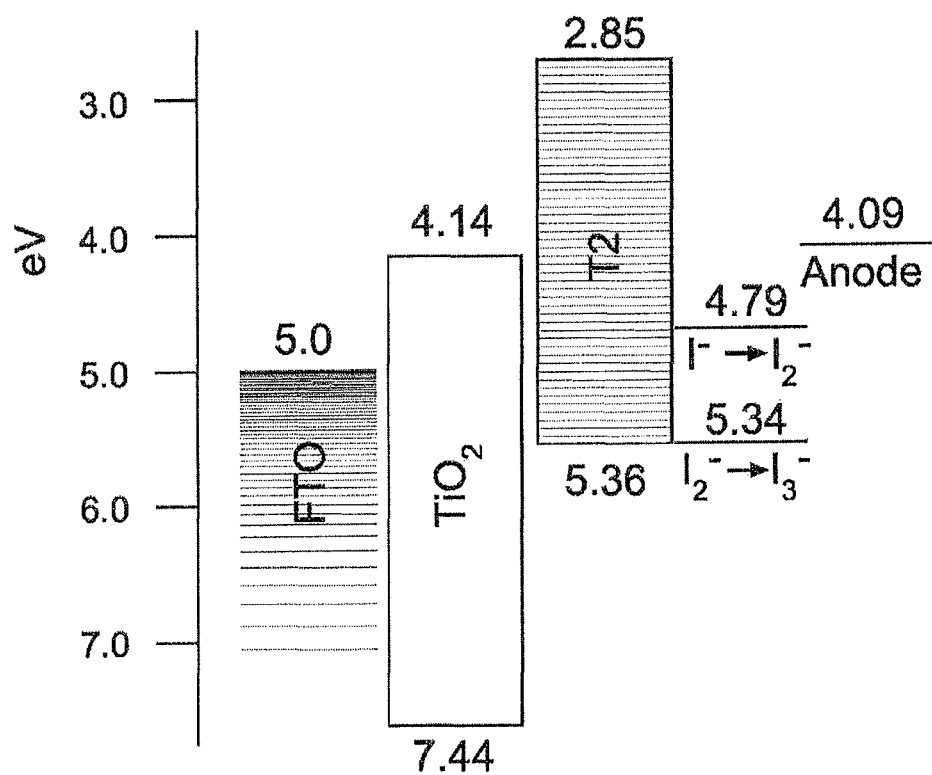
FIG. 23 is a representation of relative energy levels in eV of various components of an exemplar DSSC system that uses an iodide electrolyte according to some embodiments of the present disclosure. The data of FIG. 23 is derived from empirical results such as cyclic voltammetry or ultraviolet photoelectron spectroscopy.
Figure 26:
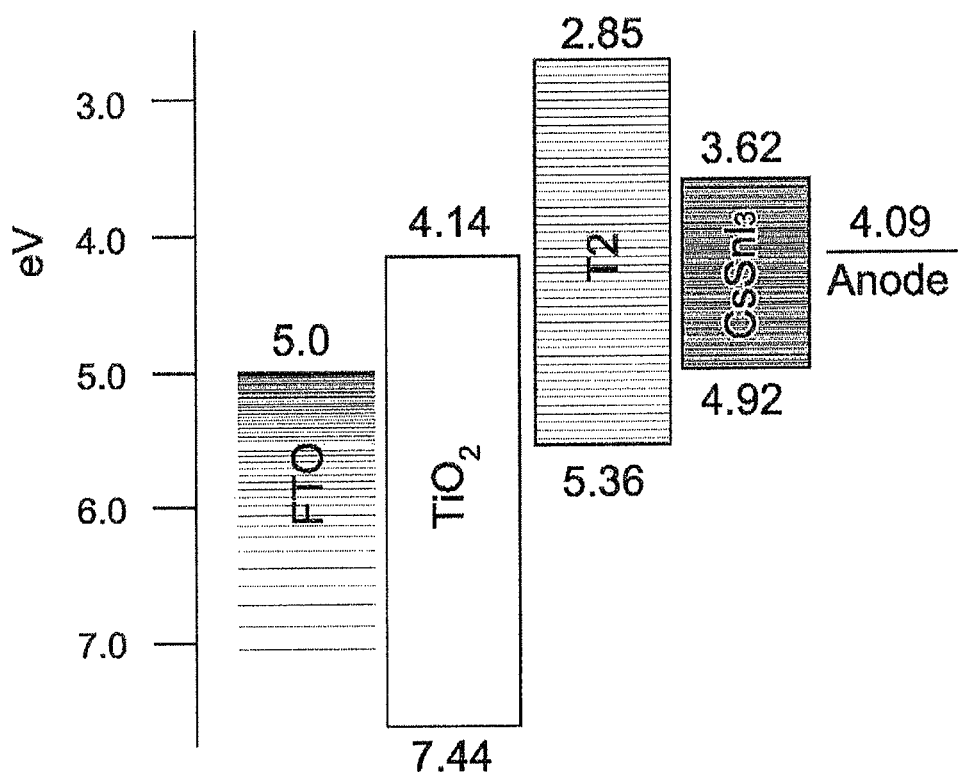
FIG. 26 is a representation of relative energy levels in eV of various components of an exemplar solid state DSSC system that uses a solid-state layer in accordance with some embodiments of the present disclosure. The data of FIG. 26 is derived from empirical results such as cyclic voltammetry or ultraviolet photoelectron spectroscopy.
Figure 27:
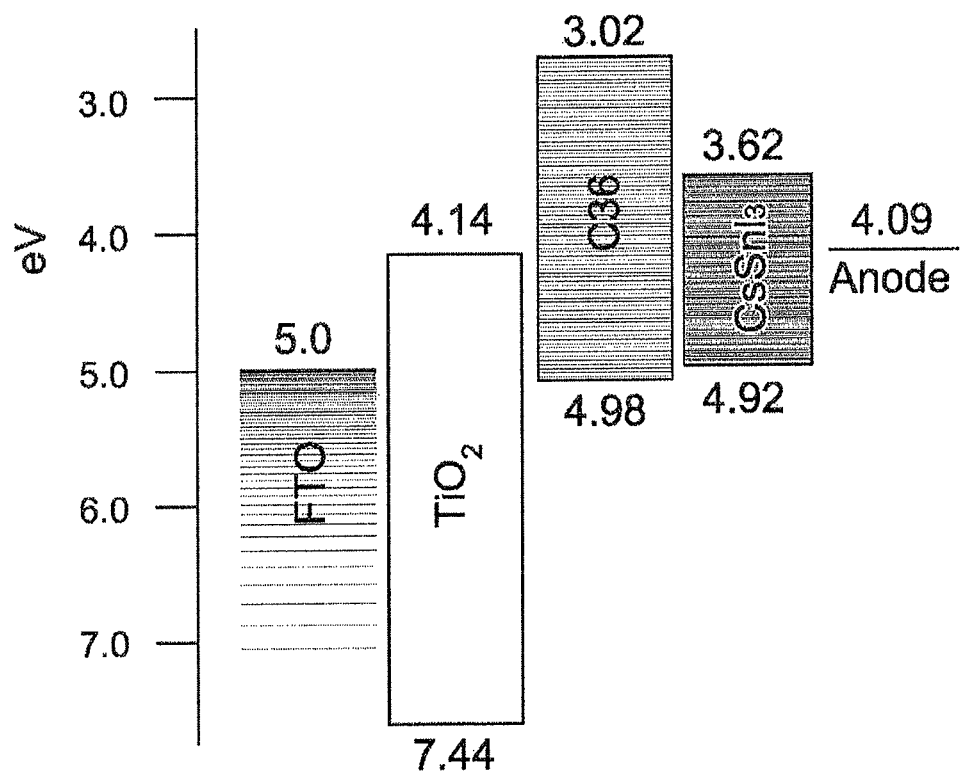
FIG. 27 is a representation of relative energy levels in eV of various components of another exemplar solid state DSSC system that uses a solid-state layer in accordance with some embodiments of the present disclosure. The data of FIG. 27 is derived from empirical results such as cyclic voltammetry or ultraviolet photoelectron spectroscopy.

In other embodiments, the present disclosure provides solid state DSSCs. In some embodiments, the solid state DSSCs may comprise photoactive organic compounds according to some embodiments of the present disclosure. Employing a photoactive organic compound according to embodiments of the present disclosure in a solid state DSSC may, in some embodiments, significantly expand the freedom to design the photoactive composition. For instance, in some embodiments, a solid-state layer may advantageously permit a photoactive composition to obtain a shallower HOMO energy level while still maintaining electrical conductivity between the solid-state layer and the photoactive composition. FIG. 26 is a representation of relative energy levels in eV of various components of an exemplar solid state DSSC system that uses a solid-state layer (comprising in this example $CsSnI_3$). The data shown in FIG. 26 were derived from empirical results such as cyclic voltammetry or ultraviolet photoelectron spectroscopy. Comparison between FIG. 26 and FIG. 23 shows that the exemplar solid state DSSC of FIG. 26 uses the $CsSnI_3$ in place of the iodide electrolyte of FIG. 23. FIG. 26 shows the shallower HOMO energy level permitted by use of $CsSnI_3$ (4.92 eV as compared to the 5.34 eV value of iodide electrolyte reduction $I_2^- \rightarrow I_3^-$). That is, the photoactive compound T2 of FIG. 26 could be altered so as to achieve a shallower HOMO, unlike the photoactive compound T2 of FIG. 23, where the relatively deeper eV value of the iodide electrolyte reduction $I_2^- \rightarrow I_3^-$ provides an upper limit on the HOMO energy level of the photoactive compound T2, as explained previously. Alternatively, in other embodiments, a different photoactive compound consistent with the present disclosure may be used, wherein the different photoactive compound has a shallower HOMO energy level. For example, FIG. 27 shows a different photoactive compound C36 with a much shallower HOMO (4.98 eV) advantageously employed in the DSSC of this embodiment using a $CsSnI_3$ solid-state layer. The data shown in FIG. 27 were derived from empirical results such as cyclic voltammetry or ultraviolet photoelectron spectroscopy. FIG. 28A shows the structure of C36, which is (E)-2-cyano-3-[6-[9,9-diethyl-7-(4-methoxy-N-(4-methoxyphenyl)anilino)fluoren-2-yl]benzothiophen-2-yl]prop-2-enoic acid.

Solid-state DSSCs according to some embodiments may provide additional advantages. For instance, a solid-state DSSC may not experience leakage and/or corrosion issues that affect DSSCs comprising liquid electrolytes. Furthermore, a solid-state charge carrier may provide faster device physics (e.g., faster charge transport). Additionally, solid-state electrolytes may, in some embodiments, be photoactive and therefore contribute to power derived from a solid-state DSSC device.

Some examples of solid state DSSCs may be described by reference to FIG. 25, which is a stylized schematic of a typical solid state DSSC. As with the example solar cell depicted in, e.g., FIG. 24, an active layer comprised of first and second active (e.g., conducting and/or semi-conducting) material (2810 and 2815, respectively) is sandwiched between electrodes 2805 and 2820 (shown in FIG. 25 as Pt/FTO and FTO, respectively). In the embodiment shown in FIG. 25, the first active material 2810 is p-type active material, and comprises a solid electrolyte (otherwise known as a hole-transport material); the second active material 2815 is n-type active material and comprises $TiO_2$ coated with a dye. The dye may comprise a photoactive organic compound of the present disclosure. The second active material 2815 of some embodiments may constitute a mesoporous layer. Furthermore, in addition to being active, either or both of the first and second active materials 2810 and 2815 may be photoactive. In other embodiments (not shown in FIG. 25), the second active material may comprise a solid electrolyte. In addition, in embodiments where either of the first and second active material 2810 and 2815 comprise a solid electrolyte, the PV device may lack an effective amount of liquid electrolyte. Substrate layers 2801 and 2825 (both shown in FIG. 25 as glass) form the respective external top and bottom layers of the exemplar cell of FIG. 25. These layers may comprise any material of sufficient transparency to permit solar radiation to pass through to the active/photoactive layer comprising dye, first and second active and/or photoactive material 2810 and 2815, such as glass, polyethylene, PET, Kapton, quartz, aluminum foil, gold foil, and/or steel. Furthermore, in the embodiment shown in FIG. 25, electrode 2805 (shown as Pt/FTO) is the cathode, and electrode 2820 is the anode. As with the exemplar solar cell depicted in FIG. 24, solar radiation passes through substrate layer 2825 and electrode 2820 into the active layer, whereupon at least a portion of the solar radiation is absorbed so as to produce one or more excitons to enable electrical generation.

A solid state DSSC according to some embodiments may be constructed in a substantially similar manner to that described above with respect to the DSSC depicted as stylized in FIG. 14. In the embodiment shown in FIG. 25, p-type active material 2810 corresponds to electrolyte 1503 of FIG. 14; n-type active material 2815 corresponds to both dye 1504 and ML 1505 of FIG. 14; electrodes 2805 and 2820 respectively correspond to electrode layers 1502 and 1506 of FIG. 14; and substrate layers 2801 and 2825 respectively correspond to substrate layers 1501 and 1507.

In addition to incorporating photoactive organic compounds according to some embodiments, various embodiments of the present disclosure furthermore provide other improved materials and/or designs in various aspects of solar cell and other devices such as those discussed in the foregoing paragraphs. These improved materials and/or designs may be incorporated with or without additional inclusion of the photoactive organic compounds according to various embodiments of this disclosure. Improved materials and designs, discussed in more detail below, relate to, among other things, active materials (including hole-transport and/or electron-transport layers), interfacial layers, and overall device design.

Active Materials

As noted above, the first active material 2810 (which in FIG. 25 is, again, p-type) may in some embodiments comprise a solid electrolyte. In certain embodiments, the first active material 2810 may comprise an organic material such as spiro-OMeTAD and/or poly(3-hexylthiophene), an inorganic binary, ternary, quaternary, or greater complex, any solid semiconducting material, or any combination thereof. In some embodiments, the first active material may additionally or instead comprise an oxide such as a copper-oxide compound (as already noted), and/or a sulfide, and/or a selenide, and/or an iodide (e.g., $CsSnI_3$). Thus, for example, the first active material of some embodiments may comprise solid-state p-type material, which may comprise copper indium sulfide, and in some embodiments, it may comprise copper indium gallium selenide. In addition, as previously noted, the first active material may in some embodiments be photoactive (e.g., able to contribute to power derived from the DSSC). Furthermore, although shown and referred to in FIG. 25 as being p-type, a solid state layer (e.g., first active material comprising solid electrolyte) may in some embodiments instead be n-type semiconducting. In such embodiments, then, the second active material (e.g., $TiO_2$ (or other mesoporous material) as shown in FIG. 25) coated with a dye may be p-type semiconducting (as opposed to the n-type semiconducting shown in, and discussed with respect to, FIG. 25).

A copper-oxide compound may be referred to in the shorthand herein as $Cu_2O$ and/or cuprous oxide. Although so labeled, such references are not intended to limit the ratio of copper and oxygen of the various copper oxide compounds according to various embodiments. Some embodiments may instead or in addition include various stoichiometric ratios of copper and oxygen, which may be stoichiometric and/or non-stoichiometric. For example, a copper oxide compound according to some embodiments may comprise copper having any one or more oxidation states (e.g., copper 0, copper I, copper II, and mixtures thereof). The ratios of copper and oxide in such compounds would therefore depend upon the oxidation state(s) of the copper atoms present. Thus, some embodiments may include any one or more copper-oxide compounds, each having a ratio of $Cu_xO_y$. In such embodiments, x may be any value, integer or non-integer, between 1 and 100. In some embodiments, x may be between approximately 1 and 3 (and, again, need not be an integer). Likewise, y may be any value, integer or non-integer, between 0.1 and 100. In some embodiments, y may be between approximately 0.1 and 2 (and, again, need not be an integer). Thus, for example, although embodiments discussed herein may include $Cu_2O$ (e.g., x=2 and y=1), other embodiments may instead or in addition include any of $Cu_{2.1}O_{0.9}$, $CuO$, $Cu_3O_{0.1}$, $Cu_{47}O_{23.5}$, and any other ratio in accordance with the foregoing.

Similarly, references in some exemplar embodiments herein to $CsSnI_3$ are not intended to limit the ratios of component elements in the cesium-tin-iodine compounds according to various embodiments. Some embodiments may include stoichiometric and/or non-stoichiometric amounts of tin and iodide, and thus such embodiments may instead or in addition include various ratios of cesium, tin, and iodine, such as any one or more cesium-tin-iodine compounds, each having a ratio of $Cs_xSn_yI_z$. In such embodiments, x may be any value, integer or non-integer, between 0.1 and 100. In some embodiments, x may be between approximately 0.5 and 1.5 (and, again, need not be an integer). Likewise, y may be any value, integer or non-integer, between 0.1 and 100. In some embodiments, y may be between approximately 0.5 and 1.5 (and, again, need not be an integer). Likewise, z may be any value, integer or non-integer, between 0.1 and 100. In some embodiments, z may be between approximately 2.5 and 3.5. Additionally $CsSnI_3$ can be doped or compounded with other materials, such as $SnF_2$, in ratios of $CsSnI_3$:$SnF_2$ ranging from 0.1:1 to 100:1, including all values (integer and non-integer) in between.

Furthermore, references herein to $TiO_2$ and/or titania are likewise not intended to limit the ratios of tin and oxide in such tin-oxide compounds described herein. That is, a titania compound may comprise titanium in any one or more of its various oxidation states (e.g., titanium I, titanium II, titanium III, titanium IV), and thus various embodiments may include stoichiometric and/or non-stoichiometric amounts of titanium and oxide. Thus, various embodiments may include (instead or in addition to $TiO_2$) $Ti_xO_y$, where x may be any value, integer or non-integer, between 1 and 100. In some embodiments, x may be between approximately 0.5 and 3. Likewise, y may be between approximately 1.5 and 4 (and, again, need not be an integer). Thus, some embodiments may include, e.g., $TiO_2$ and/or $Ti_2O_3$. In addition, titania in whatever ratios or combination of ratios between titanium and oxide may be of any one or more crystal structures in some embodiments, including any one or more of anatase, rutile, and amorphous.

Figure 29:
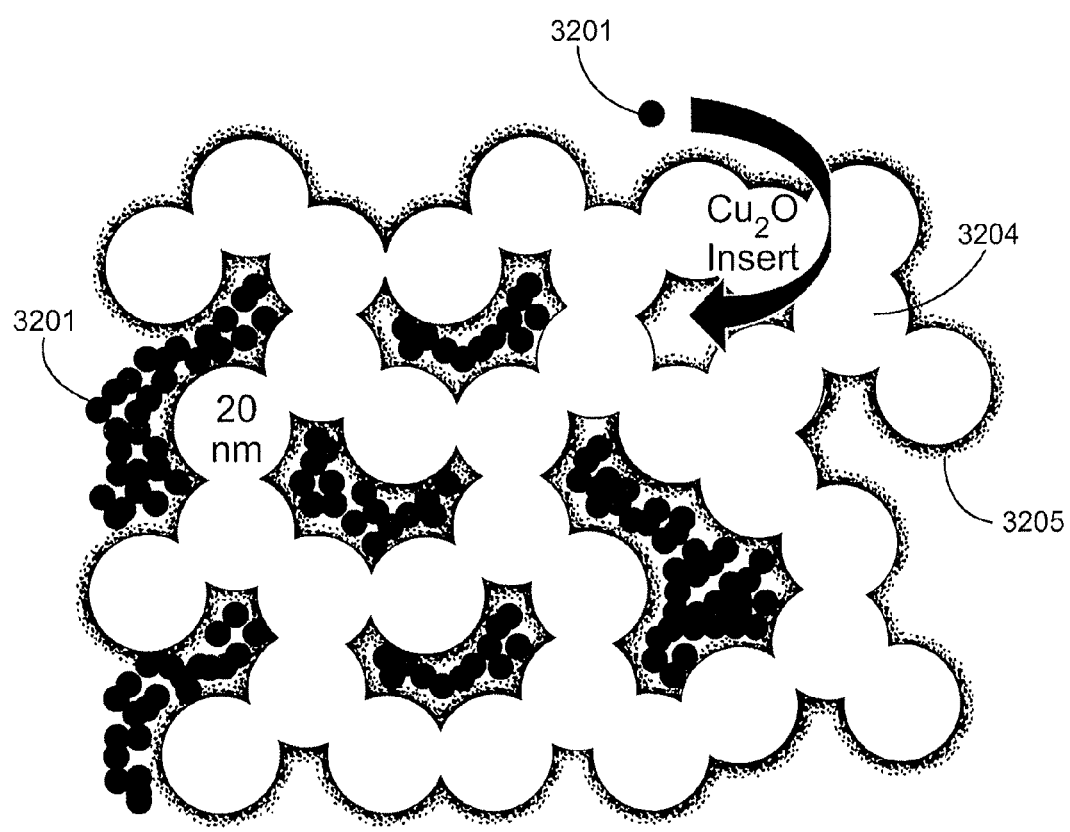
FIG. 29 is a depiction of interspersion of nanoparticles of p-type semiconducting material within a photovoltaic cell, according to some embodiments of the present disclosure.

Returning to active materials, in some embodiments, the first active material (e.g., first active material 2810) may comprise nanoparticles (e.g., $Cu_2O$ nanoparticles and/or $CsSnI_3$ nanoparticles and/or copper indium sulfide nanoparticles). In some embodiments, the nanoparticles may be 50 nm or less in diameter (assuming spherical approximation, although the nanoparticles of some embodiments may not necessarily be spherical). In other embodiments, the nanoparticles' diameters may be 20 nm or less, 10 nm or less, or 5 nm or less, respectively. The first active material nanoparticles of some embodiments may be interposed, interpenetrating, or otherwise inserted within or among the second active material (e.g., within or among a mesoporous layer comprising the second active material). For example, referring to FIG. 29, one or more p-type active nanoparticles 3201 (shown as $Cu_2O$ nanoparticles in FIG. 29) may be interposed among a $TiO_2$ matrix 3204 (or other second active material) coated with a dye 3205. As shown in FIG. 29, the second active material mesoporous layer comprises $TiO_2$ particles 3204 of approximately 20 nm diameter in a matrix.

Nanoparticles of $Cu_2O$ as shown in FIG. 29 may be prepared, for example, by making a suspension of $Cu_2O$ nanoparticles via reaction of a Cu(I) starting material (e.g., cuprous acetate, or any other starting material wherein Cu(I) would disassociate from that material) with an amine (e.g., propylamine, or any other reactive amine) in aqueous solution. As noted, although referred to in FIG. 29 as p-type active nanoparticles 3201, in some embodiments the active nanoparticles 3201 may instead be n-type (and the $TiO_2$ matrix or other mesoporous layer material may be n-type or p-type).

Active material such as a p-type active copper-oxide compound may, as noted, be incorporated into a PV along with a photoactive organic compound according to some embodiments. However, in particular embodiments, a copper-oxide or other improved active material may be incorporated with any other dye, including conventional dyes. For example, $Cu_2O$ nanoparticles may be employed with any adsorbed dye known in the art (e.g., N719, N3, which may be colloquially referred to as "black dye") in order to realize performance gains over the otherwise identical DSSCs without a p-type active material according to some embodiments of the present disclosure. In other embodiments, performance improvements may be realized without the use of any dye, e.g., a device containing only $Cu_2O$ and $TiO_2$ nanoparticles as the active layer.

Nonetheless, in other embodiments, various advantages (e.g., performance improvements, cost reduction, and/or efficiency gains) may result from inclusion of both a semi-conducting active material of some embodiments and a photoactive organic compound of some embodiments.

In some embodiments of solid-state DSSCs, the second active material (again, shown as n-type $TiO_2$ 2815 in FIG. 25) may likewise comprise an organic material such as spiro-OMeTAD, an inorganic binary, ternary, quaternary, or greater complex, or any combination thereof. In some embodiments, the second active material may comprise an oxide such as alumina and/or cuprous oxide; and/or it may comprise a sulfide; and/or it may comprise a selenide. Thus, in some embodiments, the second active material may comprise copper indium sulfide, and in some embodiments, it may comprise copper indium gallium selenide metal.

Although frequently referenced in the context of DSSC active materials (such as first and second active material 2810 and 2815), in some embodiments, any PV or other like device may include an active layer according to any one or more of the compositions and/or architectures discussed above.

Interfacial Layers

The present disclosure further provides advantageous materials and designs of one or more interfacial layers within a PV, including: interfacial layers comprising photoactive organic compounds according to aspects of the present disclosure; thin-coat IFLs; and treated asphaltene IFLs. Any one or more of the foregoing may be employed in one or more IFLs of a PV according to various embodiments, and each is discussed in greater detail below.

First, as previously noted, one or more IFLs (e.g., either or both IFLs 2626 and 2627 as shown in FIG. 24) may comprise a photoactive organic compound of the present disclosure as a self-assembled monolayer (SAM) or as a thin film. When a photoactive organic compound of the present disclosure is applied as a SAM, it may comprise a binding group through which it may be covalently or otherwise bound to the surface of either or both of the anode and cathode. The binding group of some embodiments may comprise any one or more of COOH, $SiX_3$ (where X may be any moiety suitable for forming a ternary silicon compound, such as $Si(OR)_3$ and $SiCl_3$), $SO_3$, $PO_4H$, OH, $CH_2X$ (where X may comprise a Group 17 halide), and O. The binding group may be covalently or otherwise bound to an electron-withdrawing moiety, an electron donor moiety, and/or a core moiety. The binding group may attach to the electrode surface in a manner so as to form a directional, organized layer of a single molecule (or, in some embodiments, multiple molecules) in thickness (e.g., where multiple photoactive organic compounds are bound to the anode and/or cathode). As noted, the SAM may attach via covalent interactions, but in some embodiments it may attach via ionic, hydrogen-bonding, and/or dispersion force (i,e., Van Der Waals) interactions. Furthermore, in certain embodiments, upon light exposure, the SAM may enter into a zwitterionic excited state, thereby creating a highly-polarized IFL, which may direct charge carriers from an active layer into an electrode (e.g., either the anode or cathode). This enhanced charge-carrier injection may, in some embodiments, be accomplished by electronically poling the cross-section of the active layer and therefore increasing charge-carrier drift velocities towards their respective electrode (e.g., hole to anode; electrons to cathode). Molecules for anode applications of some embodiments may comprise tunable compounds that include a primary electron donor moiety bound to a core moiety, which in turn is bound to an electron-withdrawing moiety, which in turn is bound to a binding group. In cathode applications according to some embodiments, IFL molecules may comprise a tunable compound comprising an electron poor moiety bound to a core moiety, which in turn is bound to an electron donor moiety, which in turn is bound to a binding group. When a photoactive organic compound is employed as an IFL according to such embodiments, it may retain photoactive character, although in some embodiments it need not be photoactive.

Figure 25:
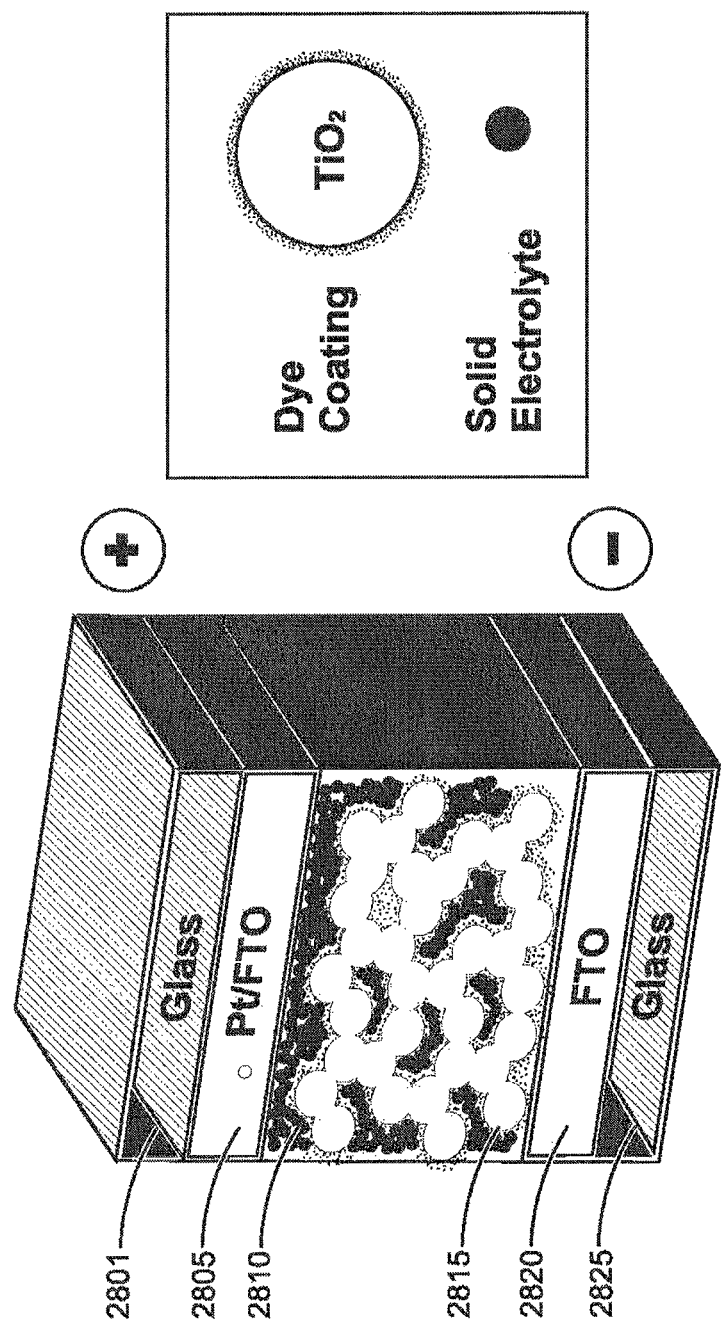
FIG. 25 is a schematic of a solid state DSSC device according to some embodiments of the present disclosure.

In addition or instead of a photoactive organic compound SAM IFL, a PV according to some embodiments may include a thin interfacial layer (a "thin-coat interfacial layer" or "thin-coat IFL") coated onto at least a portion of either the first or the second active material of such embodiments (e.g., first or second active material 2810 or 2815 as shown in FIG. 25). And, in turn, at least a portion of the thin-coat IFL may be coated with a dye. The thin-coat IFL may be either n- or p-type; in some embodiments, it may be of the same type as the underlying material (e.g., $TiO_2$ or other mesoporous material, such as $TiO_2$ of second active material 2815). The second active material may comprise $TiO_2$ coated with a thin-coat IFL comprising alumina (e.g., $Al_2O_3$) (not shown in FIG. 25), which in turn is coated with a dye. Other exemplar metal oxides for use in the thin-coat IFL of some embodiments may include semiconducting metal oxides, such as NiO, $WO_3$, $V_2O_5$, or $MoO_3$. The exemplar embodiment wherein the second (e.g., n-type) active material comprises $TiO_2$ coated with a thin-coat IFL comprising $Al_2O_3$ could be formed, for example, with a precursor material such as $Al(NO_3)_3 \cdot xH_2O$, or any other material suitable for depositing $Al_2O_3$ onto the $TiO_2$, followed by thermal annealing and dye coating. In example embodiments wherein a $MoO_3$ coating is instead used, the coating may be formed with a precursor material such as $Na_2Mo_4 \cdot 2H_2O$; whereas a $V_2O_5$ coating according to some embodiments may be formed with a precursor material such as $NaVO_3$; and a $WO_3$ coating according to some embodiments may be formed with a precursor material such as $NaWO_4 \cdot H_2O$. The concentration of precursor material (e.g., $Al(NO_3)_3 \cdot xH_2O$) may affect the final film thickness (here, of $Al_2O_3$) deposited on the $TiO_2$ or other active material. Thus, modifying the concentration of precursor material may be a method by which the final film thickness may be controlled. For example, greater film thickness may result from greater precursor material concentration. Greater film thickness may not necessarily result in greater PCE in a PV device comprising a metal oxide coating. Thus, a method of some embodiments may include coating a $TiO_2$ (or other mesoporous) layer using a precursor material having a concentration in the range of approximately 0.5 to 10.0 mM; other embodiments may include coating the layer with a precursor material having a concentration in the range of approximately 2.0 to 6.0 mM; or, in other embodiments, approximately 2.5 to 5.5 mM.

Furthermore, although referred to herein as $Al_2O_3$ and/or alumina, it should be noted that various ratios of aluminum and oxygen may be used in forming alumina. Thus, although some embodiments discussed herein are described with reference to $Al_2O_3$, such description is not intended to define a required ratio of aluminum in oxygen. Rather, embodiments may include any one or more aluminum-oxide compounds, each having an aluminum oxide ratio according to $Al_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $Al_xO_y$ may be present in various embodiments, such as alpha, gamma, and/or amorphous forms of alumina.

Likewise, although referred to herein as $MoO_3$, $WO_3$, and $V_2O_5$, such compounds may instead or in addition be represented as $Mo_xO_y$, $W_xO_y$, and $V_xO_y$, respectively. Regarding each of $Mo_xO_y$ and $W_xO_y$, x may be any value, integer or non-integer, between approximately 0.5 and 100; in some embodiments, it may be between approximately 0.5 and 1.5. Likewise, y may be any value, integer or non-integer, between approximately 1 and 100. In some embodiments, y may be any value between approximately 1 and 4. Regarding $V_xO_y$, x may be any value, integer or non-integer, between approximately 0.5 and 100; in some embodiments, it may be between approximately 0.5 and 1.5. Likewise, y may be any value, integer or non-integer, between approximately 1 and 100; in certain embodiments, it may be an integer or non-integer value between approximately 1 and 10.

In addition, a thin-coat IFL may comprise a bilayer. Thus, returning to the example wherein the thin-coat IFL comprises a metal-oxide (such as alumina), the thin-coat IFL may comprise $TiO_2$-plus-metal-oxide. Such a thin-coat IFL may have a greater ability to resist charge recombination as compared to mesoporous $TiO_2$ or other active material alone. Furthermore, in forming a $TiO_2$ layer, a secondary $TiO_2$ coating is often necessary in order to provide sufficient physical interconnection of $TiO_2$ particles, according to some embodiments of the present disclosure. Coating a bilayer thin-coat IFL onto mesoporous $TiO_2$ (or other mesoporous active material) may comprise a combination of coating using a compound comprising both metal oxide and $TiCl_4$, resulting in an bilayer thin-coat IFL comprising a combination of metal-oxide and secondary $TiO_2$ coating, which may provide performance improvements over use of either material on its own. For instance, as shown in Table 1, coating a mesoporous layer included in a conventional DSSC device (i.e., one using a liquid electrolyte and common dye N719) with a bilayer thin-coat IFL consisting of depositing a $TiO_2$ thin film followed by heating (denoted in Table 1 as $TiCl_4$—H) and then depositing an $Al_2O_3$ thin film followed by further heating (denoted as Alumina-H) results in an improved PCE of 7.9. Use of metal oxide and other thin-coat IFLs in embodiments other than those comprising solid-state DSSCs with dyes that include a photoactive organic compound are discussed infra. In the context of embodiments employing a dye comprising a photoactive organic compound, and/or a solid-state DSSC of embodiments of the present disclosure, one of ordinary skill in the art would expect similar improvement to that shown in Table 1 for more conventional liquid electrolyte DSSCs.

TABLE 1

| Coating | $V_{OC}$ (V) | $J_{SC}$ (mA/cm$^2$) | FF (%) | PCE (%) |
|---|---|---|---|---|
| No coating | 0.73 | 7.77 | 66.0 | 4.50 |
| Alumina | 0.73 | 5.90 | 72.60 | 3.80 |
| $TiCl_4$ | 0.74 | 13.50 | 60.00 | 7.20 |
| $TiCl_4$ + Alumina | 0.76 | 10.40 | 67.00 | 6.40 |
| $TiCl_4$—H + Alumina-H | 0.77 | 12.00 | 70.10 | 7.90 |

Figure 30:
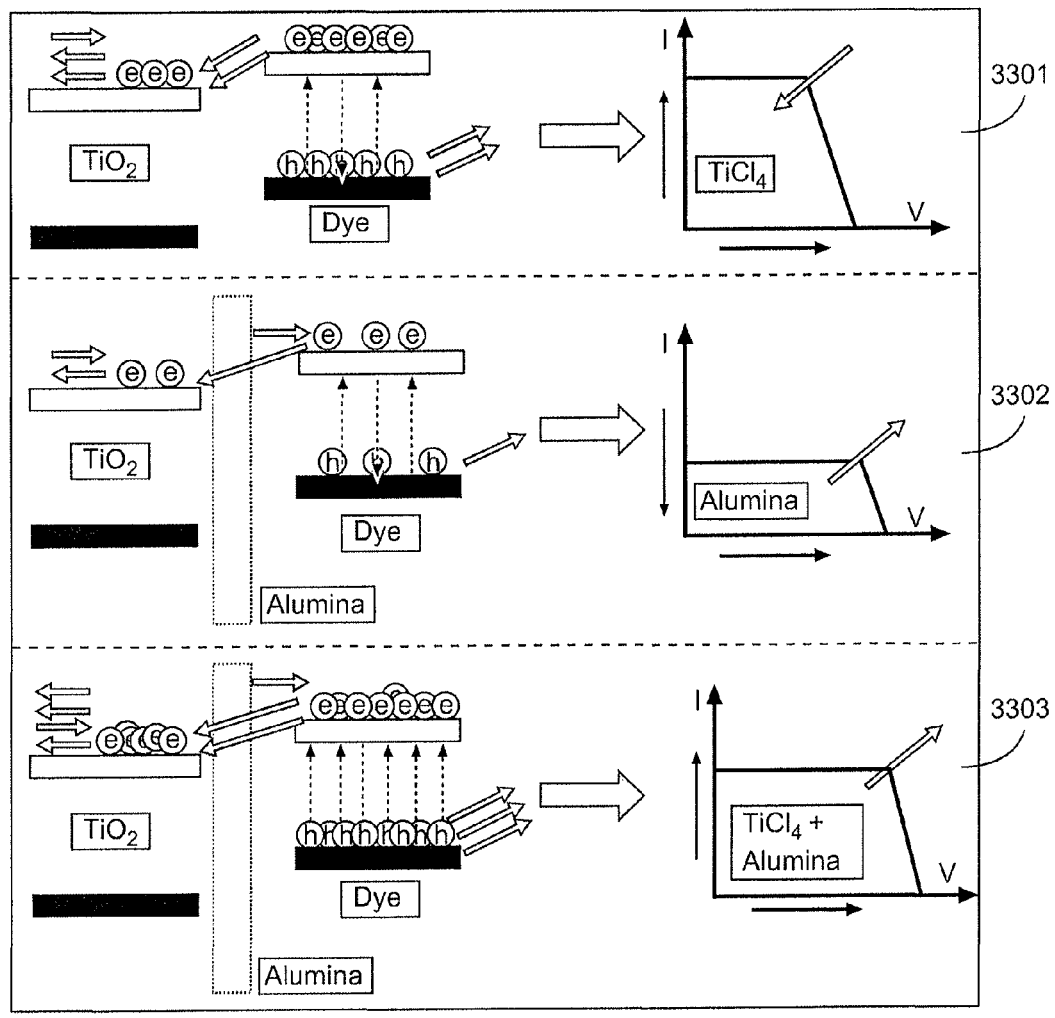
FIG. 30 is a depiction of differences in resistance to charge recombination effects in various PVs according to some embodiments of the present disclosure.

Furthermore, some advantages of a bilayer thin-coat IFL according to some embodiments, including some of the advantages discussed above, may be shown by reference to FIG. 30. FIG. 30 is a series of three stylizations that depict differences in resistance of charge recombination in three architectures 3301, 3302, and 3303 as follows: (3301) $TiO_2$ coated with a dye in the absence of a metal oxide interfacial layer; (3302) $TiO_2$ coated with alumina as previously described for some embodiments; and (3303) $TiO_2$ coated with a thin-film bilayer of $TiO_2$ and $Al_2O_3$ in the architecture meso-$TiO_2$/$TiO_2$/$Al_2O_3$). In a DSSC device according to the architecture depicted in 3301, a $TiO_2$ mesoporous layer is further coated with a $TiO_2$ thin film, followed by thermal annealing, to allow for continuous contact between individual $TiO_2$ nanoparticles. In this scenario, electron back-injection is possible where electrons contained within $TiO_2$ may recombine with oxidized dye molecules, annihilating a charge carrier pair and reducing $V_{oc}$ values as shown in the chart associated with first architecture 3301. When $Al_2O_3$ replaces $TiO_2$ in the thin film (architecture 3302), an effective interfacial layer for preventing charge recombination may be formed, thereby resulting in enhanced $V_{oc}$ values as shown in the chart associated with architecture 3302; however, $Al_2O_3$ alone may form a resistive interface preventing conductive electron collection, which would thereby result in reduced $I_{sc}$ values as shown in the chart associated with architecture 3302. In the final depicted architecture (3303), a $TiO_2$ mesolayer is coated with a $TiO_2$ thin film followed by thermal annealing, and then a second interfacial layer of $Al_2O_3$ is applied to the underlying $TiO_2$ interfacial layer, forming a $TiO_2$/Alumina bilayer. In doing so, charge recombination may be prevented, but this may form a layer less resistive to charge collection. The final result is enhanced $V_{oc}$ values with minimal $I_{sc}$ losses (as shown in the chart associated with architecture 3303), as compared to a DSSC device of either of the previously discussed architectures 3301 and 3302, as well as greater shunt resistance ($R_{sh}$) with minimal increases in series resistance ($R_s$).

The thin-coat IFLs and methods of coating them onto $TiO_2$ previously discussed may, in some embodiments, be employed in DSSCs comprising liquid electrolytes (as alluded to in Table 1 above). Thus, returning to the example of a thin-coat IFL and referring back to FIG. 14 for an example, the DSSC of FIG. 14 could further comprise a thin-coat IFL as described above coated onto the mesoporous layer 1505 (that is, the thin-coat IFL would be inserted between mesoporous layer 1505 and dye 1504). FIG. 15 In addition, thin-coat IFLs (such as those comprising metal oxides) may be advantageously employed either with a dye comprising a photoactive organic compound according to some embodiments of the present disclosure, or they may (like the semiconducting active material of some embodiments) be employed with a conventional dye, such as N719, which is known in the art.

In some embodiments, the thin-coat IFLs previously discussed in the context of DSSCs may be used in any interfacial layer of a semiconductor device such as a PV (e.g., a hybrid PV or other PV), field-effect transistor, light-emitting diode, non-linear optical device, memristor, capacitor, rectifier, rectifying antenna, etc. Furthermore, thin-coat IFLs of some embodiments may be employed in any of various devices in combination with other compounds discussed in the present disclosure, including but not limited to any one or more of the following of various embodiments of the present disclosure: tunable photoactive compounds; solid hole-transport material such as active material (e.g., active material including $Cu_2O$ nanoparticles); and additives (such as, in some embodiments, chenodeoxycholic acid or 1,8-diiodooctane).

In addition, the present disclosure in some embodiments provides interfacial layers comprising treated asphaltene. Such interfacial layers may likewise be used in any suitable semiconductor device such as any one or more of the PVs discussed herein (including, but not limited to, DSSCs, BHJs, and hybrid PVs), field-effect transistors, LEDs, etc. In some embodiments, treated asphaltene interfacial layers may be formed by a process comprising: extracting asphaltenes from crude oil; casting the asphaltenes onto a substrate; and heating the asphaltenes in the presence of oxygen (which may be, e.g., in open air). Asphaltenes may be extracted from crude oil by any extraction process known in the art. Casting the asphaltenes onto a substrate may in some embodiments comprise casting the asphaltenes as thin films from a suitable solution, for example by spin coating, blade coating, spray coating, or other similar methods. For example, spin coating may be carried out at 3000 rpm for about 30 seconds in some embodiments, though in other embodiments, the asphaltenes in solution may be spin coated at speeds ranging from about 100 rpm to about 10,000 rpm, and over a time period ranging from about 1 second to about 5 minutes. Suitable solutions for coating the asphaltenes may include, but are not limited to, chlorobenzene solutions, dichlorbenzene solutions, toluene solutions, and chloroform solutions. The substrate may, in some embodiments, be a component of a PV or other electronic device. For example, in embodiments where the interfacial layer comprising treated asphaltene is employed in a BHJ device (as depicted, e.g., in FIG. 22b), the asphaltene in solution may be coated on an electrode of the BHJ device that comprises, in some embodiments, ITO (e.g., ITO electrode 2402). In such embodiments, then, interfacial layer 2403 of the BHJ device would accordingly comprise treated asphaltenes.

Figure 31:
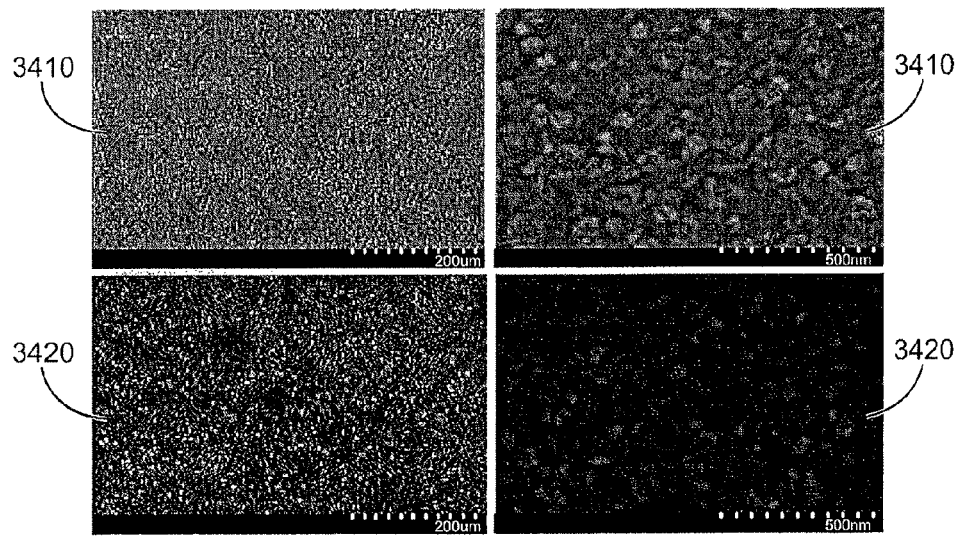
FIG. 31 shows images of asphaltene thin films heated in air to approximately 300° C. and approximately 400° C., respectively.

In some embodiments, heating the asphaltenes in open air may include annealing the asphaltenes in open air after coating. Suitable temperatures for annealing may include a temperature ranging from about 50° C. to about 1000° C.; in some embodiments, annealing may take place at about 300° C. to about 400° C.; in other embodiments, annealing may take place at about 20° C. to about 600° C. In some embodiments, heating may take place for an amount of time from about 1 second to about 24 hours; in other embodiments, heating may take place for about 5 to about 15 minutes, or for about 10 minutes in other embodiments. In some embodiments, annealing may lead to reactions with oxygen in the air and intermolecular crosslinking among asphaltene compounds, thereby forming insoluble films at the surface of the asphaltenes. These insoluble films may allow for subsequent solvent deposition without risk of washing away the underlying interfacial layer comprising the treated asphaltenes. FIG. 31 shows images of asphaltene films heated in air for 10 minutes at 300° C. (both low magnification 3405 and high magnification 3410) and 400° C. (both low magnification 3415 and high magnification 3420). The films were observed under scanning electron microscopy, and demonstrated a distinct island nanostructure that, at d=50 nm, reflects the underlying substrate (here, ITO) grain structure.

Figure 32:
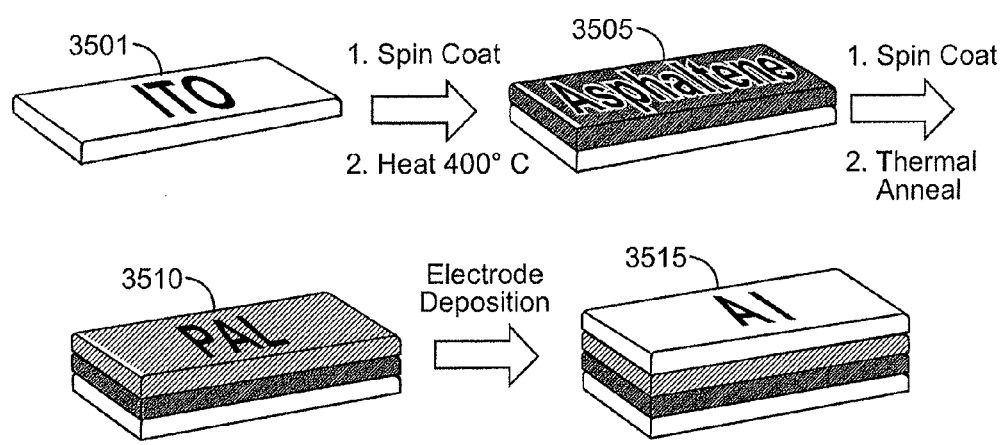
FIG. 32 is a depiction of a process for treating asphaltene for use as an interfacial layer in accordance with some embodiments of the present disclosure.

An example process of forming a treated asphaltene interfacial layer according to some embodiments of the present disclosure is set out in FIG. 32. Asphaltenes in solution are spin-coated onto a substrate 3501 (here, ITO electrode pre-treated for 10 minutes in a UV-ozone reactor, plasma reactor, or a solvent such as acetone, isopropanol, or toluene) and heated to 400° C., leaving a treated asphaltene layer 3505 on the substrate 3501. A photoactive layer (PAL) 3510 is spin-coated onto the treated asphaltene layer 3505 and thermally annealed, followed by electrode deposition of an electrode 3515 (here, aluminum) onto the PAL 3510. When this or other processes in accordance with various embodiments of the present disclosure are carried out on, e.g., a BHJ, the substrate 3501 corresponds to glass substrate 2401 and ITO electrode 2402 of FIG. 22b; the PAL 3510 corresponds to photoactive layer 2404; and electrode 3515 corresponds to cathodes 2405.

In some embodiments, an interfacial layer comprising treated asphaltenes may be employed in other device types, such as hybrid PVs, DSSCs (both solid-state and liquid electrolyte), and other electronic devices, including but not limited to: field-effect transistors, light-emitting diodes, non-linear optical devices, memristors, capacitors, rectifiers, and/or rectifying antennas. For example, a treated asphaltene interfacial layer may in some embodiments be deposited onto a counterelectrode in lieu of, for example, platinum, in a DSSC (either solid-state or liquid electrolyte) in accordance with any suitable asphaltene interfacial layer deposition method discussed herein. In addition, in some embodiments, a thin-coat IFL may include treated asphaltenes. Thus, returning to the example DSSC of FIG. 25, the second active material 2815 may be coated with a thin-coat IFL including treated asphaltenes, which in turn is coated with a dye. And in other embodiments where treated asphaltenes are employed in liquid electrolyte type DSSCs, the exemplar DSSCs of FIG. 14 or FIG. 15 would further include a treated asphaltene thin-coat IFL coated on top of the mesoporous layer 1505, wherein coating of the treated asphaltene may take place by any suitable method in accordance with the present disclosure.

Furthermore, treated asphaltene interfacial layers may in some embodiments be employed in any of various devices in combination with other compounds discussed in the present disclosure, including but not limited to any one or more of the following of various embodiments of the present disclosure: tunable photoactive compounds; solid hole-transport material such as p-type active material (e.g., p-type material including $Cu_2O$ nanoparticles); and additives (such as, in some embodiments, chenodeoxycholic acid or 1,8-diiodooctane).

Other Exemplar Electronic Devices

As already mentioned, in some embodiments, a tunable photoactive compound may be included in any of a variety of electronic devices. Another example of such is a monolithic thin-film PV and battery device, or hybrid PV battery.

Figure 33:
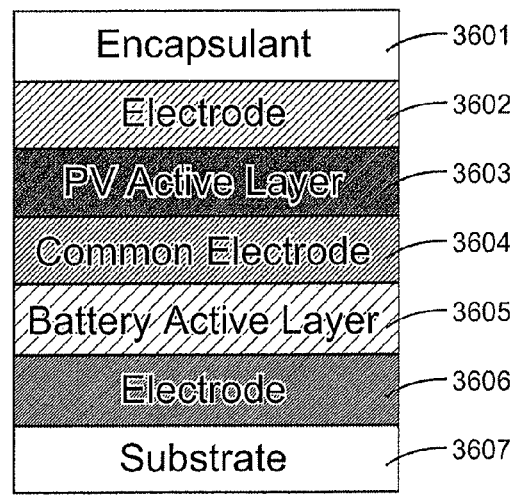
FIG. 33 is a depiction of components of an exemplar hybrid PV battery according to some embodiments of the present disclosure.

A hybrid PV battery according to some embodiments of the present disclosure may generally include a PV cell and a battery portion sharing a common electrode and electrically coupled in series or parallel. For example, hybrid PV batteries of some embodiments may be described by reference to FIG. 33, which is a stylized diagram of components of an exemplar hybrid PV battery, and includes: an encapsulant 3601; at least three electrodes 3602, 3604, and 3606, at least one of which is a common electrode (here 3604) shared by the PV portion of the device and the battery portion of the device; a PV active layer 3603; a battery active layer 3605; and a substrate 3607. In such example embodiments, the PV cell of the device may comprise one electrode 3602 (which may in some embodiments be referred to as a PV electrode) and the PV active layer 3603, while the battery of the device may comprise the other non-shared electrode 3606 (which may in some embodiments be referred to as a battery electrode) and the battery active layer 3605. The PV cell and the battery portion of such embodiments share the common electrode 3604. In some embodiments, the hybrid PV battery may be monolithic, that is, imprinted on a single substrate. In such embodiments, both the PV cell and the battery portion should be thin-film type devices. In some embodiments, both the PV cell and the battery may be capable of being printed by high-throughput techniques such as ink-jet, die-slot, gravure, and imprint roll-to-roll printing.

The PV cell of some embodiments may include a DSSC, a BHJ, a hybrid PV, or any other PV known in the art, such as cadmium telluride (CdTe) PVs, or CIGS (copper-indium-gallium-selenide) PVs. For example, in embodiments where the PV cell of a hybrid PV battery comprises a DSSC, the PV cell may be described by comparison between the exemplar liquid electrolyte DSSC of FIG. 14 and the PV cell of the exemplar hybrid PV battery of FIG. 33. Specifically, PV electrode 3602 may correspond to electrode layer 1502; PV active layer 3603 may correspond to electrolyte 1503, dye 1504, and ML 1505; and common electrode 3604 may correspond to electrode layer 1506. Any other PV may similarly correspond to the PV cell components of some embodiments of a hybrid PV battery, as will be apparent to one of ordinary skill in the art with the benefit of this disclosure. Furthermore, as with the PV devices discussed herein, the PV active layer within the PV cell of the device may in some embodiments comprise any one or more of: a treated asphaltene interfacial layer; first and/or second active material (each of which may be n-type or p-type semiconducting, and either or both of which may include a metal-oxide interfacial layer according to various embodiments discussed herein); and a tunable photoactive compound.

The battery portion of such devices may be composed according to batteries known in the art, such as lithium ion or zinc air. In some embodiments, the battery may be a thin-film battery.

Thus, for example, a hybrid PV battery according to some embodiments may include a DSSC integrated with a zinc-air battery. Both devices are thin-film type and are capable of being printed by high-throughput techniques such as ink-jet roll-to-roll printing, in accordance with some embodiments of the present disclosure. In this example, the zinc-air battery is first printed on a substrate (corresponding to substrate 3607) completed with counter-electrode. The battery counter-electrode then becomes the common electrode (corresponding to common electrode 3604) as the photoactive layer (corresponding to PV active layer 3603) is subsequently printed on the electrode 3604. The device is completed with a final electrode (corresponding to PV electrode 3602), and encapsulated in an encapsulant (corresponding to encapsulant 3601). The encapsulant may comprise epoxy, polyvinylidene fluoride (PVDF), ethyl-vinyl acetate (EVA), Parylene C, or any other material suitable for protecting the device from the environment.

In some embodiments, a hybrid PV battery may provide several advantages over known batteries or PV devices. In embodiments in which the hybrid PV battery is monolithic, it may exhibit increased durability due to the lack of connecting wires. The combination of two otherwise separate devices into one (PV and battery) further may advantageously reduce overall size and weight compared to use of a separate PV to charge a separate battery. In embodiments in which the hybrid PV battery comprises a thin-film type PV cell and battery portion, the thin-type PV cell may advantageously be capable of being printed in-line with a battery on substrates known to the battery industry, such as polyimides (e.g., Kapton or polyethylene terephthalate (PET)). In addition, the final form factor of such hybrid PV batteries may, in some embodiments, be made to fit form factors of standard batteries (e.g., for use in consumer electronics, such as coin, AAA, AA, C, D, or otherwise; or for use in, e.g., cellular telephones). In some embodiments, the battery could be charged by removal from a device followed by placement in sunlight. In other embodiments, the battery may be designed such that the PV cell of the battery is externally-facing from the device (e.g., the battery is not enclosed in the device) so that the device may be charged by exposure to sunlight. For example, a cellular telephone may comprise a hybrid PV battery with the PV cell of the battery facing the exterior of the phone (as opposed to placing the battery entirely within a covered portion of the phone).

In addition, some embodiments of the present disclosure may provide a multi-photoactive-layer PV cell. Such a cell may include at least two photoactive layers, each photoactive layer separated from the other by a shared double-sided conductive (i.e., conductor/insulator/conductor) substrate. The photoactive layers and shared substrate(s) of some embodiments may be sandwiched between conducting layers (e.g., conducting substrates, or conductors bound or otherwise coupled to a substrate). In some embodiments, any one or more of the conductors and/or substrates may be transparent to at least some electromagnetic radiation within the UV, visible, or IR spectrum.

Each photoactive layer may have a makeup in accordance with the active and/or photoactive layer(s) of any of the various PV devices already discussed (e.g., DSSC, BHJ, hybrid). In some embodiments, each photoactive layer may be capable of absorbing different wavelengths of electromagnetic radiation. Such configuration may be accomplished by any suitable means which will be apparent to one of ordinary skill in the art with the benefit of this disclosure. For example, each photoactive layer may comprise a dye (e.g., where each photoactive layer is composed according to photoactive portions of a DSSC), each dye comprising a different tunable photoactive compound designed with a band gap suitable for absorption of photons of different energies.

Figure 34:
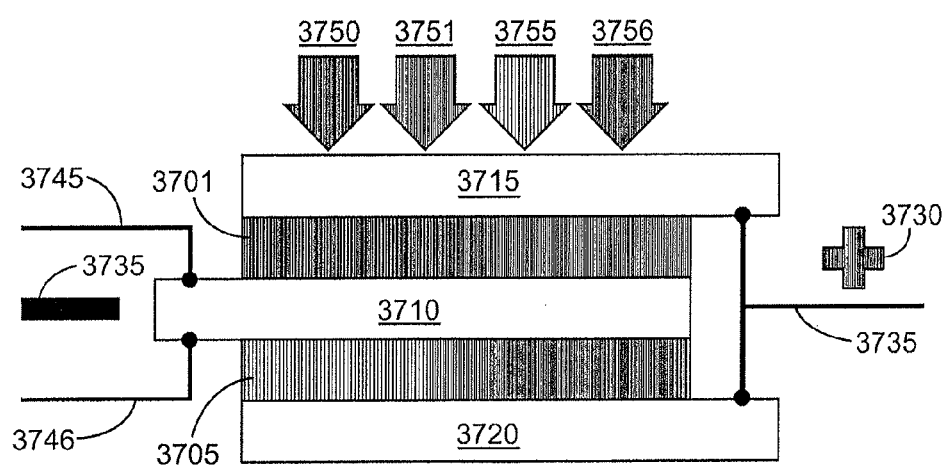
FIG. 34 is a stylized diagram illustrating components of an exemplar PV device according to some embodiments of the present disclosure.

An exemplary multi-photoactive-layer PV cell according to some embodiments may be described by reference to the stylized diagram of FIG. 34, which illustrates the basic structure of some such PV cells. FIG. 34 shows first and second photoactive layers (3701 and 3705, respectively) separated by a shared double-sided conductive substrate 3710 (e.g., FIG. 34 shows an architecture of the general nature conductor/insulator/conductor). The two photoactive layers 3701 and 3705, and the shared substrate 3710, are sandwiched between first and second conductive substrates 3715 and 3720. In this exemplary set-up, each photoactive layer 3701 and 3705 comprises a dye in accordance with a DSSC-like configuration. Further, the dye of the first photoactive layer 3701 is capable of absorbing electromagnetic radiation at a first portion of the visible EM spectrum (e.g., incident blue and green light 3750 and 3751), while the dye of the second photoactive layer 3705 is capable of absorbing electromagnetic radiation at a second, different, portion of the visible EM spectrum (e.g., red and yellow light 3755 and 3756). It should be noted that, while not the case in the device illustrated in FIG. 34, devices according to some embodiments may include dyes (or other photoactive layer materials) capable of absorbing radiation in ranges of wavelengths that, while different, nonetheless overlap. Upon excitation in each photoactive layer (e.g., by incident solar radiation), holes may flow from the first photoactive layer 3701 to the first conductive substrate 3715, and likewise from the second photoactive layer 3705 to the second conductive substrate 3720. Concomitant electron transport may accordingly take place from each photoactive layer 3701 and 3705 to the shared conductive substrate 3710. An electrical conductor or conductors (e.g., lead 3735 as in FIG. 34) may provide further transport of holes away from each of the first and second conductive substrates 3715 and 3720 toward a negative direction 3730 of the circuit (e.g., toward a cathode, negativebattery terminal, etc.), while a conductor or conductors (e.g., leads 3745 and 3746 as in FIG. 34) may carry electrons away from the shared substrate 3710, toward a positive direction 3735 of the circuit.

In some embodiments, two or more multi-photoactive-layer PV cells may be connected or otherwise electrically coupled (e.g., in series). For example, referring back to the exemplary embodiment of FIG. 34, the wire 3735 conducting electrons away from each of the first and second conductive substrates 3715 and 3720 may in turn be connected to a double-sided shared conductive substrate of a second multi-photoactive-layer PV cell (e.g., a shared conductive substrate corresponding to shared conductive substrate 3710 of the exemplary PV cell of FIG. 34). Any number of PV cells may be so connected in series. The end effect in some embodiments is essentially multiple parallel PV cell pairs electrically coupled in series (wherein each multi-photoactive-layer PV cell with two photoactive layers and a shared double-sided conductive substrate could be considered a pair of parallel PV cells). Similarly, a multi-photoactive-layer PV cell with three photoactive layers and two shared double-sided conductive substrates sandwiched between each photoactive layer could equivalently be considered a trio of parallel PV cells, and so on for multi-photoactive-layer PV cells comprising four, five, and more photoactive layers.

Furthermore, electrically coupled multi-photoactive-layer PV cells may further be electrically coupled to one or more batteries to form a hybrid PV battery according to certain embodiments.

Figure 35A:
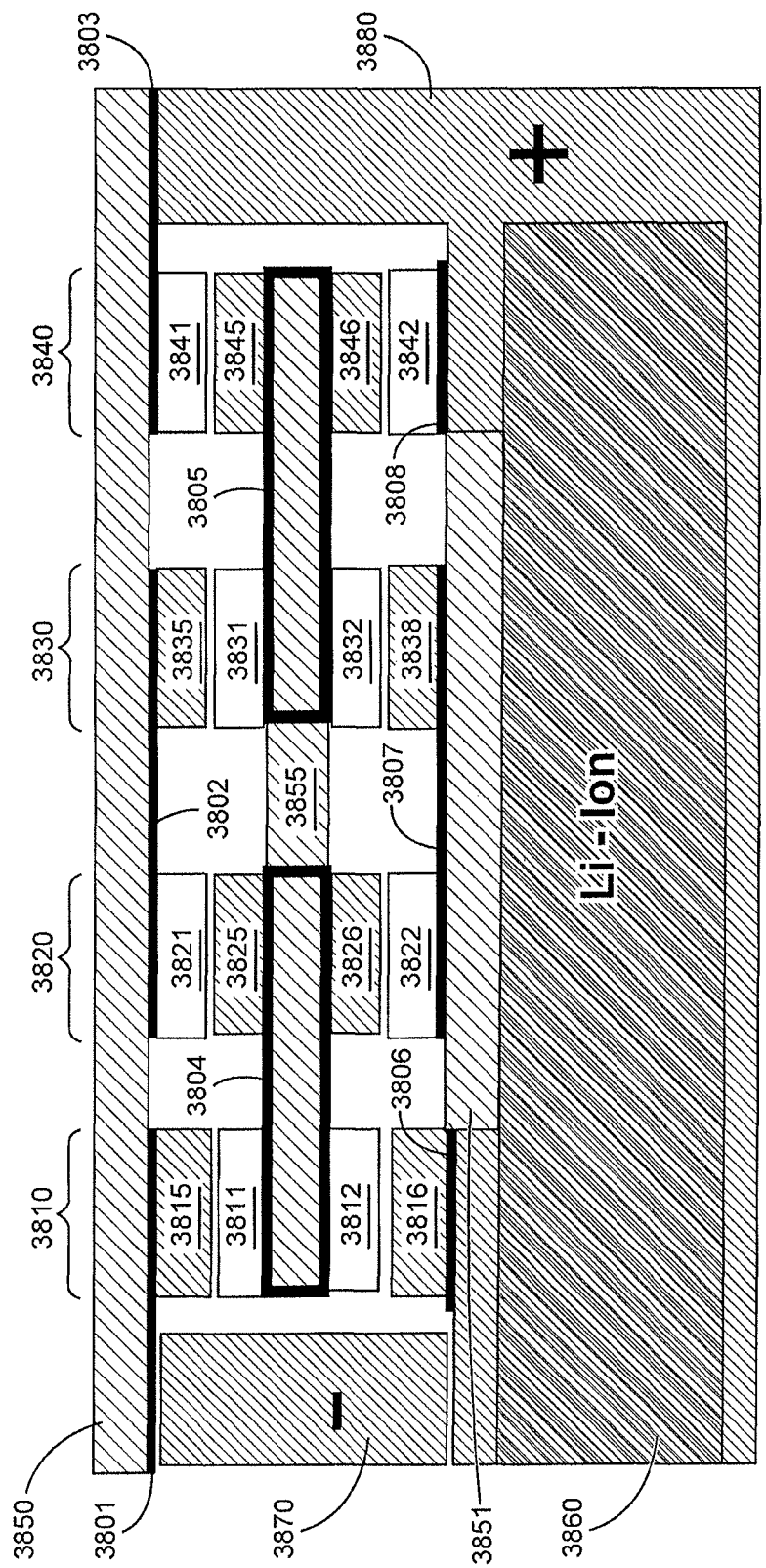
FIG. 35A is a stylized diagram illustrating a hybrid PV battery according to some embodiments of the present disclosure.
Figure 35B:
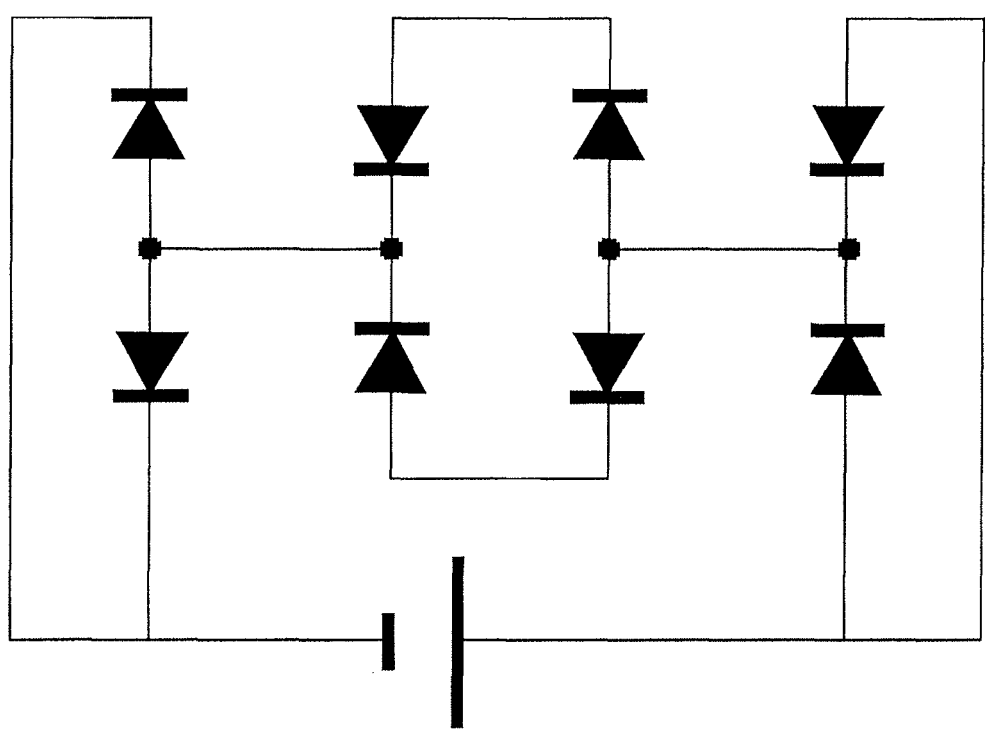
FIG. 35B is an electrical equivalent diagram relating to a hybrid PV battery according to some embodiments of the present disclosure.

In certain embodiments, the electrical coupling of two or more multi-photoactive-layer PV cells (e.g., series connection of two or more units of parallel PV cell pairs) in series may be carried out in a form similar to that illustrated in FIG. 35A, which depicts a series electrical coupling of four multi-photoactive-layer PV cells 3810, 3820, 3830, and 3840 between a capping anode 3870 and capping cathode 3880. The PV cells 3810, 3820, 3830, and 3840 have a common first outer substrate 3850, and PV cells 3820 and 3830 have a common second outer substrate 3851. In addition, a common shared substrate 3855 runs the length of the series connection, and for each PV cell corresponds to the shared substrate 3710 of the embodiment stylized in FIG. 34. Each of the multi-photoactive-layer PV cells 3810, 3820, 3830, and 3840 shown in the embodiment of FIG. 35A includes two photoactive layers (e.g., photoactive layers 3811 and 3812 in PV cell 3810) and two photoelectrodes (e.g., photoelectrodes 3815 and 3816 in PV cell 3810). A photoactive layer according to this and other corresponding embodiments may include any photoactive and/or active material as disclosed hereinabove (e.g., a tunable photoactive compound, first active material, second active material, and/or one or more interfacial layers), and a photoelectrode may include any substrate and/or conductive material suitable as an electrode as discussed herein. In some embodiments, the arrangement of photoactive layers and photoelectrodes may alternate from cell to cell (e.g., to establish electrical coupling in series). For example, as shown in FIG. 35A, cell 3810 is arranged between the shared outer substrates according to: photoelectrode-photoactive layer-shared substrate-photoactive layer-photoelectrode, while cell 3820 exhibits an arrangement wherein the photoelectrodes and photoactive layers are swapped relative to adjacent cell 3810, and cell 3830 likewise exhibits an arrangement wherein the photoelectrodes and photoactive layers are swapped relative to adjacent cell 3820 (and therefore arranged similarly to cell 3810). FIG. 35A additionally shows a plurality of transparent conductors (3801, 3802, 3803, 3804, 3805, 3806, 3807, and 3808) coupled to portions of each of the common substrates 3850, 3851, and 3855 so as to enable electrical coupling of the PV cells 3810, 3820, 3830, and 3840. In addition, FIG. 35A shows electrical coupling of the series of PV cells to a battery (here, Li-Ion battery 3860) in accordance with some embodiments. Such coupling may enable the PV cells to charge the Li-Ion battery in a similar fashion to the charging of hybrid PV-batteries of some embodiments previously discussed. FIG. 35B is an electrical equivalent diagram showing the resulting current flow in the device of FIG. 35A.

Additives

As previously noted, PV and other devices according to some embodiments may include additives (which may be, e.g., any one or more of acetic acid, propanoic acid, trifluoroacetic acid, chenodeoxycholic acid, deoxycholic acid, 1,8-diiodooctane, and 1,8-dithiooctane). Such additives may be employed as pretreatments directly before dye soaking or mixed in various ratios with a dye to form the soaking solution. These additives may in some instances function, for example, to increase dye solubility, preventing dye molecule clustering, by blocking open active sites, and by inducing molecular ordering amongst dye molecules. They may be employed with any suitable dye, including a photoactive compound according to various embodiments of the present disclosure as discussed herein.

Composite Perovskite Device Design

In some embodiments, the present disclosure may provide composite design of PV and other similar devices (e.g., batteries, hybrid PV batteries, FETs, LEDs etc.) including one or more perovskite materials. A perovskite may be incorporated into various of one or more aspects of a PV or other device. A perovskite according to some embodiments may be of the general formula $CMX_3$, where: C comprises one or more cations (e.g., an amine, ammonium, a Group 1 metal, a Group 2 metal, and/or other cations or cation-like compounds); M comprises one or more metals (exemplars including Fe, Co, Ni, Cu, Sn, Pb, Bi, Ge, Ti, and Zr); and X comprises one or more anions. In some embodiments, C may include one or more organic cations, and X may include one or more halides. In certain embodiments, X may instead or in addition include any Group 16 anion. In some embodiments, each organic cation C may be larger than each metal M, and each anion X may be capable of bonding with both a cation C and a metal M. Examples of perovskites according to various embodiments include $CsSnI_3$ (previously discussed herein) and $Cs_xSn_yI_z$ (with x, y, and z varying in accordance with the previous discussion). Other examples include compounds of the general formula $CsSnX_3$, where X may be any one or more of: $I_3$, $I_{2.95}F_{0.05}$; $I_2Cl$; $ICl_2$; and $Cl_3$. In other embodiments, X may comprise any one or more of I, Cl, F, and Br in amounts such that the total ratio of X as compared to Cs and Sn results in the general stoichiometry of $CsSnX_3$. In some embodiments, the combined stoichiometry of the elements that constitute X may follow the same rules as $I_z$ as previously discussed with respect to $Cs_xSn_yI_z$. Yet other examples include compounds of the general formula $RNH_3PbX_3$, where R may be $C_nH_{2n+1}$, with n ranging from 0-10, and X may include any one or more of F, Cl, Br, and I in amounts such that the total ratio of X as compared to the cation $RNH_3$ and metal Pb results in the general stoichiometry of $RNH_3PbX_3$. Further, some specific examples of R include H, and alkyl chains (e.g., $CH_3$, $CH_3CH_2$, $CH_3CH_2CH_2$, and so on).

In some embodiments, a perovskite may be included in a PV or other device as active material. For example, one or more perovskites may serve as either or both of first and second active material of some embodiments (e.g., active materials 2810 and 2815 of FIG. 25). In more general terms, some embodiments of the present disclosure provide PV or other devices having an active layer comprising one or more perovskite materials. In such embodiments, perovskite material (that is, material including any one or more perovskite(s)) may be employed in active layers of various architectures. Furthermore, perovskite material may serve the function(s) of any one or more components of an active layer (e.g., charge transport material, mesoporous material, photoactive material, and/or interfacial material, each of which is discussed in greater detail below). In some embodiments, the same perovskite may serve multiple such functions, although in other embodiments, a plurality of perovskites may be included in a device, each perovskite serving one or more such functions. In certain embodiments, whatever role a perovskite material may serve, it may be prepared and/or present in a device in various states. For example, it may be substantially solid in some embodiments. In other embodiments, it may be a solution (e.g., perovskite material may be dissolved in liquid and present in said liquid in its individual ionic subspecies); or it may be a suspension (e.g., of perovskite material particles). A solution or suspension may be coated or otherwise deposited within a device (e.g., on another component of the device such as a mesoporous, interfacial, charge transport, photoactive, or other layer, and/or on an electrode). Perovskites in some embodiments may be formed in situ on a surface of another component of a device (e.g., by vapor deposition as a thin-film solid). Any other suitable means of forming a solid or liquid layer comprising perovskite material may be employed.

Moreover, as with other active material types according to some embodiments discussed herein, a first and/or second active material comprising perovskite material may be employed in conjunction with a photoactive organic compound (e.g., a tunable compound dye) of the present disclosure in a solid state DSSC.

In general, a perovskite device may include a first electrode, a second electrode, and an active layer comprising a perovskite, the active layer disposed at least partially between the first and second electrodes. In some embodiments, the first electrode may be one of an anode and a cathode, and the second electrode may be the other of an anode and cathode. An active layer according to certain embodiments may include any one or more active layer components, including any one or more of: charge transport material; liquid electrolyte; mesoporous material; photoactive material (e.g., a dye, silicon, cadmium telluride, cadmium sulfide, cadmium selenide, copper indium gallium selenide, gallium arsenide, germanium indium phosphide, semiconducting polymers, other photoactive materials)); and interfacial material. Any one or more of these active layer components may include one or more perovskite materials. In some embodiments, some or all of the active layer components may be in whole or in part arranged in sub-layers. For example, the active layer may comprise any one or more of: an interfacial layer including interfacial material; a mesoporous layer including mesoporous material; and a charge transport layer including charge transport material. In some embodiments, photoactive material such as a dye may be coated on, or otherwise disposed on, any one or more of these layers. In certain embodiments, any one or more layers may be coated with a liquid electrolyte. Further, an interfacial layer may be included between any two or more other layers of an active layer according to some embodiments, and/or between a layer and a coating (such as between a dye and a mesoporous layer), and/or between two coatings (such as between a liquid electrolyte and a dye), and/or between an active layer component and an electrode. Reference to layers herein may include either a final arrangement (e.g., substantially discrete portions of each material separately definable within the device), and/or reference to a layer may mean arrangement during construction of a device, notwithstanding the possibility of subsequent intermixing of material(s) in each layer. Layers may in some embodiments be discrete and comprise substantially contiguous material (e.g., layers may be as stylistically illustrated in FIG. 14). In other embodiments, layers may be substantially intermixed (as in the case of, e.g., BHJ, hybrid, and some DSSC cells), an example of which is shown by first and second active material 2618 and 2620 within photoactive layer 2616 in FIG. 24. In some embodiments, a device may comprise a mixture of these two kinds of layers, as is also shown by the device of FIG. 24, which contains discrete contiguous layers 2627, 2626, and 2622, in addition to a photoactive layer 2616 comprising intermixed layers of first and second active material 2618 and 2620. In any case, any two or more layers of whatever kind may in certain embodiments be disposed adjacent to each other (and/or intermixedly with each other) in such a way as to achieve a high contact surface area. In certain embodiments, a layer comprising perovskite material may be disposed adjacent to one or more other layers so as to achieve high contact surface area (e.g., where a perovskite exhibits low charge mobility). In other embodiments, high contact surface area may not be necessary (e.g., where a perovskite exhibits high charge mobility).

A perovskite device according to some embodiments may optionally include one or more substrates. In some embodiments, either or both of the first and second electrode may be coated or otherwise disposed upon a substrate, such that the electrode is disposed substantially between a substrate and the active layer. The materials of composition of devices (e.g., substrate, electrode, active layer and/or active layer components) may in whole or in part be either rigid or flexible in various embodiments. In some embodiments, an electrode may act as a substrate, thereby negating the need for a separate substrate.

Furthermore, a perovskite device according to certain embodiments may optionally include light-harvesting material (e.g., in a light-harvesting layer, such as Light Harvesting Layer 1601 as depicted in the exemplary PV represented in FIG. 15). In addition, a perovskite device may include any one or more additives, such as any one or more of the additives discussed above with respect to some embodiments of the present disclosure.

Figure 36:
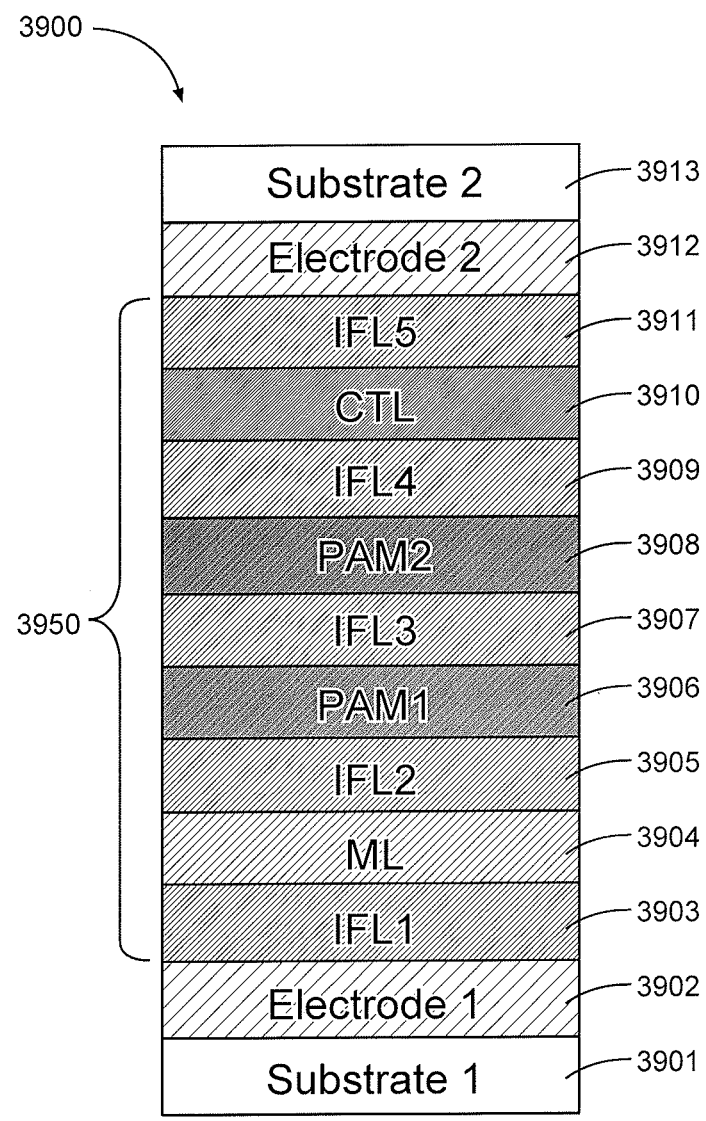
FIG. 36 is a stylized diagram showing components of an exemplar PV device according to some embodiments of the present disclosure.

Description of some of the various materials that may be included in a perovskite device will be made in part with reference to FIG. 36. FIG. 36 is a stylized diagram of a perovskite device 3900 according to some embodiments. Although various components of the device 3900 are illustrated as discrete layers comprising contiguous material, it should be understood that FIG. 36 is a stylized diagram; thus, embodiments in accordance with it may include such discrete layers, and/or substantially intermixed, non-contiguous layers, consistent with the usage of "layers" previously discussed herein. The device 3900 includes first and second substrates 3901 and 3913. A first electrode 3902 is disposed upon an inner surface of the first substrate 3901, and a second electrode 3912 is disposed on an inner surface of the second substrate 3913. An active layer 3950 is sandwiched between the two electrodes 3902 and 3912. The active layer 3950 includes a mesoporous layer 3904; first and second photoactive materials 3906 and 3908; and a charge transport layer 3910. FIG. 36 furthermore illustrates an example device 3900 according to embodiments wherein each sub-layer of the active layer 3950 is separated by an interfacial layer, and further wherein interfacial layers are disposed upon each electrode 3902 and 3912. In particular, second, third, and fourth interfacial layers 3905, 3907, and 3909 are respectively disposed between each of the mesoporous layer 3904, first photoactive material 3906, second photoactive material 3908, and charge transport layer 3910. First and fifth interfacial layers 3903 and 3911 are respectively disposed between (i) the first electrode 3902 and mesoporous layer 3904; and (ii) the charge transport layer 3910 and second electrode 3912. Thus, the architecture of the example device depicted in FIG. 36 may be characterized as: substrate-electrode-active layer-electrode-substrate. The architecture of the active layer 3950 may be characterized as: interfacial layer-mesoporous layer-interfacial layer-photoactive material-interfacial layer-photoactive material-interfacial layer-charge transport layer-interfacial layer. As noted previously, in some embodiments, interfacial layers need not be present; or, one or more interfacial layers may be included only between certain, but not all, components of an active layer and/or components of a device.

A substrate, such as either or both of first and second substrates 3901 and 3913, may be flexible or rigid. If two substrates are included, at least one should be transparent or translucent to electromagnetic (EM) radiation (such as, e.g., UV, visible, or IR radiation). If one substrate is included, it may be similarly transparent or translucent, although it need not be, so long as a portion of the device permits EM radiation to contact the active layer 3950. Suitable substrate materials include any one or more of: glass; sapphire; magnesium oxide (MgO); mica; polymers (e.g., PET, PEG, polypropylene, polyethylene, etc.); ceramics; fabrics (e.g., cotton, silk, wool); wood; drywall; metal; and combinations thereof.

As previously noted, an electrode (e.g., one of electrodes 3902 and 3912 of FIG. 36) may be either an anode or a cathode. In some embodiments, one electrode may function as a cathode, and the other may function as an anode. Either or both electrodes 3902 and 3912 may be coupled to leads, cables, wires, or other means enabling charge transport to and/or from the device 3900. An electrode may constitute any conductive material, and at least one electrode should be transparent or translucent to EM radiation, and/or be arranged in a manner that allows EM radiation to contact at least a portion of the active layer 3950. Suitable electrode materials may include any one or more of: indium tin oxide or tin-doped indium tin oxide (ITO); fluorine-doped tin oxide (FTO); cadmium oxide (CdO); zinc indium tin oxide (ZITO); aluminum zinc oxide (AZO); aluminum (Al); gold (Au); calcium (Ca); magnesium (Mg); titanium (Ti); steel; and combinations thereof.

Mesoporous material (e.g., the material included in mesoporous layer 3904 of FIG. 36) may include any pore-containing material. In some embodiments, the pores may have diameters ranging from about 1 to about 100 nm; in other embodiments, pore diameter may range from about 2 to about 50 nm. Suitable mesoporous material includes any one or more of: any interfacial material and/or mesoporous material discussed elsewhere herein; aluminum (Al); bismuth (Bi); indium (In); molybdenum (Mo); niobium (Nb); nickel (Ni); silicon (Si); titanium (Ti); vanadium (V); zinc (Zn); an oxide of any one or more of the foregoing metals (e.g., alumina, ceria, titania, zinc oxide, zirconium, etc.); a sulfide of any one or more of the foregoing metals; a nitride of any one or more of the foregoing metals; and combinations thereof.

Photoactive material (e.g., first or second photoactive material 3906 or 3908 of FIG. 36) may comprise any photoactive compound, such as any one or more of silicon (in some instances, single-crystalline silicon), cadmium telluride, cadmium sulfide, cadmium selenide, copper indium gallium selenide, gallium arsenide, germanium indium phosphide, one or more semiconducting polymers, and combinations thereof. In certain embodiments, photoactive material may instead or in addition comprise a dye (e.g., N719, N3, other ruthenium-based dyes). In some embodiments, a dye may include a photoactive organic compound comprising an electron donor moiety, a core moiety, and an electron-withdrawing moiety, in accordance with embodiments discussed elsewhere herein. In certain embodiments, a dye may include a compound comprising a nitrogen heterocycle, such as a quinoxalino-quinoxaline dye. In some embodiments, a dye (of whatever composition) may be coated onto another layer (e.g., a mesoporous layer and/or an interfacial layer). In some embodiments, photoactive material may include one or more perovskites. Perovskite-containing photoactive material may be of a solid form, or in some embodiments it may take the form of a dye that includes a suspension or solution comprising perovskite material. Such a solution or suspension may be coated onto other device components in a manner similar to other dyes. In some embodiments, solid perovskite-containing material may be deposited by any suitable means (e.g., vapor deposition, solution deposition, direct placement of solid material, etc.). Devices according to various embodiments may include one, two, three, or more photoactive compounds (e.g., one, two, three, or more perovskite materials, dyes, or combinations thereof). In certain embodiments including multiple dyes or other photoactive materials, each of the two or more dyes or other photoactive materials may be separated by one or more interfacial layers. In some embodiments, multiple dyes and/or photoactive compounds may be at least in part intermixed.

Charge transport material (e.g., charge transport material of charge transport layer 3910 in FIG. 36) may include solid-state charge transport material (i.e., a colloquially labeled solid-state electrolyte), or it may include a liquid electrolyte and/or ionic liquid. Any of the liquid electrolyte, ionic liquid, and solid-state charge transport material may be referred to as charge transport material. As used herein, "charge transport material" refers to any material, solid, liquid, or otherwise, capable of collecting charge carriers and/or transporting charge carriers. For instance, in PV devices according to some embodiments, a charge transport material may be capable of transporting charge carriers to an electrode. Charge carriers may include holes (the transport of which could make the charge transport material just as properly labeled "hole transport material") and electrons. Holes may be transported toward an anode, and electrons toward a cathode, depending upon placement of the charge transport material in relation to either a cathode or anode in a PV or other device. Suitable examples of charge transport material according to some embodiments may include any one or more of: perovskite material; $I^-/I_3^-$; Co complexes, $Cu_2O$ (or other copper-oxides); polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT); poly(triaryl amine) compounds and derivatives thereof (e.g., PTAA); Spiro-OMeTAD; fullerenes and/or fullerene derivatives (e.g., C60, PCBM); and combinations thereof. In certain embodiments, charge transport material may include any material, solid or liquid, capable of collecting charge carriers (electrons or holes), and/or capable of transporting charge carriers. Charge transport material of some embodiments therefore may be n- or p-type active and/or semi-conducting material. Charge transport material may be disposed proximate to one of the electrodes of a device. It may in some embodiments be disposed adjacent to an electrode, although in other embodiments an interfacial layer may be disposed between the charge transport material and an electrode (as shown, e.g., in FIG. 36 with the fifth interfacial layer 3911). In certain embodiments, the type of charge transport material may be selected based upon the electrode to which it is proximate. For example, if the charge transport material collects and/or transports holes, it may be proximate to an anode so as to transport holes to the anode. However, the charge transport material may instead be placed proximate to a cathode, and be selected or constructed so as to transport electrons to the cathode.

As previously noted, devices according to various embodiments may optionally include an interfacial layer between any two other layers and/or materials, although devices according to some embodiments need not contain any interfacial layers. Thus, for example, a perovskite device may contain zero, one, two, three, four, five, or more interfacial layers (such as the example device of FIG. 36, which contains five interfacial layers 3903, 3905, 3907, 3909, and 3911). An interfacial layer may include a thin-coat interfacial layer in accordance with embodiments previously discussed herein (e.g., comprising alumina and/or other metal-oxide particles, and/or a titania/metal-oxide bilayer, and/or other compounds in accordance with thin-coat interfacial layers as discussed elsewhere herein). In other embodiments, an interfacial layer may include treated asphaltenes. An interfacial layer according to some embodiments may include any suitable material for enhancing charge transport and/or collection between two layers or materials; it may also help prevent or reduce the likelihood of charge recombination once a charge has been transported away from one of the materials adjacent to the interfacial layer. Suitable interfacial materials may include any one or more of: any mesoporous material and/or interfacial material discussed elsewhere herein; Al; Bi; In; Mo; Ni; platinum (Pt); Si; Ti; V; Nb; zinc; oxides of any of the foregoing metals (e.g., alumina, silica, titania); a sulfide of any of the foregoing metals; a nitride of any of the foregoing metals; functionalized or non-functionalized alkyl silyl groups; graphite; graphene; fullerenes; carbon nanotubes; and combinations thereof (including, in some embodiments, bilayers of combined materials). In certain embodiments, an interfacial layer may include a tunable photoactive compound comprising an electron donor moiety, a core moiety, and an electron-withdrawing moiety, in accordance with embodiments discussed elsewhere herein. In some embodiments, an interfacial layer may include perovskite material.

A device according to the stylized representation of FIG. 36 may in some embodiments be a PV, such as a DSSC, BHJ, or hybrid solar cell. In some embodiments, devices according to FIG. 36 may constitute serial multi-cell PVs, batteries, hybrid PV batteries, FETs, LEDS, and/or any other device discussed herein. For example, a BHJ of some embodiments may include two electrodes corresponding to electrodes 3902 and 3912, and an active layer comprising at least two materials in a heterojunction interface (e.g., any two of the materials and/or layers of active layer 3950). In certain embodiments, other devices (such as hybrid PV batteries, serial multi-cell PVs, etc.) may comprise an active layer including a perovskite, corresponding to active layer 3950 of FIG. 36. In short, the stylized nature of the depiction of the exemplar device of FIG. 36 should in no way limit the permissible structure or architecture of devices of various embodiments in accordance with FIG. 36.

Additional, more specific, example embodiments of perovskite devices will be discussed in terms of further stylized depictions of example devices. The stylized nature of these depictions, FIGS. 37-46, similarly is not intended to restrict the type of device which may in some embodiments be constructed in accordance with any one or more of FIGS. 37-46. That is, the architectures exhibited in FIGS. 37-46 may be adapted so as to provide the BHJs, batteries, FETs, hybrid PV batteries, serial multi-cell PVs, parallel multi-cell PVs and other similar devices of other embodiments of the present disclosure, in accordance with any suitable means (including both those expressly discussed elsewhere herein, and other suitable means, which will be apparent to those skilled in the art with the benefit of this disclosure).

Figure 37:
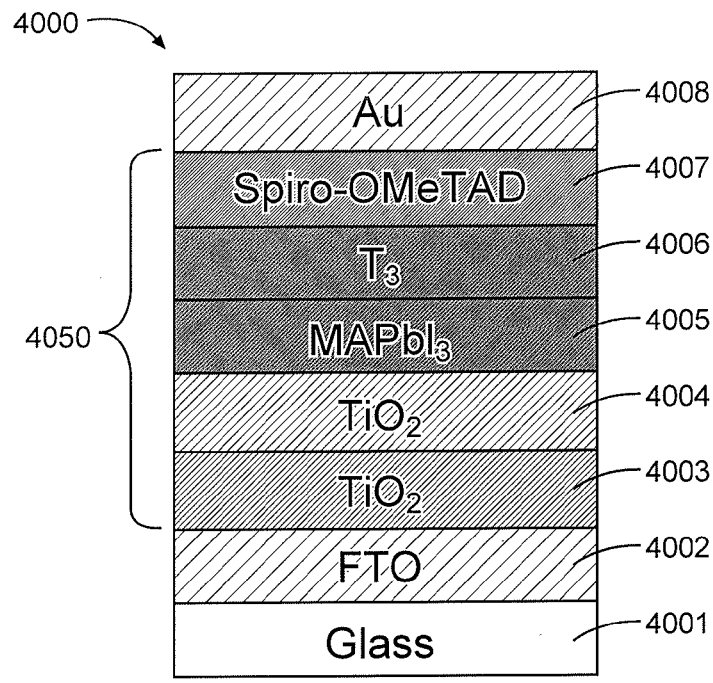
FIG. 37 is a stylized diagram showing components of an exemplar PV device according to some embodiments of the present disclosure.

FIG. 37 depicts an example device 4000 according to some embodiments. The device 4000 includes a glass substrate 4001; FTO first electrode 4002; and gold second electrode 4008. Sandwiched between the electrodes is active layer 4050, which includes an interfacial layer 4003 comprising $TiO_2$ disposed on the FTO electrode 4002; a mesoporous layer 4004 comprising $TiO_2$ deposited upon interfacial layer 4003; first photoactive material 4005 disposed upon the mesoporous layer 4004; and second photoactive material 4006 coating the first photoactive material. The active layer 4050 further includes a charge transport layer 4007 comprising spiro-OMeTAD deposited on the inner surface of the gold electrode 4008. The first photoactive material 4005 comprises perovskite material that includes methyl ammonium lead iodide ($MAPbI_3$). The second photoactive material 4006 comprises a dye that includes a tunable photoactive compound substantially of the structure T3 as shown in FIG. 19.

Figure 38:
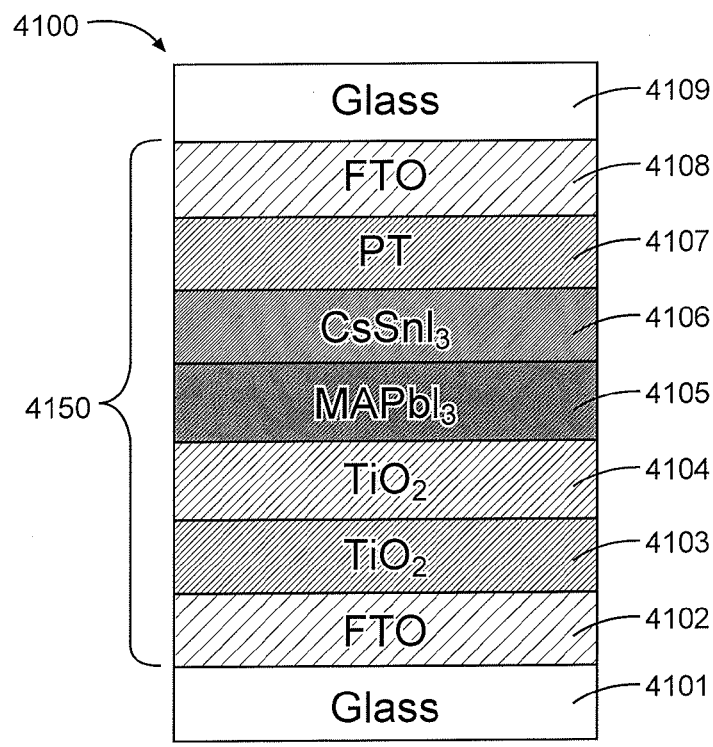
FIG. 38 is a stylized diagram showing components of an exemplar PV device according to some embodiments of the present disclosure.
Figure 39:
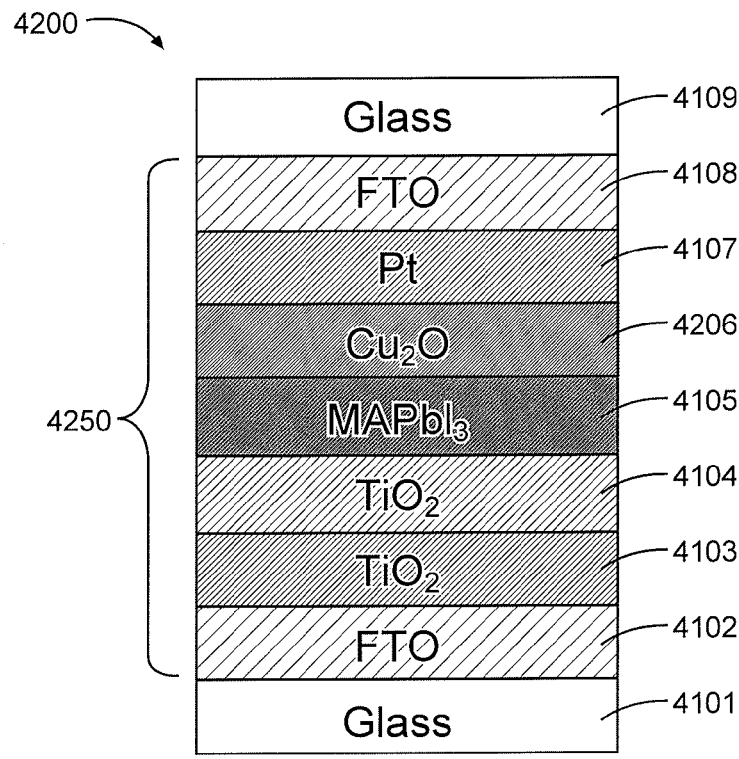
FIG. 39 is a stylized diagram showing components of an exemplar PV device according to some embodiments of the present disclosure.

FIGS. 38 and 39 depict another pair of example devices 4100 and 4200 in accordance with various embodiments. Both devices are of substantially the same structure, except for the charge transport layer of each. Both devices 4100 and 4200 illustrate embodiments including first and second glass substrates 4101 and 4109. Each glass substrate has an FTO electrode disposed upon its inner surface (first electrode 4102 and second electrode 4108, respectively), and each electrode has an interfacial layer deposited upon its inner surface: $TiO_2$ first interfacial layer 4103 is deposited upon first electrode 4102, and Pt second interfacial layer 4107 is deposited upon second electrode 4108. Sandwiched between the two interfacial layers are: a mesoporous layer 4104 (comprising $TiO_2$);

photoactive material 4105 (comprising the perovskite MAPbI$_3$); and a charge transport layer (in device 4100 of FIG. 38, charge transport layer 4106 comprises CsSnI$_3$, and in device 4200 of FIG. 39, charge transport layer 4206 comprises Cu$_2$O).

Figure 40:
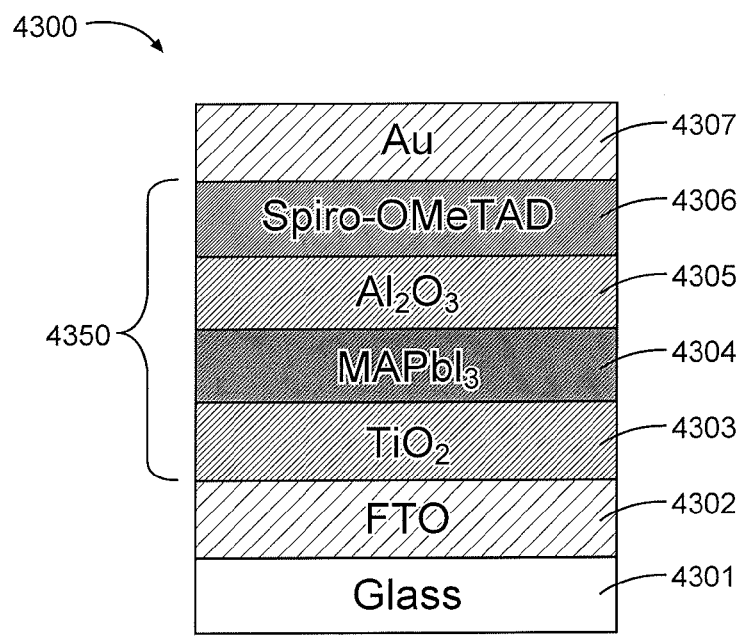
FIG. 40 is a stylized diagram showing components of an exemplar PV device according to some embodiments of the present disclosure.
Figure 41:
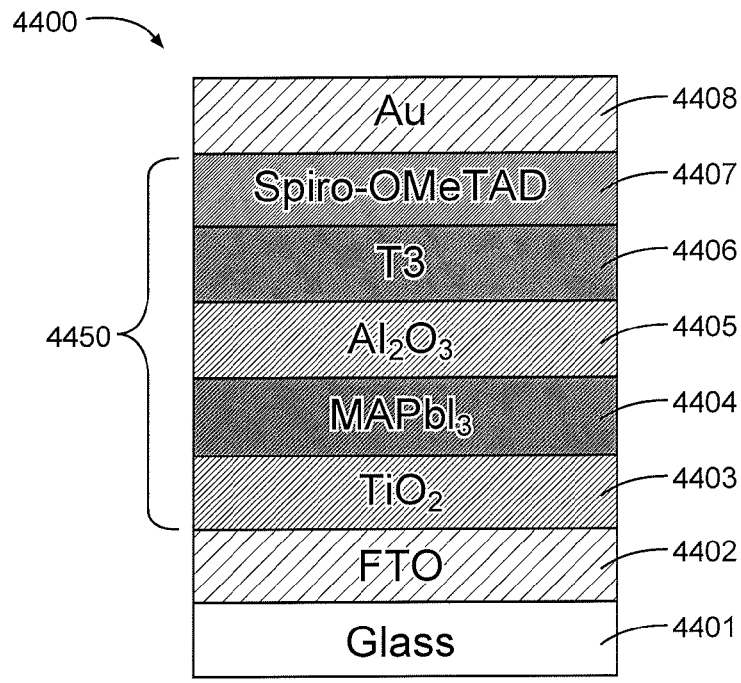
FIG. 41 is a stylized diagram showing components of an exemplar PV device according to some embodiments of the present disclosure.

FIG. 40 depicts an example device 4300 that omits a mesoporous layer. The device 4300 includes a perovskite photoactive compound 4304 (comprising MAPbI$_3$) sandwiched between first and second interfacial layers 4303 and 4305 (comprising titania and alumina, respectively). The titania interfacial layer 4303 is coated upon an FTO first electrode 4302, which in turn is disposed on an inner surface of a glass substrate 4301. The spiro-OMeTAD charge transport layer 4306 is coated upon an alumina interfacial layer 4305 and disposed on an inner surface of a gold second electrode 4307.

FIGS. 41, 42, 43, and 44 depict example devices 4400, 4500, 4600, and 4700 having similar architecture and composition. Each device 4400, 4500, 4600, and 4700 includes two photoactive compounds and two interfacial layers, and may be characterized as having the same general architecture: substrate-first electrode-first interfacial layer-first photoactive material-second interfacial layer-second photoactive material-charge transport layer-electrode. Each device has the same first and second electrodes 4402 and 4408 (FTO and gold, respectively); the same glass substrate 4401 onto which the first electrode 4402 is coated; and the same Spiro-OMeTAD charge transport layer 4407 coated onto an inner surface of the second electrode 4408. In addition, each of the example devices 4400, 4500, 4600, and 4700 includes the same second photoactive material 4406: a dye that includes a tunable photoactive compound substantially of the structure T3 as shown in FIG. 19.

Figure 42:
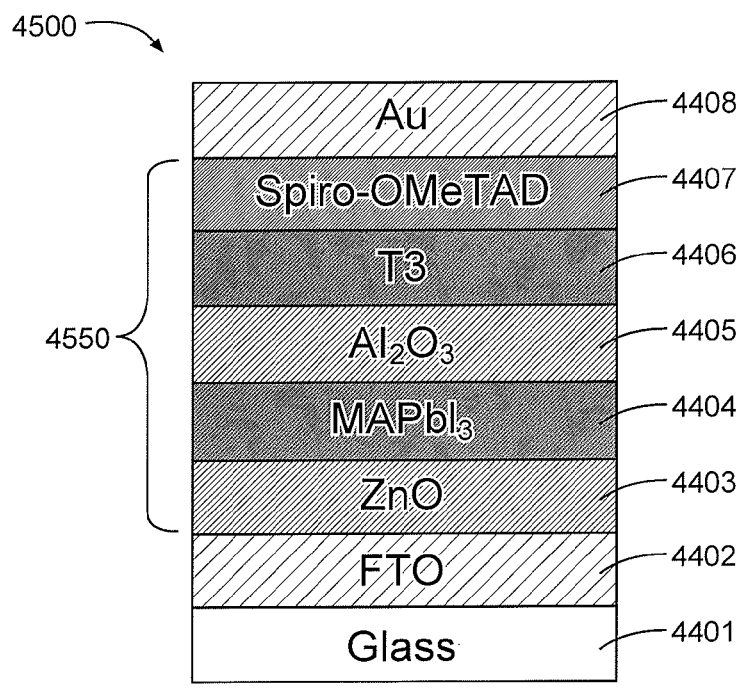
FIG. 42 is a stylized diagram showing components of an exemplar PV device according to some embodiments of the present disclosure.
Figure 43:
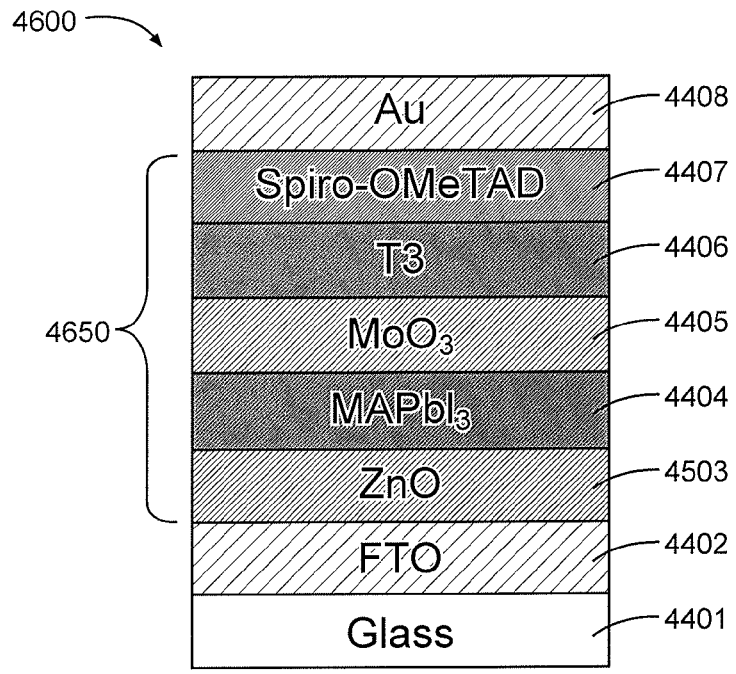
FIG. 43 is a stylized diagram showing components of an exemplar PV device according to some embodiments of the present disclosure.

The devices differ in the composition of the first photoactive compound and the two interfacial layers surrounding it. In the device 4400 of FIG. 41, a first interfacial layer 4403 comprising TiO$_2$ is coated upon the FTO electrode 4402; and a first photoactive compound 4404 comprising the perovskite MAPbI$_3$ is disposed upon the first interfacial layer 4403. A second interfacial layer 4405 comprising alumina separates the first and second photoactive materials 4404 and 4406. The device 4500 of FIG. 42 is identical to the device 4400, except that the first interfacial layer 4503 comprises ZnO instead of TiO$_2$ as in interfacial layer 4403. The device 4600 of FIG. 43 includes the ZnO first interfacial layer 4503 of the device 4500, but employs a different second interfacial layer 4605 comprising MoO$_3$, rather than the interfacial layer 4405 comprising alumina as in the devices 4400 and 4500.

Figure 44:
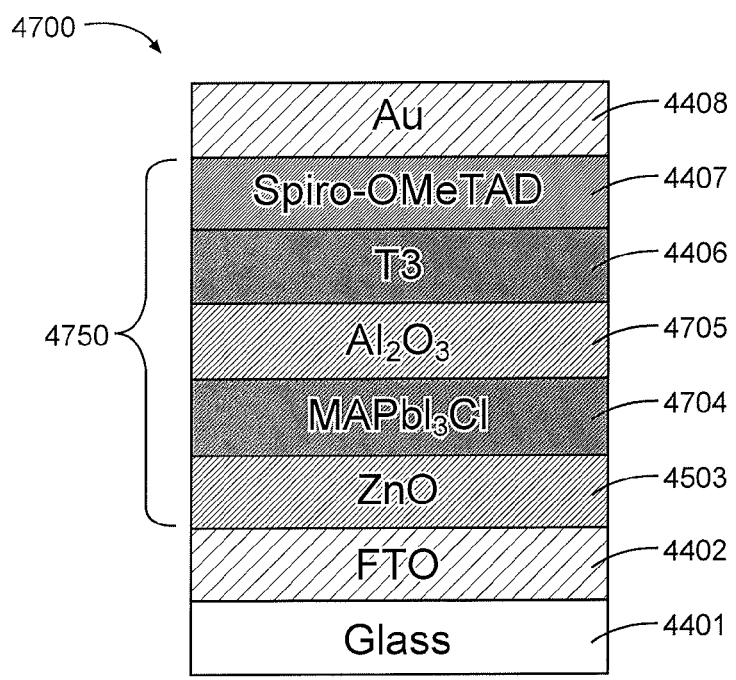
FIG. 44 is a stylized diagram showing components of an exemplar PV device according to some embodiments of the present disclosure.

In the device 4700 of FIG. 44, a first interfacial layer 4503 comprising ZnO is coated upon the FTO electrode 4402 (as in devices 4500 and 4600); and a first photoactive compound 4704 comprising the perovskite MAPbI$_2$Cl is disposed upon the first interfacial layer 4503. A second interfacial layer 4705 comprising alumina separates the first and second photoactive materials 4704 and 4406.

Figure 45:
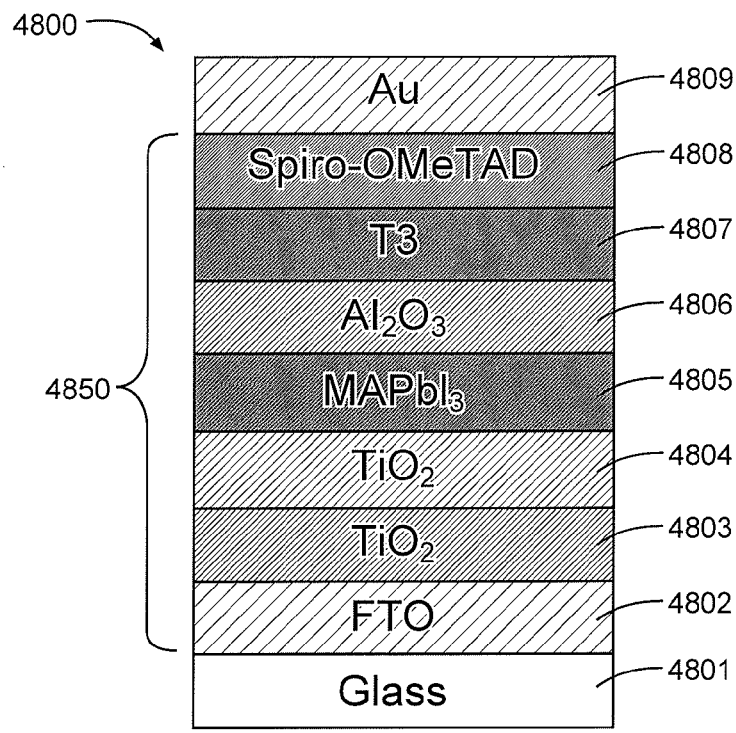
FIG. 45 is a stylized diagram showing components of an exemplar PV device according to some embodiments of the present disclosure.
Figure 46:
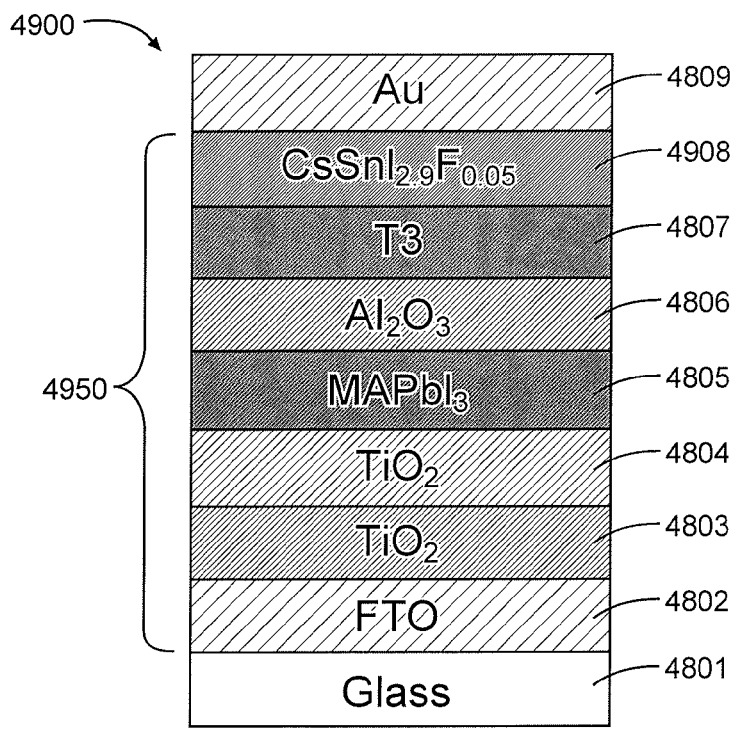
FIG. 46 is a stylized diagram showing components of an exemplar PV device according to some embodiments of the present disclosure.

FIGS. 45 and 46 each depict example devices (4800 and 4900, respectively) having mesoporous layers and two photoactive materials separated by an interfacial layer, according to some embodiments. Specifically, the architecture of each device 4800 and 4900 may be characterized as: substrate-first electrode-first interfacial layer-mesoporous layer-first photoactive material-second interfacial layer-second photoactive material-charge transport material-electrode. As shown in FIGS. 45 and 46, both example devices 4800 and 4900 have the same construction except for the composition of the charge transport material. Both include a glass substrate 4801 with a first electrode 4802 (comprising FTO) disposed thereon; a first interfacial layer 4803 (comprising TiO$_2$) disposed on the first electrode 4802; and a mesoporous layer 4804 (comprising TiO$_2$) disposed on the TiO$_2$ interfacial layer 4803. A first photoactive material 4805 comprising the perovskite MAPbI$_3$ is disposed on the mesoporous layer 4804, and is separated at least in part from a second photoactive material 4807 (comprising T3 dye, in accordance with the T3 composition of FIG. 19) by second interfacial layer 4806 comprising alumina. Each device is capped with a second electrode 4809 comprising gold, with charge transport material disposed on an inner surface thereof. In the device 4800 of FIG. 45, the charge transport material 4808 comprises the solid-state charge transport material spiro-OMeTAD. In the device 4900 of FIG. 46, the charge transport material 4908 comprises the solid-state charge transport material CsSnI$_{2.95}$F$_{0.05}$.

Additional Perovskite Device Examples

Other example perovskite device architectures will be apparent to those of skill in the art with the benefit of this disclosure. Examples include, but are not limited to, devices containing active layers having any of the following architectures: (1) liquid electrolyte-perovskite material-mesoporous layer; (2) perovskite material-dye-mesoporous layer; (3) first perovskite material-second perovskite material-mesoporous layer; (4) first perovskite material-second perovskite material; (5) first perovskite material-dye-second perovskite material; (6) solid-state charge transport material-perovskite material; (7) solid-state charge transport material-dye-perovskite material-mesoporous layer; (8) solid-state charge transport material-perovskite material-dye-mesoporous layer; (9) solid-state charge transport material-dye-perovskite-mesoporous layer; and (10) solid-state charge transport material-perovskite-dye-mesoporous layer. The individual components of each example architecture (e.g., mesoporous layer, charge transport material, etc.) may be in accordance with the discussion above for each component. Furthermore, each example architecture is discussed in more detail below.

As a particular example of some of the aforementioned active layers, in some embodiments, an active layer may include a liquid electrolyte, perovskite material, and a mesoporous layer. The active layer of certain of these embodiments may have substantially the architecture: liquid electrolyte-perovskite material-mesoporous layer. Any liquid electrolyte may be suitable; and any mesoporous layer (e.g., TiO$_2$) may be suitable. In some embodiments, the perovskite material may be deposited upon the mesoporous layer, and thereupon coated with the liquid electrolyte. The perovskite material of some such embodiments may act at least in part as a dye (thus, it may be photoactive).

In other example embodiments, an active layer may include perovskite material, a dye, and a mesoporous layer. The active layer of certain of these embodiments may have substantially the architecture: perovskite material-dye-mesoporous layer. The dye may comprise any one or more tunable photoactive compounds comprising an electron donor moiety, a core moiety, and an electron-withdrawing moiety. The dye may be coated upon the mesoporous layer and the perovskite material may be disposed upon the dye-coated mesoporous layer. The perovskite material may function as hole-transport material in certain of these embodiments.

In yet other example embodiments, an active layer may include first perovskite material, second perovskite material, and a mesoporous layer. The active layer of certain of these embodiments may have substantially the architecture: first perovskite material-second perovskite material-mesoporous layer. The first and second perovskite material may each comprise the same perovskite(s) or they may comprise different perovskites. Either of the first and second perovskite materials may be photoactive (e.g., a first and/or second perovskite material of such embodiments may function at least in part as a dye).

In certain example embodiments, an active layer may include first perovskite material and second perovskite material. The active layer of certain of these embodiments may have substantially the architecture: first perovskite material-second perovskite material. The first and second perovskite materials may each comprise the same perovskite(s) or they may comprise different perovskites. Either of the first and second perovskite materials may be photoactive (e.g., a first and/or second perovskite material of such embodiments may function at least in part as a dye). In addition, either of the first and second perovskite materials may be capable of functioning as hole-transport material. In some embodiments, one of the first and second perovskite materials functions as an electron-transport material, and the other of the first and second perovskite materials functions as a dye. In some embodiments, the first and second perovskite materials may be disposed within the active layer in a manner that achieves high interfacial area between the first perovskite material and the second perovskite material, such as in the arrangement shown for first and second active material 2810 and 2815, respectively, in FIG. 25 (or as similarly shown by p- and n-type material 2618 and 2620, respectively, in FIG. 24).

In further example embodiments, an active layer may include first perovskite material, a dye, and second perovskite material. The active layer of certain of these embodiments may have substantially the architecture: first perovskite material-dye-second perovskite material. Either of the first and second perovskite materials may function as charge transport material, and the other of the first and second perovskite materials may function as a dye. In some embodiments, both of the first and second perovskite materials may at least in part serve overlapping, similar, and/or identical functions (e.g., both may serve as a dye and/or both may serve as hole-transport material).

In some other example embodiments, an active layer may include a solid-state charge transport material and a perovskite material. The active layer of certain of these embodiments may have substantially the architecture: solid-state charge transport material-perovskite material. For example, the perovskite material and solid-state charge transport material may be disposed within the active layer in a manner that achieves high interfacial area, such as in the arrangement shown for first and second active material 2810 and 2815, respectively, in FIG. 25 (or as similarly shown by p- and n-type material 2618 and 2620, respectively, in FIG. 24).

In other example embodiments, an active layer may include a solid-state charge transport material, a dye, perovskite material, and a mesoporous layer. The active layer of certain of these embodiments may have substantially the architecture: solid-state charge transport material-dye-perovskite material-mesoporous layer. The active layer of certain other of these embodiments may have substantially the architecture: solid-state charge transport material-perovskite material-dye-mesoporous layer. The perovskite material may in some embodiments serve as a second dye. The perovskite material may in such embodiments increase the breadth of the spectrum of visible light absorbed by a PV or other device including an active layer of such embodiments. In certain embodiments, the perovskite material may also or instead serve as an interfacial layer between the dye and mesoporous layer, and/or between the dye and the charge transport material.

In some example embodiments, an active layer may include a liquid electrolyte, a dye, a perovskite material, and a mesoporous layer. The active layer of certain of these embodiments may have substantially the architecture: solid-state charge transport material-dye-perovskite material-mesoporous layer. The active layer of certain other of these embodiments may have substantially the architecture: solid-state charge transport material-perovskite material-dye-mesoporous layer. The perovskite material may serve as photoactive material, an interfacial layer, and/or a combination thereof.

Some embodiments provide BHJ PV devices that include perovskites. For example, a BHJ of some embodiments may include a photoactive layer (e.g., photoactive layer 2404 of FIG. 22B), which may include one or more perovskites. The photoactive layer of such a BHJ may also or instead include any one or more of the above-listed example components discussed above with respect to DSSC active layers. Further, in some embodiments, the BHJ photoactive layer may have an architecture according to any one of the exemplary embodiments of DSSC active layers discussed above.

In some embodiments, any PV or other like device may include an active layer according to any one or more of the compositions and/or architectures discussed above. For example, an active layer including perovskite material may be included in a hybrid PV battery, for example as PV Active Layer 3603 of the exemplary hybrid PV battery depicted in FIG. 33, and/or as Battery Active Layer 3605 of FIG. 33. As another example embodiment, an active layer including perovskite material may be included in a multi-photoactive-layer PV cell, such as either or both of the first and second photoactive layers 3701 and 3705 of the exemplary cell shown in the stylized diagram of FIG. 34. Such a multi-photoactive-layer PV cell including an active layer with perovskite material could furthermore be incorporated within a series of electrically coupled multi-photoactive-layer PV cells (in some embodiments, in accordance with the structure as shown, e.g., in FIG. 35A).

In some embodiments, any of the active layers including perovskites incorporated into PVs or other devices as discussed herein may further include any of the various additional materials also discussed herein as suitable for inclusion in an active layer. For example, any active layer including perovskite material may further include an interfacial layer according to various embodiments discussed herein (such as, e.g., an interfacial layer comprising treated asphaltenes, and/or a thin-coat interfacial layer). By way of further example, an active layer including perovskite material may further include a light harvesting layer, such as Light Harvesting Layer 1601 as depicted in the exemplary PV represented in FIG. 15.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, and set forth every range encompassed within the broader range of values. Also, the terms in the claims have their plain, ordinary meaning unless otherwise explicitly and clearly defined by the patentee.

What is claimed is:

1. A photovoltaic device comprising:
   a first electrode;
   a second electrode;
   an active layer disposed at least partially between the first and second electrodes, the active layer comprising:
      a perovskite material, and
      charge transport material comprising a copper-oxide compound.

2. The photovoltaic device of claim 1, wherein the perovskite material has the formula $CMX_3$, wherein C comprises one or more cations, M comprises one or more metals, and X comprises one or more anions.

3. The photovoltaic device of claim 2, wherein C comprises one or more cations each selected from the group consisting of Group 1 metals, Group 2 metals, organic cations, and combinations thereof;
   wherein M comprises one or more metals each selected from the group consisting of Fe, Co, Ni, Cu, Sn, Pb, Bi, Ge, Ti, Zn, and combinations thereof; and
   wherein X comprises one or more anions each selected from the group consisting of halides, Group 16 anions, and combinations thereof.

4. The photovoltaic device of claim 3, wherein M is Pb, and wherein X comprises one or more halides.

5. The photovoltaic device of claim 4, wherein C is methylammonium.

6. The photovoltaic device of claim 3, wherein C is Sr, M is Ti, and X comprises oxygen.

7. The photovoltaic device of claim 1, wherein the active layer further comprises photoactive material selected from the group consisting of: a dye; silicon, cadmium telluride, cadmium sulfide, cadmium selenide, copper indium gallium selenide, gallium arsenide, germanium indium phosphide, semiconducting polymers, and combinations thereof.

8. The photovoltaic device of claim 7, wherein the photoactive material comprises a dye comprising:
   a primary electron donor moiety comprising at least one substituent selected from the group consisting of: aryl amine; aryl phosphine; aryl arsine; aryl stibine; aryl sulfide; aryl selenide; phenyl; phenol; alkoxy phenyl; dialkoxy phenyl; alkyl phenyl; and combinations thereof;
   a core moiety comprising at least one aryl substituent selected from the group consisting of: a nitrogen heterocyclic compound; benzothiophene; dibenzothiophene; naphthothiophene; dinaphthothiophene; benzonaphthothiophene; naphthyl; benzothiazole; benzothiadiazole; benzo[b]naphtha[2,3-d]thiophene; 4H-cyclopenta[1,2-b:5,4-b']bisthiophene; dinaphtho[2,3-d]thiophene; thieno[3,2-b]thiophene; naphthalene; anthracene; and combinations thereof;
   a second electron donor moiety comprising at least one pi-electron donor substituent selected from the group consisting of: thiophene, benzothiadiazole, benzene, benzothiophene, thienothiophene, and combinations thereof; and
   an electron-withdrawing moiety comprising at least one substituent selected from the group consisting of: a carboxylic acid; a monocyanocomplex; a dicyanocomplex; a thiocyanocomplex; an isothiocyanocomplex; and combinations thereof.

9. The photovoltaic device of claim 1, wherein the charge transport material is disposed upon the perovskite material so as to achieve high contact surface area between the charge transport material and the perovskite material.

10. The photovoltaic device of claim 7, further comprising an interfacial layer disposed at least partially between the active layer and either of the first electrode and the second electrode;
   wherein the interfacial layer is selected from the group consisting of Al; Bi; In; Mo; Ni; Pt; Si; Ti; V; Nb; zinc; oxides of any of the foregoing metals; a sulfide of any of the foregoing metals; a nitride of any of the foregoing metals; alkyl silyl groups; graphite; graphene; fullerenes; carbon nanotubes; and combinations thereof.

11. The photovoltaic device of claim 9, further comprising an interfacial layer disposed at least partially between the active layer and either of the first electrode and the second electrode;
   wherein the interfacial layer is selected from the group consisting of Al; Bi; In; Mo; Ni; Pt; Si; Ti; V; Nb; zinc; oxides of any of the foregoing metals; a sulfide of any of the foregoing metals; a nitride of any of the foregoing metals; alkyl silyl groups; graphite; graphene; fullerenes; carbon nanotubes; and combinations thereof.

12. The photovoltaic device of claim 1, wherein the active layer further comprises a mesoporous layer comprising pore-containing material selected from the group consisting of: Al; Bi; In; Mo; Nb; Ni; Pt; Si; Ti; V; Zn; an oxide of any of the foregoing metals; a sulfide of any of the foregoing metals; a nitride of any of the foregoing metals; treated asphaltenes; titania/metal-oxide bilayers; alkyl silyl groups; graphite; graphene; fullerenes; carbon nanotubes; and combinations thereof.

13. The photovoltaic device of claim 10, wherein the active layer further comprises a mesoporous layer comprising pore-containing material selected from the group consisting of: Al; Bi; In; Mo; Nb; Ni; Pt; Si; Ti; V; Zn; an oxide of any of the foregoing metals; a sulfide of any of the foregoing metals; a nitride of any of the foregoing metals; treated asphaltenes; titania/metal-oxide bilayers; alkyl silyl groups; graphite; graphene; fullerenes; carbon nanotubes; and combinations thereof.

14. The photovoltaic device of claim 13, wherein:
   the perovskite material is disposed between the mesoporous layer and the charge transport material;
   the interfacial layer is disposed between the mesoporous layer and one of the first electrode and the second electrode.

15. The photovoltaic device of claim 1, wherein the copper-oxide compound has the formula $Cu_xO_y$, wherein x is between approximately 1 and 3, and wherein y is between approximately 0.1 and 2.

16. The photovoltaic device of claim 15, wherein the copper-oxide compound comprises nanoparticles sized 50 nm diameter and smaller.

17. The photovoltaic device of claim 13, wherein the copper-oxide compound has the formula $Cu_xO_y$, wherein x is between approximately 1 and 3, and wherein y is between approximately 0.1 and 2; and further wherein the copper-oxide compound comprises nanoparticles sized 50 nm diameter and smaller.

18. A photovoltaic device comprising
   a first electrode;
   a second electrode;
   an active layer disposed at least partially between the first and second electrodes, the active layer comprising:

a photoactive perovskite material; and
hole transport material comprising a copper-oxide compound.

19. The photovoltaic device of claim 18, wherein the active layer further comprises a perovskite material having the formula $CMX_3$;
wherein C comprises one or more cations each selected from the group consisting of Group 1 metals, Group 2 metals, organic cations, and combinations thereof;
wherein M comprises one or more metals each selected from the group consisting of Fe, Co, Ni, Cu, Sn, Pb, Bi, Ge, Ti, Zn, and combinations thereof; and
wherein X comprises one or more anions selected from the group consisting of halides, Group 16 anions, and combinations thereof.

20. The photovoltaic device of claim 19, wherein the active layer further comprises photoactive material selected from the group consisting of: a dye; silicon, cadmium telluride, cadmium sulfide, cadmium selenide, copper indium gallium selenide, gallium arsenide, germanium indium phosphide, semiconducting polymers, and combinations thereof.

21. The photovoltaic device of claim 20, wherein the photoactive material comprises a dye comprising:
a primary electron donor moiety comprising at least one substituent selected from the group consisting of: aryl amine; aryl phosphine; aryl arsine; aryl stibine; aryl sulfide; aryl selenide; phenyl; phenol; alkoxy phenyl; dialkoxy phenyl; alkyl phenyl; and combinations thereof;
a core moiety comprising at least one aryl substituent selected from the group consisting of: a nitrogen heterocyclic compound; benzothiophene; dibenzothiophene; naphthothiophene; dinaphthothiophene; benzonaphthothiophene; naphthyl; benzothiazole; benzothiadiazole; benzo[b]naphtha[2,3-d]thiophene; 4H-cyclopenta[1,2-b:5,4-b']bisthiophene; dinaphtho[2,3-d]thiophene; thieno[3,2-b]thiophene; naphthalene; anthracene; and combinations thereof;
a second electron donor moiety comprising at least one pi-electron donor substituent selected from the group consisting of: thiophene, benzothiadiazole, benzene, benzothiophene, thienothiophene, and combinations thereof; and
an electron-withdrawing moiety comprising at least one substituent selected from the group consisting of: a carboxylic acid; a monocyanocomplex; a dicyanocomplex; a thiocyanocomplex; an isothiocyanocomplex, and combinations thereof.

22. The photovoltaic device of claim 18, wherein the charge-transporting compound comprises a copper-oxide compound having the formula $Cu_xO_y$, wherein x is between approximately 1 and 3, and wherein y is between approximately 0.1 and 2.

23. The photovoltaic device of claim 22, wherein the charge-transporting compound comprises nanoparticles sized 50 nm diameter and smaller.

24. A photovoltaic device comprising:
a first electrode;
a second electrode;
an active layer disposed at least partially between the first and second electrodes, the active layer comprising:
charge transport material comprising $Cu_xO_y$, wherein x is between approximately 1 and 3, and wherein y is between approximately 0.1 and 2; and
a perovskite material having the formula $CMX_3$, wherein (i) C comprises one or more cations each selected from the group consisting of Group 1 metals, Group 2 metals, organic cations, amine, ammonium, and combinations thereof, (ii) M comprises one or more metals each selected from the group consisting of Fe, Co, Ni, Cu, Sn, Pb, Bi, Ge, Ti, Zn, and combinations thereof, and (iii) X comprises one or more anions each selected from the group consisting of halides, Group 16 anions, and combinations thereof.

25. The photovoltaic device of claim 24 wherein C comprises an alkyl ammonium cation, M comprises Pb, and X comprises one or more halides.

26. The photovoltaic device of claim 24 wherein C is Sr, M is Ti, and X comprises O.

27. The photovoltaic device of claim 24 wherein the charge transport material comprises $Cu_xO_y$ nanoparticles of diameter 50 nm or smaller.

28. The photovoltaic device of claim 24 wherein the active layer further comprises photoactive material selected from the group consisting of: a dye; silicon, cadmium telluride, cadmium sulfide, cadmium selenide, copper indium gallium selenide, gallium arsenide, germanium indium phosphide, semiconducting polymers, and combinations thereof.

29. The photovoltaic device of claim 28 wherein the photoactive material comprises a dye comprising:
a primary electron donor moiety comprising at least one substituent selected from the group consisting of: aryl amine; aryl phosphine; aryl arsine; aryl stibine; aryl sulfide; aryl selenide; phenyl; phenol; alkoxy phenyl; dialkoxy phenyl; alkyl phenyl; and combinations thereof;
a core moiety comprising at least one aryl substituent selected from the group consisting of: a nitrogen heterocyclic compound; benzothiophene; dibenzothiophene; naphthothiophene; dinaphthothiophene; benzonaphthothiophene; naphthyl; benzothiazole; benzothiadiazole; benzo[b]naphtha[2,3-d]thiophene; 4H-cyclopenta[1,2-b:5,4-b']bisthiophene; dinaphtho[2,3-d]thiophene; thieno[3,2-b]thiophene; naphthalene; anthracene; and combinations thereof;
a second electron donor moiety comprising at least one pi-electron donor substituent selected from the group consisting of: thiophene, benzothiadiazole, benzene, benzothiophene, thienothiophene, and combinations thereof; and
an electron-withdrawing moiety comprising at least one substituent selected from the group consisting of: a carboxylic acid; a monocyanocomplex; a dicyanocomplex; a thiocyanocomplex; an isothiocyanocomplex, and combinations thereof.

30. The photovoltaic device of claim 28 wherein the active layer further comprises an interfacial layer disposed between the perovskite material and the photoactive material; the interfacial layer comprising a compound selected from the group consisting of: Al; Bi; In; Mo; Ni; Pt; Si; Ti; V; Nb; zinc; oxides of any of the foregoing metals; a sulfide of any of the foregoing metals; a nitride of any of the foregoing metals; alkyl silyl groups; graphite; graphene; fullerenes; carbon nanotubes; and combinations thereof.

* * * * *